US008588332B2

(12) United States Patent
Cai et al.

(10) Patent No.: US 8,588,332 B2
(45) Date of Patent: Nov. 19, 2013

(54) DYNAMIC DIGITAL PRE-DISTORTION SYSTEM

(75) Inventors: Khiem V. Cai, Placentia, CA (US); David B. Rutan, Manhattan Beach, CA (US); Ahmad Khanifar, Laguna Hills, CA (US); Armando C. Cova, Ladera Ranch, CA (US)

(73) Assignee: Microelectronics Technology, Inc., Hsinchu (TW)

( * ) Notice: Subject to any disclaimer, the term of this patent is extended or adjusted under 35 U.S.C. 154(b) by 0 days.

(21) Appl. No.: 13/567,724

(22) Filed: Aug. 6, 2012

(65) Prior Publication Data
US 2012/0300878 A1 Nov. 29, 2012

Related U.S. Application Data

(62) Division of application No. 13/198,891, filed on Aug. 5, 2011, now Pat. No. 8,259,843, which is a division of application No. 11/788,451, filed on Apr. 20, 2007, now Pat. No. 8,005,162.

(51) Int. Cl.
*H04K 1/02* (2006.01)
*H04L 25/03* (2006.01)
*H04L 25/49* (2006.01)

(52) U.S. Cl.
USPC ............................................. 375/296

(58) Field of Classification Search
USPC ........................................... 375/296
See application file for complete search history.

(56) References Cited

U.S. PATENT DOCUMENTS

2004/0125487 A9 * 7/2004 Sternad et al. ............... 360/65
2006/0106601 A1 * 5/2006 Kong et al. ................. 704/226

OTHER PUBLICATIONS

Ding, Lei, et al., A Robust Digital Baseband Predistorter Constructed Using Memory Polynoids, School of Electrical and Computing Engineering, Georgia Institute of Technology, pp. 1-23, Mar. 16, 2002.
Raich, Raviv, Nonlinear System Identification and Analysis with Applications to Power Amplifier Modeling and Power Amplifier Predistortion, School of Electrical and Computing Engineering, Georgia Institute of Technology, pp. 1-40, Mar. 2004.

* cited by examiner

*Primary Examiner* — Chieh M Fan
*Assistant Examiner* — Tanmay Shah
(74) *Attorney, Agent, or Firm* — Carlos R. Villamar; The Villamar Firm PLLC

(57) ABSTRACT

A Dynamic Digital Pre-Distortion (DDPD) system is disclosed to rapidly correct power amplifier (PA) non-linearity and memory effects. To perform pre-distortion, a DDPD engine predistorts an input signal in order to cancel PA non-linearities as the signal is amplified by the PA. The DDPD engine is implemented as a composite of one linear filter and N−1 high order term linear filters. The bank of linear filters have programmable complex coefficients. To compute the coefficients, samples from the transmit path and a feedback path are captured, and covariance matrices A and B are computed using optimized hardware. After the covariance matrices are computed, Gaussian elimination processing may be employed to compute the coefficients. Mathematical and hardware optimizations may be employed to simplify and reduce the number of multiplication operands and other operations, which can enable the DDPD system to fit within a single chip.

15 Claims, 31 Drawing Sheets

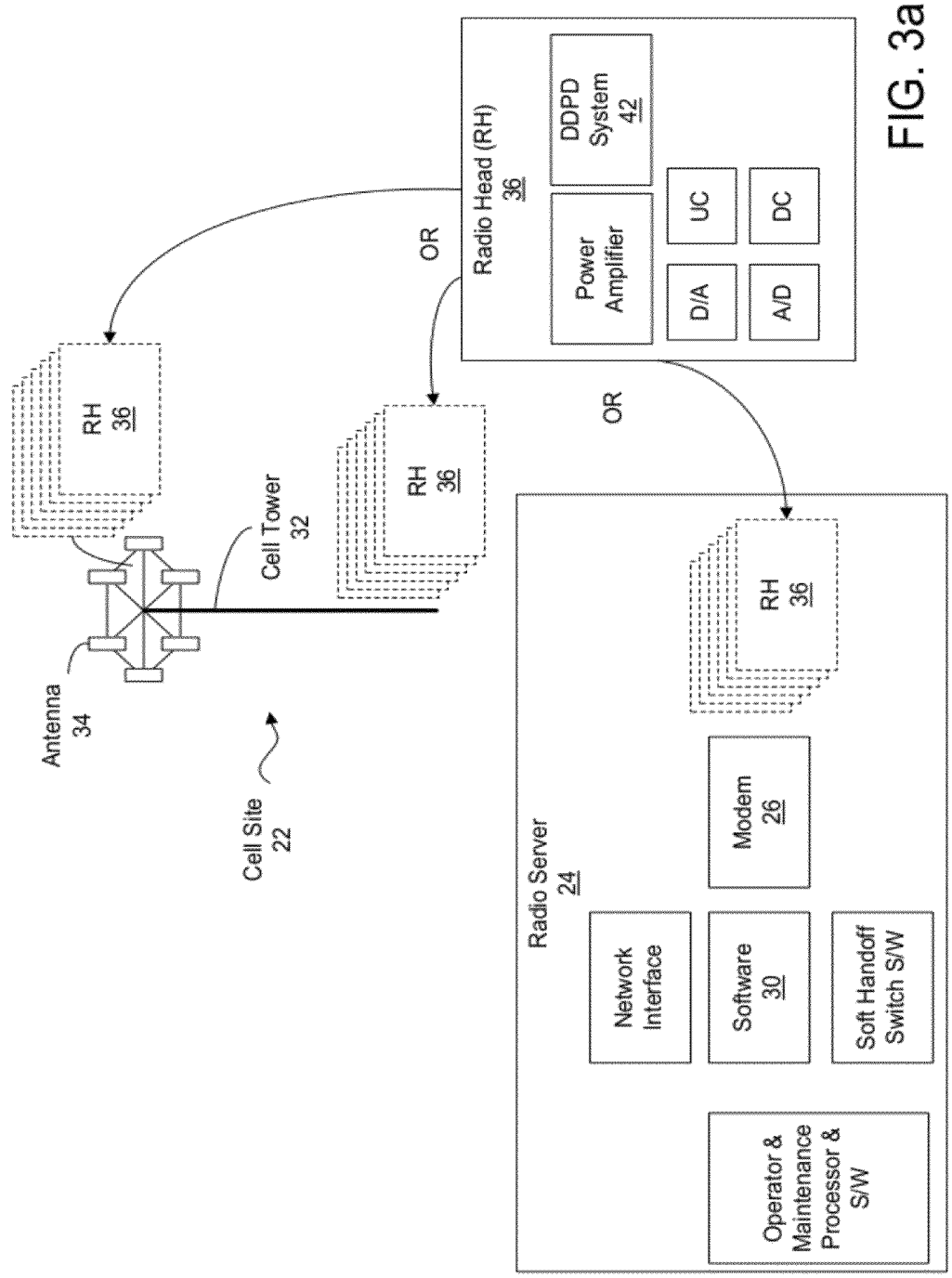

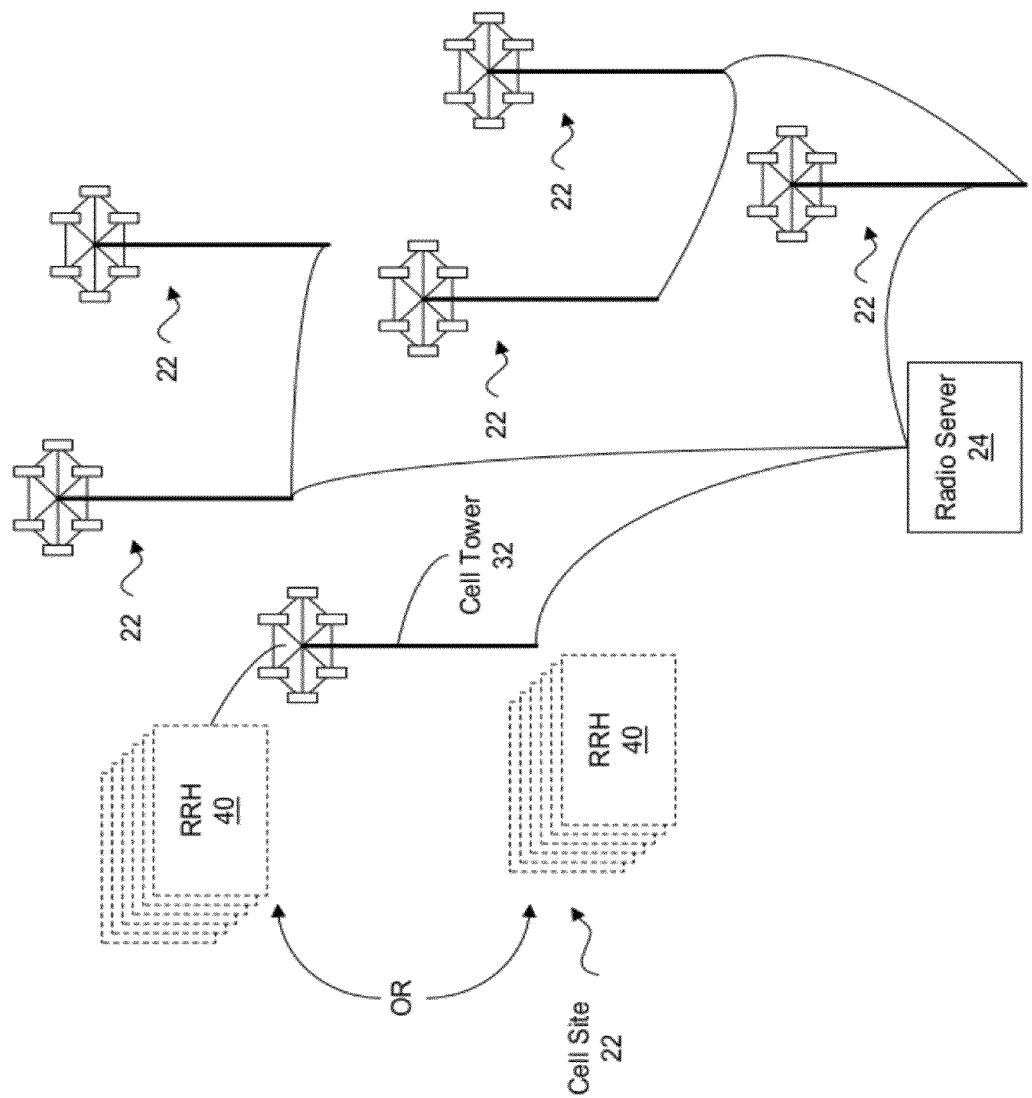

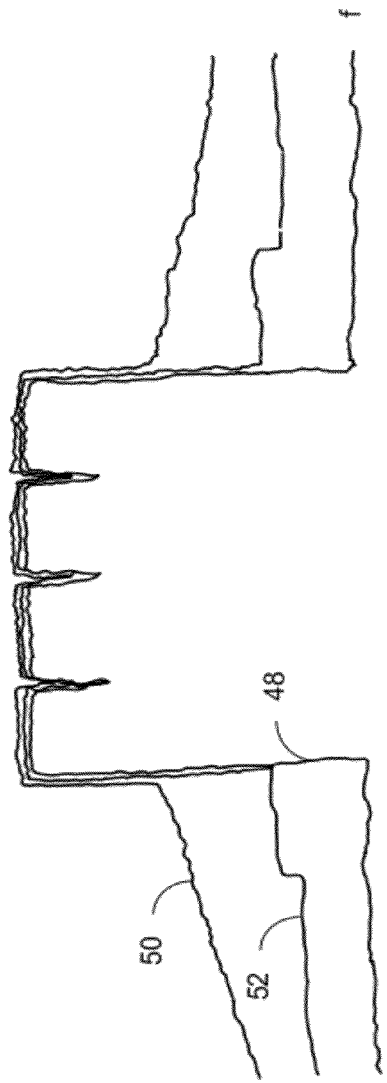
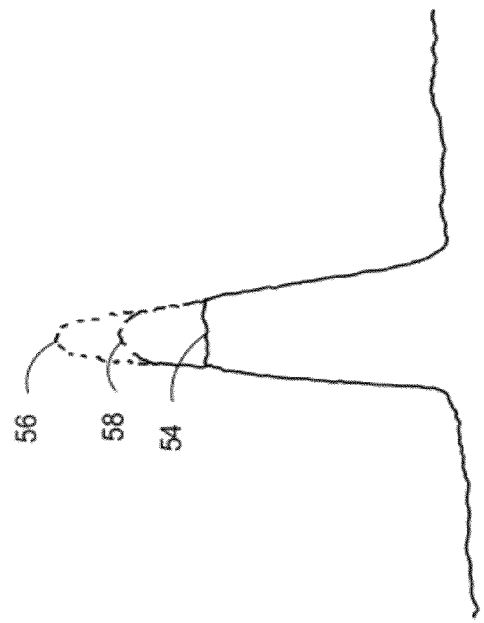

DYNAMIC DIGITAL PRE-DISTORTION SYSTEM

CROSS-REFERENCE TO RELATED APPLICATIONS

This application is a divisional of U.S. patent application Ser. No. 13/198,891, filed on Aug. 5, 2011, entitled "DYNAMIC DIGITAL PRE-DISTORTION SYSTEM," now allowed, which is a divisional of U.S. patent application Ser. No. 11/788,451, filed on Apr. 20, 2007, entitled "DYNAMIC DIGITAL PRE-DISTORTION SYSTEM," now U.S. Pat. No. 8,005,162, and is related to U.S. patent application Ser. No. 11/150,445, filed on Jun. 9, 2005, entitled "DIGITAL PRE-DISTORTION TECHNIQUE USING NONLINEAR FILTERS," now U.S. Pat. No. 7,606,322, the entire contents of all of which are hereby incorporated by reference herein.

FIELD OF THE INVENTION

Embodiments of the invention relate to the linearization of non-linear systems in general, and in particular embodiments, to the use of non-linear pre-distortion to linearize high power amplifiers in radio transmitters used in communication systems such as cellular mobile telephony.

BACKGROUND OF THE INVENTION

FIG. 1a illustrates an exemplary cell site 2 for use within a communications network such as a cellular communications network. The cell site 2 includes a radio server 4 and a cell tower 12. The radio server 4 includes a modem 6, modem software 8, a network interface, an operation and maintenance processor and software, and soft handoff switch software. The cell tower 12 includes one or more antennae 14 mounted to the top of the cell tower for transmitting and receiving wireless communication signals.

The cell site 2 also includes one or more transceivers or radio heads (RHs) 16. Each RH 16 includes a power amplifier, digital-to-analog (D/A) converters, analog-to-digital (A/D) converters, radio frequency (RF) upconverter (UC), RF downconverter (DC), and digital signal processing circuitry 10 for communicating over multiple network protocols. The RHs 16 may be located within the same box as the radio server 4 (e.g. on one or more cards in one or more slots in a rack-mounted configuration). When the radio server 4 and the RHs 16 are located within the same box, they may be referred to as "Node B" or as a basestation.

Alternatively, the RHs 16 may be located in a separate housing from the radio server 4 but connected to an antenna on the top of the cell tower through a lossy cable, or mounted at the top of the cell tower 12 near the antennae 14, which reduces the connection loss between the RHs and the antenna. When the RHs 16 are not located in the same box as the radio server 4, they may be referred to as "remote" radio heads (RRHs). When the RRHs are located at the top of the cell tower 12, they may be referred to as tower-mounted RRHs.

FIG. 1b illustrates a cluster of cell sites 2 in which there is a single radio server 4 connected by fiber optic lines 18 in a daisy chain or parallel configuration to multiple remote radio heads (RRHs) 20, each RRH located at a different cell site. The RRHs 20 may be located at the base of the cell tower 12 at each cell site 2 or alternatively at the top of the cell tower in a tower-mounted configuration.

As mentioned above, the RHs and RRHs of FIGS. 1a and 1b contain power amplifiers (PAs). The output power levels of the PAs may change over time as a function of the number of users. In general, as the number of users increases or the amount of traffic increases (e.g. if multiple users are downloading data), the output power levels increase. In addition, because each user is under power control, as the user gets closer to the cell site 2 or farther away from the cell site, the output power level transmitted to that user decreases or increases accordingly.

FIG. 2 illustrates an exemplary power amplifier characteristic curve of input power (x-axis) versus output power (y-axis). As FIG. 2 illustrates, at higher input power levels the curve compresses at 60 and becomes non-linear, so that the actual amount of output power is less than what is expected under ideal conditions. Besides this amplitude distortion, the power amplifier exhibits non-linear dynamics characteristics otherwise known as "memory effect distortion" and phase distortion. These four PA characteristics comprise the major PA distortion effects and collectively cause output power "signal distortion."

In historical second generation (2G) cellular communication services, such as GSM, GPRS, or EDGE which uses GMSK or in the case of EDGE 3pi/8 MSK modulations, class C PAs were used to amplify a modulated carrier with a relatively high efficiency approaching 50% power added efficiency (PAE). No linearization of the output power versus input power curve was required, because the output signal was provided at a constant amplitude or very small peak-average-ratio (PAR) in the case of an EDGE signal. With current third generation (3G) cellular communication services, Gaussian-like signals are generated with large PAR, and class AB PAs or the more efficient but highly non-linear Doherty PAs are required.

Current-generation PAs are generally expensive and show low DC to RF conversion efficiency and therefore account for the main part of the heat generated by transmitter systems. PAs not only generate non-linear distortions but also possess memory effects that contribute to the nonlinear behavior significantly once the input excitation has wide instantaneous bandwidth.

The transmit signal is a modulated signal and thus consists of various frequency contents, expressed as follows:

$$x(t) = \sum_i x_i(t, f_i) \tag{0.1}$$

When this signal is passed through the transmitter chain comprised of a digital to analog converter (DAC), radio frequency (RF) electronics and the PA, the signal undergoes different distortions: (1) Static Non-Linear Distortion (due to frequency translation from IF to RF and more so in amplifier stage); (2) Non-linear Dynamic Distortion known as PA Memory Effect; (3) Amplitude distortions (due to non-ideal filtering); (4) Phase distortions (due to non-ideal filtering); and (5) Time Delay distortions (due to group delay variations in filtering).

In addition, the PA characteristics change with temperature. As the transmit signal rapidly changes levels, the thermal effects of the PA change, which cause the PA characteristics to change. Since the signal source is typically dynamic and the amplitude can vary 5-10 dB within a very short period (e.g. for HSDPA, High Speed Downlink Packet Access), the PA gain and phase characteristics can change fairly rapidly.

Without linearization, the efficiency of the class AB PAs in 3G cellular communication services drops significantly and would be estimated to be around 4%. Thus, there is a need to improve the efficiency of the PAs in 3G cellular communication services.

Using analog techniques, efficiency can be improved to about 8%. Conventional digital techniques can raise this efficiency to about 20-25% using Class AB power amplifiers. However, there is still a need to improve PA efficiency even more while maintaining good Channel Power Leakage (CPL). When applying conventional DPD techniques with a high efficiency PA (such as Doherty PA), the CPL of the PA signal output is degraded (and could fail the Spectral Emission Mask (SEM) requirement) especially for transitioning signals, where the signal can be transitioned from low power to high power in a rapid fashion. Therefore, the conventional approach is not practical for high efficiency PA's.

"Pre-distortion" is a known technique for applying a pre-distorted PA input signal to a PA to cancel out or compensate for the inherent distortion of the PA and improve the linearization and therefore the efficiency of the PA. However, previous digital implementations utilized digital signal processing (DSP) and software, which can be too slow for current PAs that can experience rapid changes to power levels. In addition, any previous digital implementations were not optimized to work with highly non-linear PAs such as a Doherty pair nor would fit on a single chip.

SUMMARY OF THE INVENTION

Embodiments of the invention are directed to providing Dynamic Digital Pre-Distortion (DDPD) to rapidly correct PA non-linearity and memory effects. Objectives of this technique may include, but are not limited to: (1) correcting the nonlinearity and memory effects of the PA; (2) handling the dynamic signal and adapting to changing PA characteristics; and (3) performing high speed updates to handle fast changing data and PA characteristics.

To perform pre-distortion according to embodiments of the invention, a DDPD engine predistorts an input signal in order to cancel PA nonlinearities as the signal is amplified by the PA. In effect, the DDPD engine produces the inverse of the PA characteristics dynamically. The DDPD engine is implemented as a composite of one linear filter and N−1 high order term linear filters. The input to the linear filter is the input signal. Each high order term filter has as an input some power of the amplitude of the input and each can have a different number of taps as well. The bank of linear filters have programmable complex coefficients provided by a DDPD Coefficient Estimator. The effect of the filtering is to predistort the input signal and cancel the PA distortion so that the baseband equivalent of the output of the PA is very close to being the same as the input signal.

The objective of the DDPD Coefficient Estimator is to compute a set of DDPD Engine coefficients, W, used to predistort the transmit signal. To accomplish this, samples from the transmit path and a feedback path are captured, and Covariance matrices A and B are computed for the current signal levels using optimized hardware. After the covariance matrices are computed, Gaussian elimination processing may be employed to compute the DDPD Engine coefficients.

By utilizing embedded hardware operators rather than a discrete DSP, and therefore, embodiments of the invention are "dynamic" in the sense that they are fast enough to handle rapidly changing signal power levels. Digital and analog logic for implementing multipliers, adders, filters, delays, A/D and D/A converters, buffering, upsampling, RAM, upconversion, downconversion, crossbars and the like, well-understood by those skilled in the art, may be utilized according to embodiments of the invention. In addition, mathematical and hardware optimizations may be employed to simplify and reduce the number of multiplication operands and other operations, which can enable the DDPD system to fit within a single chip.

Embodiments of the invention are designed to handle linearization of non-linear PAs, especially high efficiency PAs (such as Doherty PAs), which have large memory effects and composite nonlinearity, while supporting transitioning signals. Using this linearization technique, PA chain efficiency in excess of 40% is achievable.

BRIEF DESCRIPTION OF THE DRAWINGS

FIG. 3a illustrates an exemplary cell site for use within a communications network such as a cellular communications network according to embodiments of the invention.

FIG. 3b illustrates an exemplary cluster of cell sites in which there is a single radio server connected by fiber optic lines in a daisy chain or parallel configuration to multiple RRHs, each RRH located at a different cell site according to embodiments of the invention.

FIG. 4 illustrates an exemplary plot of frequency versus output power for a multi-carrier signal showing the expected (ideal) output power levels and the actual output power levels as a result of output power "distortion."

FIG. 5 is a frequency plot illustrating a simplified example of predistortion according to embodiments of the invention.

DETAILED DESCRIPTION OF THE PREFERRED EMBODIMENT

Figure 1A:
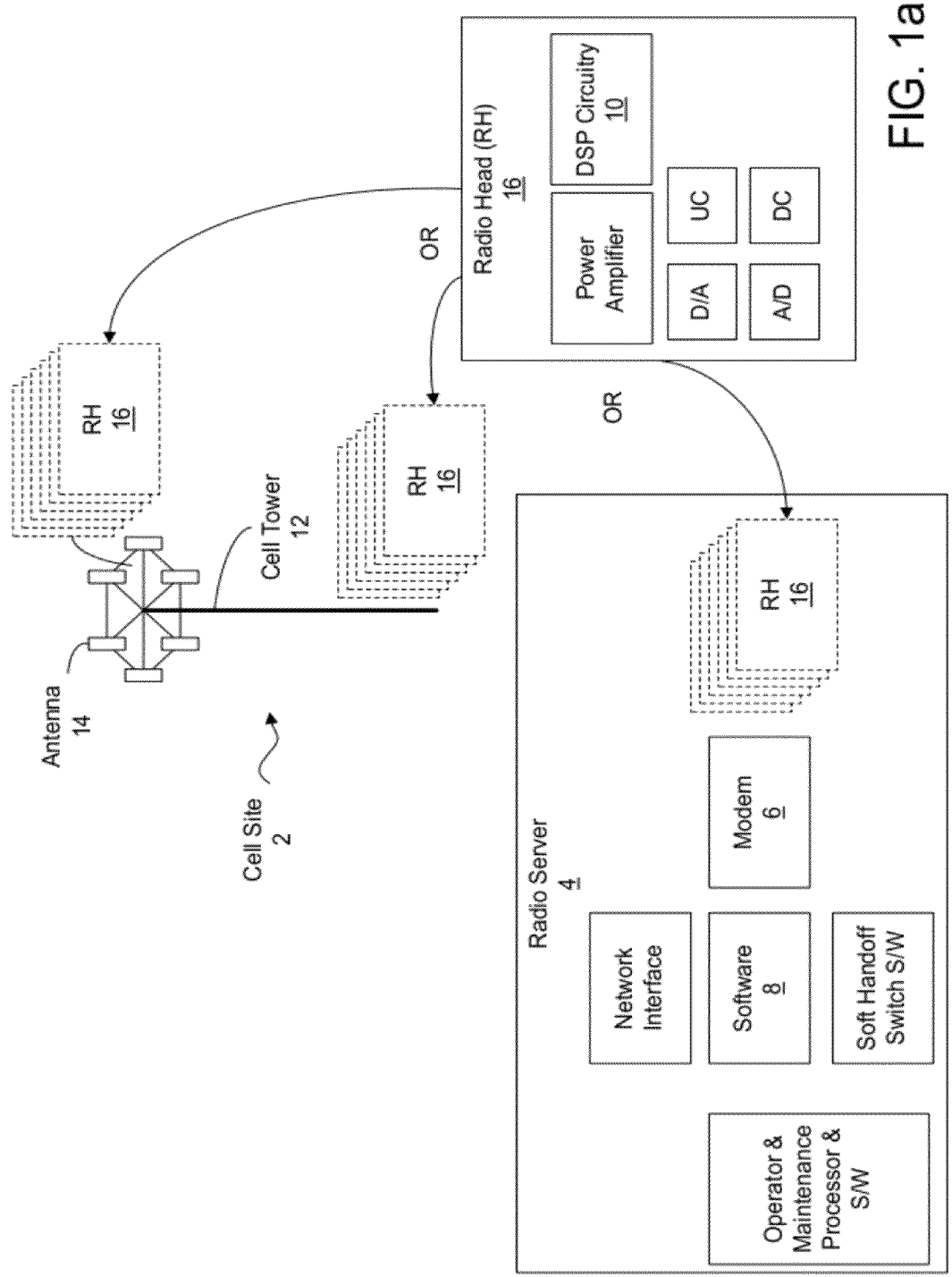
FIG. 1a illustrates an exemplary cell site with a co-located radio server.
Figure 1B:
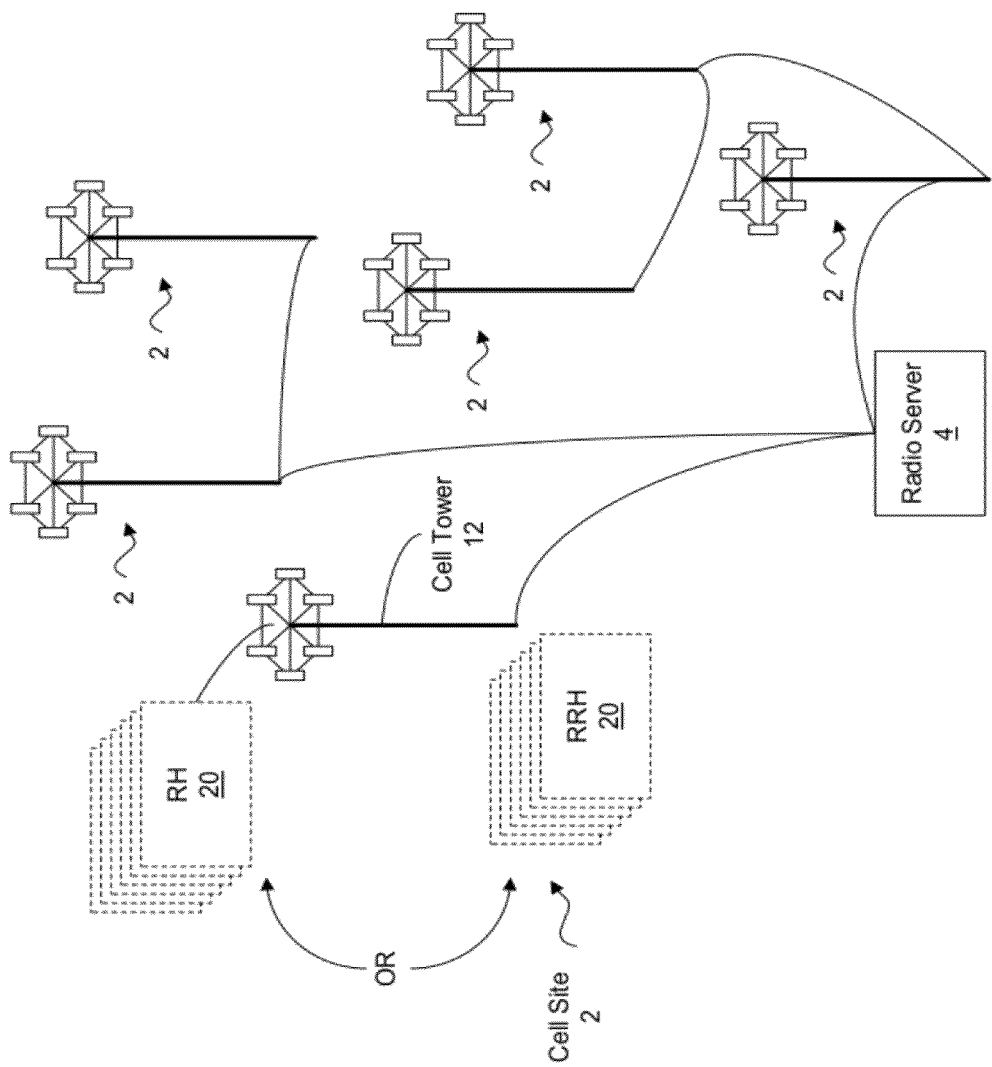
FIG. 1b illustrates a cluster of cell sites in which there is a single radio server connected to each cell site.
Figure 2:
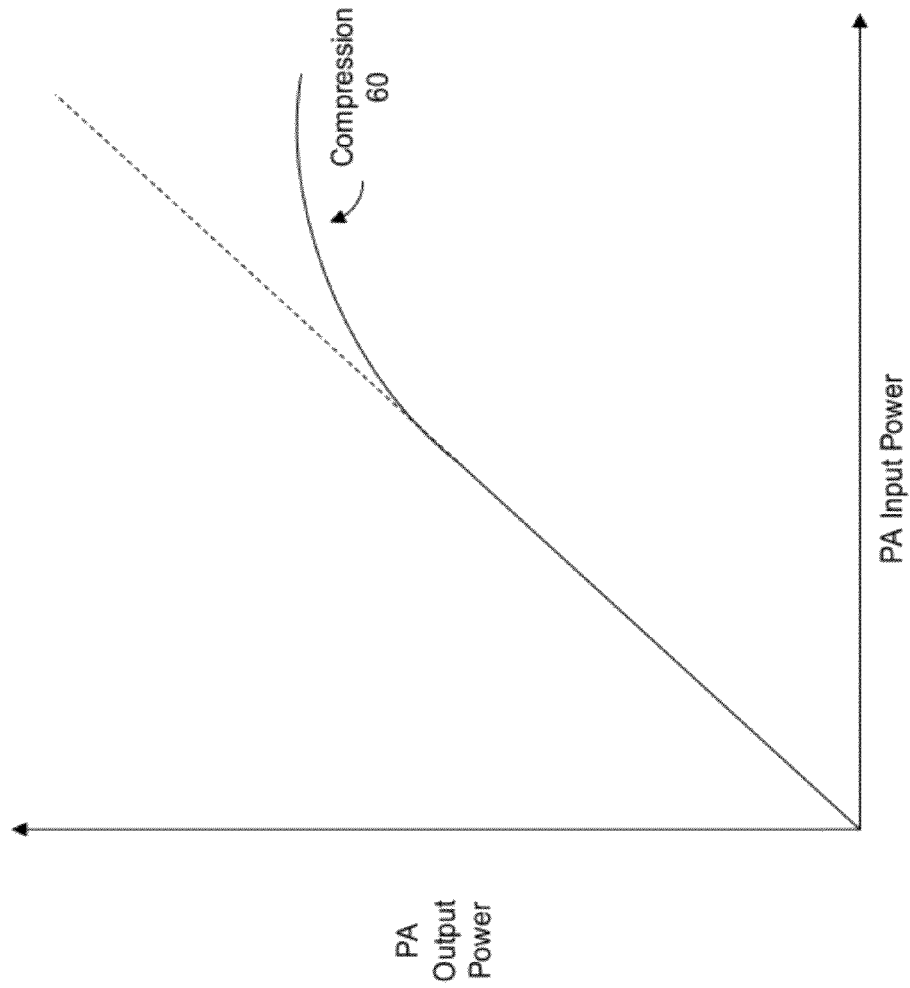
FIG. 2 illustrates an exemplary power amplifier characteristic curve of input power (x-axis) versus output power (y-axis) showing compression at higher power levels.

In the following description of preferred embodiments, reference is made to the accompanying drawings which form a part hereof, and in which it is shown by way of illustration specific embodiments in which the invention can be practiced. It is to be understood that other embodiments can be used and structural changes can be made without departing from the scope of the embodiments of this invention.

Embodiments of the invention are directed to providing Dynamic Digital Pre-Distortion (DDPD) to rapidly correct PA non-linearity and memory effects. Objectives of this technique may include, but are not limited to: (1) correcting the nonlinearity and memory effects of the PA; (2) handling the dynamic signal and adapting to changing PA characteristics; and (3) performing high speed updates to handle fast changing data and PA characteristics.

The architecture of the DDPD engine is based on the nonlinear models and analysis found in "Nonlinear Microwave and RF Circuits," $2^{nd}$ ed., Stephen A. Maas, 2003) and "Nonlinear System Identification and Analysis with Applications to Power Amplifier Modeling and Power Amplifier Predistortion," Raviv Raich, PhD dissertation submitted March 2004, both of which are incorporated by reference herein.

To perform pre-distortion according to embodiments of the invention, a DDPD engine predistorts an input signal in order to cancel PA nonlinearities as the signal is amplified by the PA. In effect, the DDPD engine produces the inverse of the PA characteristics dynamically. The DDPD engine is implemented as a composite of one linear filter and N−1 high order term linear filters. The input to the linear filter is the input signal. Each high order term filter has as an input some power of the amplitude of the input and each can have a different number of taps as well. The bank of linear filters have programmable complex coefficients provided by a DDPD Coefficient Estimator. The effect of the filtering is to predistort the input signal and cancel the PA distortion so that the baseband equivalent of the output of the PA is very close to being the same as the input signal.

The objective of the DDPD Coefficient Estimator is to compute a set of DDPD Engine coefficients, W, used to predistort the transmit signal. To accomplish this, samples from the transmit path and a feedback path are captured, and Covariance matrices A and B are computed for the current signal levels using optimized hardware. After the covariance matrices are computed, Gaussian elimination processing may be employed to compute the DDPD Engine coefficients.

The above-mentioned complex operations are performed by utilizing embedded hardware operators rather than a discrete DSP, and therefore, embodiments of the invention are "dynamic" in the sense that they are fast enough to handle rapidly changing signal power levels. Digital and analog logic for implementing multipliers, adders, filters, delays, A/D and D/A converters, buffering, upsampling, RAM, upconversion, downconversion, crossbars and the like, well-understood by those skilled in the art, may be utilized according to embodiments of the invention. In addition, mathematical and hardware optimizations may be employed to simplify and reduce the number of multiplication operands and other operations, which can enable the DDPD system to fit within a single chip.

Embodiments of the invention are designed to handle linearization of non-linear PAs, especially high efficiency PAs (such as Doherty PAs), which have large memory effects and composite nonlinearity, while supporting transitioning signals. Using this linearization technique, PA chain efficiency in excess of 40% is achievable.

Although some embodiments of this invention may be described herein in terms of improving the linearization of high power amplifiers in radio transmitters (including RRH) located at cell sites, it should be understood that embodiments of this invention are not so limited, but are generally applicable to any non-linear system or elements.

FIG. 3a illustrates an exemplary cell site 22 for use within a communications network such as a cellular communications network according to embodiments of the invention. The cell site 22 includes a radio server 24 and a cell tower 32. The radio server 24 includes a modem 26, modem software 8, a network interface, an operation and maintenance processor and software, and soft handoff switch software. The cell tower 32 includes one or more antennae 34 mounted to the top of the cell tower for transmitting and receiving wireless communication signals. Note that although the example of FIG. 3a shows six antennae 34 representing six sectors, any number of antennae and sectors may be present.

The cell site 22 also includes one or more transceivers or RHs 36. Each RH 36 includes a power amplifier, D/A converters, A/D converters, RF upconverter (UC), RF downconverter (DC), and DDPD system 42. The RHs 36 may be located within the same box as the radio server 24 (e.g. on one or more cards in one or more slots in a rack-mounted configuration). When the radio server 24 and the RHs 36 are located within the same box, they may be referred to as "Node B" or as a basestation.

Alternatively, the RHs 36 may be located in a separate housing from the radio server 24 but connected to an antenna on the top of the cell tower through a lossy cable, or mounted at the top of the cell tower 32 near the antennae 34, which reduces the connection loss between the RHs and the antennae. When the RHs 36 are not located in the same box as the radio server 24, they may be referred to as RRHs. When the RRHs are located at the top of the cell tower 32, they may be referred to as tower-mounted RRHs.

FIG. 3*b* illustrates a cluster of cell sites 22 in which there is a single radio server 24 connected by fiber optic lines 38 in a daisy chain or parallel configuration to multiple RRHs 40, each RRH located at a different cell site (although only one RRH is shown at one cell site for purposes of simplifying the figure). The RRHs 40 may be located at the base of the cell tower 32 at each cell site 22 or alternatively at the top of the cell tower in a tower-mounted configuration.

In either FIG. 3*a* or 3*b*, the DDPD system 42 according to embodiments of the present invention provides advantages to the overall cell site's or cluster of cell sites' performance. This is achieved by predistorting the digital transmit signal in order to cancel PA nonlinearities as the RF signal is transmitted through the PA to improve the linearization and efficiency of the PA.

As mentioned above, at higher input power levels a power amplifier's characteristic curve compresses and becomes non-linear, so that the actual amount of output power is less than what is expected under ideal conditions.

FIG. 4 illustrates an exemplary plot of frequency versus output power for a multi-carrier signal in which the expected (ideal) output power is represented at 48, but at power levels close to saturation, the actual output power as a result of output power "distortion" is represented at 50. This distortion is undesirable because there may be other devices transmitting at adjacent frequencies whose communications may be disrupted if the transmitted signal fails to meet its required adjacent channel power ratio and spectrum emission mask. The problem will be exacerbated when multi-carrier signals are radiated from the transmitter.

Embodiments of the invention characterize the distortion by taking the output of the PA, feeding it back into the system, comparing it to what was expected, and then applying an algorithm to compute "pre-distortion" solution used in the DDPD Engine which results in a PA input signal which, when applied to the PA, will serve to minimize the distortion of the PA. This "pre-distorted" PA input signal is then fed into the PA so that the output of the PA will have reduced distortion and generate something close to the expected power levels (see reference character 52 in FIG. 4). Stated another way, the distortion at the output of the PA can be modeled as passing the signal to be transmitted through an ideal gain, G, followed by a distortion-producing filter, H. The DDPD system generates an inverse distortion or pre-distortion $H^{-1}$ (a reverse filter) to compensate for H, leaving the PA as an ideal gain.

The DDPD system according to embodiments of the invention generates matrices which are used to compute "weights." The weights, which are then used to generate the pre-distorted PA input signal, may be stored for later use whenever a particular power level is detected so that the matrices do not need to be recalculated. In other embodiments, these matrices may be pre-stored at the factory, and may be used initially and later changed if the predistortion algorithm needs different matrices for a different power level. In systems exposed to changing temperatures, the pre-stored weights will also need to be a function of temperature.

FIG. 5 is a frequency plot illustrating a simplified example of predistortion according to embodiments of the invention. Because the pre-distortion is known to cause the amplitude of the signal to be reduced (a compression effect) at 54, the DDPD Engine will pre-distort the peaks of the PA input signal to a higher power level at 56. The result is a PA output with a power level approximately equal to the expected power level at 58. Note that there are other non-linear effects not compensated for in the example of FIG. 5.

It should be understood that in embodiments of the invention, the PA output power levels may be ramped up gradually, so that the extremely distorted high power output 50 shown in FIG. 4 may never be generated in practice. In other words, as the PA output power levels are gradually increased from a very low level to a certain higher level, the proper amount of pre-distortion for that higher power level is determined and applied. When the PA output power levels are increased again, the new distortion levels will be relatively small, and once again the proper amount of pre-distortion for that new power level is determined and applied. This process repeats until full output power levels are reached. This ramping up process may occur when a cell site is first powered up, so that as users and traffic gradually increase, predistortion matrices for those levels are computed and saved. Alternatively, a fixed ramp-up process (training) may be programmed during initialization, prior to servicing any users, or the fixed ramp-up process may be programmed to occur as the cell site becomes operational, where gradually increasing power levels will be transmitted to any users currently in communication with that cell site.

The causes of PA distortion can be separated into three major effects. The first is the so-called "memory effect." If the PA generates a high power signal followed by a lower power signal, the high power signal leaves a residual or memory effect in the bias circuitry in the form of charged up charge storage devices such as capacitors or a fly-wheel effect in an inductor. These residual effects will change the operating point slightly, resulting in a different transfer function, and contribute to the distortion in the subsequent lower power signal. Therefore, it would be preferable to compensate for this memory effect with a characteristic that depends on the past signal.

The second effect is the so-called "thermal effect," which is a form of memory effect. Whenever the PA output power level changes from one level to another, the thermal effects cause a certain amount of distortion. For example, if the PA output power level rapidly changes from low to high, the PA may be cool when it attempts to deliver high power, and this may contribute to the distortion since the PA will be increasing in temperature. Alternatively, if the PA output power level rapidly changed from high to low, the PA may be quite warm when it attempts to deliver lower power, and this may contribute to the distortion as the PA cools.

The third effect includes composite nonlinearities and transitional discontinuities. Highly efficient PAs are usually a composite of two amplifiers. At low power levels, only a class AB portion of the PA is activated. At high power levels, the class C section is turned on and contributes to the overall output power. If the input signal should jump between low and high power levels, a transition between the two amplification regimes will be experienced, and therefore, the discontinuity between the two modes creates nonlinearities and makes it more difficult to linearize the PA output power response. Other nonlinearities are caused by PA amplitude and phase distortion. One example of amplitude distortion is compression. Phase also distorts as power amplifiers are driven closer to compression.

Figure 6:
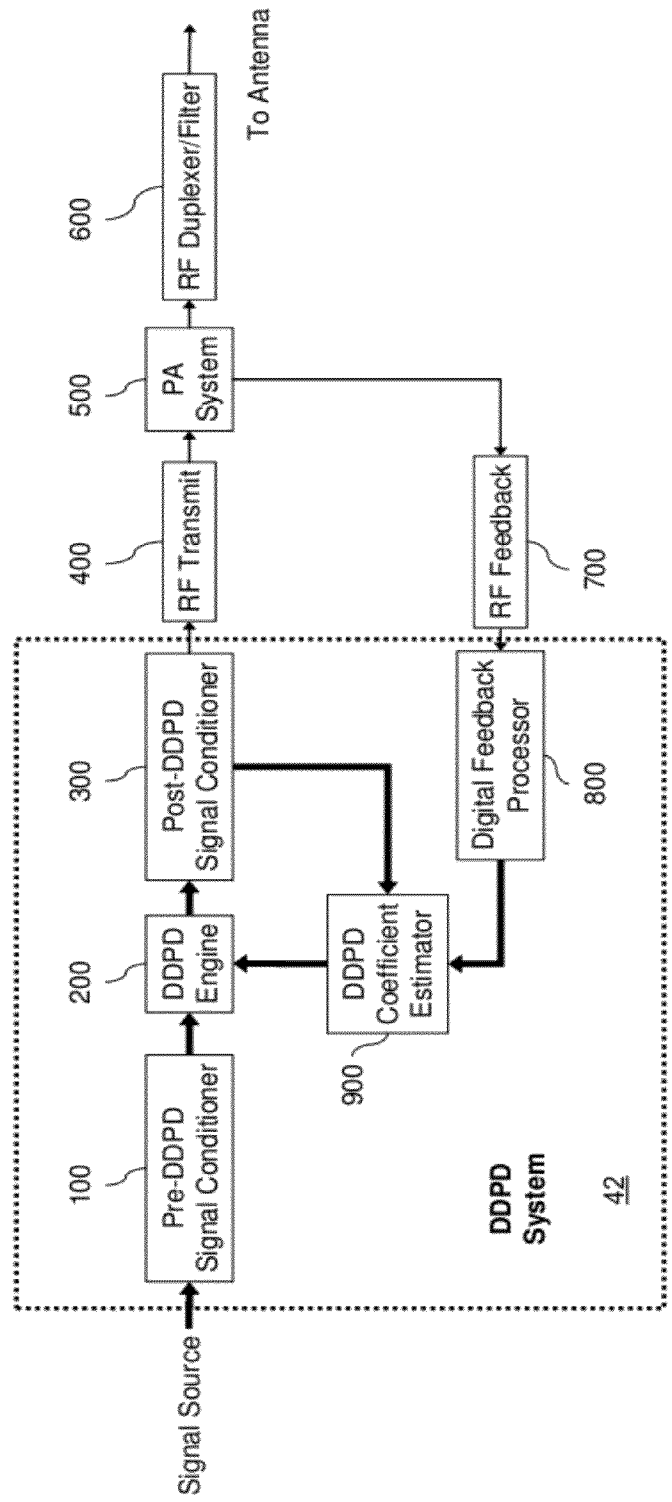
FIG. 6 illustrates a block diagram of an exemplary DDPD System according to embodiments of the invention.

FIG. 6 illustrates a block diagram of an exemplary DDPD System 42 and other transmit path functional blocks according to embodiments of the invention. The input signal is a baseband complex signal $x_1[n]=I_1[n]+jQ_1[n]$ having a sampling rate $R_1$, and a signal bandwidth $B_1 < R_1$.

In FIG. 6, the input signal $x_1[n]$ is processed with the Pre-DDPD Signal Conditioner 100 to perform a number of functions. One function is to apply a gain to the signal using the gain scaler. The signal level needs to be set to the correct level so that the signal is not degraded due to low dynamic range while at the same time avoiding saturation. Gain scaling ensures that we have as high a signal as possible going into the DDPD engine 200 when the input is full power.

Another optional function of the Pre-DDPD Signal Conditioner 100 is to resample the input signal to a sampling rate $R_s$ to increase the bandwidth of the signal into the DDPD engine. The Pre-DDPD Signal Conditioner 100 may perform upsampling at a fixed sampling rate to enable the signal to be transmitted at a high sample rate (although up-sampling can also be performed at a later stage to increase the sample rate). This allows the DDPD engine to create a predistortion spectrum across a wider bandwidth.

Yet another optional function is to capture a section of the source signal and store it in a RAM to be used for AGC and performance analysis. Still another function is to detect large amplitude signals in order to trigger a data capture. This is done to ensure a more complete PA characterization which produces a more stable DDPD solution for large inputs.

The DDPD engine 200 can be thought of as a digital filter that creates the pre-distortion. The DDPD Engine 200 uses the DDPD coefficients from the DDPD coefficient estimator 900 to predistort the signal. Since the DDPD coefficient estimator 900 models the inverse PA characteristic accurately, the DDPD engine 200 produces a predistorted signal which can precisely cancel the PA distortion. As a result, the non-linearity and memory effects are suppressed which achieves a very good CPL at the output of the PA.

Before transmitting the DDPD Engine signal to the RF Transmit Up Converter 400 and PA 500, various signal processing functions are performed in the Post-DDPD Signal Conditioner 300. The Post-DDPD Signal Conditioner 300 performs upsampling, and gain scaling, among other things that will be discussed in further detail below.

Another function is the Tx Signal Data Capture. In this function, a section of the DDPD signal is captured and stored in RAMs (can be more than one) for coefficient computation and signal correlation and AGC purposes. (AGC processing of a RAM is optional.)

Another function is the Complex Multiplier: The Complex Multiplier performs Complex Multiplication to adjust gain and phase in case multiple linearization systems are combined.

Another function is the TX Compensation Filter: The TX Compensation Filter performs filtering to compensate for the Transmit Path Distortion.

Another function is the Digital Upconverter/Upsampler. The Digital Upconverter/Upsampler upsamples and converts the DDPD baseband signal into an IF signal before sending the digital IF data to a DAC. Alternatively baseband I and Q data can be sent to two DACs and quadrature upconverted in the analog domain.

In the RF Transmit Up Converter (UC) 400, the IF digital samples are converted to an analog IF signal using a DAC, which is then RF upconverted to produce the desired RF signal. To assure high performance linearization, the DAC, IF filtering, RF mixer and RF filtering must have low distortion.

The RF transmit block 400 then transmits the pre-distorted signal to the PA system 500 for signal amplification to the desired level. As mentioned above, highly efficient power amplifiers tend to be highly non-linear and have large memory effects. This is why an effective DDPD engine and DDPD coefficient estimator which corrects for the non-linear and memory effects of such a power amplifier system is required in order to achieve a highly efficient system.

A complete transmitter may require a RF Duplexer/Filter 600 if transmit and receive signals use the same antenna (but a duplexer is not required for this invention or even related to this invention). A Duplexer is a three-port network that allows the transmitter and receiver to share the same antenna. The duplexer also filters out some unwanted artifacts further out in the transmit spectrum. A system can also use separate antennas and optional separate transmit and receive filters.

The input to the RF feedback system 700 is tapped off of the PA signal output, usually using an RF coupler. This signal is then converted to an IF signal, filtered, digitized with a high speed ADC, and finally processed digitally in the DDPD following typical practices known by knowledgeable practitioners in the art. The ADC has a sampling rate large enough to capture the significant inter-modulations which need to be corrected. This RF feedback requires load matching to prevent RF or IF reflections that may add back to the main path causing distortion and thus decreasing linearization performance. Alternatively, the feedback signal can be quadrature downconverted to baseband I and Q signals. Furthermore, to correct the RF Feedback gain change over temperature, a thermal sensor is placed near the RF Feedback, so that the gain change can be determined based on the RF Feedback temperature.

The Digital Feedback Processor 800 performs several tasks to condition the Feedback signal before it can be used for DDPD coefficient estimation ensuring correct DDPD operation. One of the tasks is correcting the down converter gain error. Based on the thermal sensor reading located at the RF Feedback, the Feedback Gain Error Corrector digitally corrects the down converter gain error (the value of the gain error was calibrated in advanced) by scaling the feedback data. This assures that the feedback path gain error is accurate so that the AGC can accurately correct the gain offset due to the Transmit Upconverter and PA gain change. This gain correction can alternatively be done in the AGC computation thus eliminating this scaler.

Another task is digital downconversion followed by up-sampling and down-sampling. The IF To Baseband (IFTBB) Converter is a digital processor that converts the ADC's digital IF signal into a baseband signal having the same sampling rate as the transmitted data capture and time aligned with the DDPD signal. This process performs the digital downconversion followed by up-sampling and down-sampling. Delay buffers are included between the up sampler and down sampler to enable correct time correlation. If quadrature downconversion is used, this section just does filtering (if needed), upsampling and downsampling with the delay buffers.

The Digital Feedback Processor 800 also captures a section of the IFTBB signal, and stores it in a RAM for signal correlation and AGC purposes. Alternatively, power estimators can be used to determine the signal power level at certain spots for AGC purposes. Another task performed by the Digital Feedback Processor 800 is performing the signal alignment between the DDPD signal and FB signal using correlation processing. In addition, depending on the calibration process, RF Feedback distortion can be computed in advance. The inverse distortion can be implemented as an finite impulse response (FIR) or infinite impulse response (IIR) filter to reverse the effects of the RF Feedback distortion, thus improving the linearization performance.

A TX/FB AGC Processor within the Digital Feedback Processor 800 computes the ratio of the either the Pre-DDPD signal or post-DDPD signal with the Feedback signal and then compares that ratio to the expected gain to determine the gain offset. Because the gain offset error due to the RF Feedback may already be corrected if the gain is put in the feedback, the AGC gain offset measured is due to the RF Transmit Up Converter and PA system. This gain error can be corrected at the Post-DDPD Signal Conditioner or the RF Transmit Up Converter or both, in such a way that the signal entering to the DAC is maintained at the desirable level.

A Feedback Gain Scalar is used to scale the IFTBB data to that of the DDPD data. Alternatively, the gain scaling can be implemented after the computation is completed, but in that case it is more complex. Typically this scaling gives the DDPD Engine unity gain. Alternatively the DDPD Engine can correct for gain changes like an AGC, but in the best mode that task is separate.

One of the most important components of the DDPD system is the DDPD Coefficient Estimator 900. It is essential that computational accuracy is maintained in order to produce high performance weights. The coefficient estimation process is described in detail in other sections of this specification.

Note that blocks 100-600 are real-time in that the data is transmitted to the user in real time. Blocks 700-900 are solely to compute new pre-distortion weights, and thus need not be performed in real time, but instead may be done relatively slowly. For example, every 666 microseconds a snapshot of data may be captured in a transmit capture random access memory (RAM) and in a feedback capture RAM in the Post-DDPD Signal Conditioner 300 block and the Digital Feedback Processor 800, respectively. From a comparison of those snapshots, the DDPD Coefficient Estimator 900 generates pre-distortion filter weights that are fed into the DDPD Engine 200. Those weights are written into the DDPD Engine to update the solution based on the current data capture resulting in a better pre-distorted input signal. The speed at which a new predistortion value is applied is a function of how fast the PA changes.

Pre-DDPD Signal Conditioner

Figure 7:
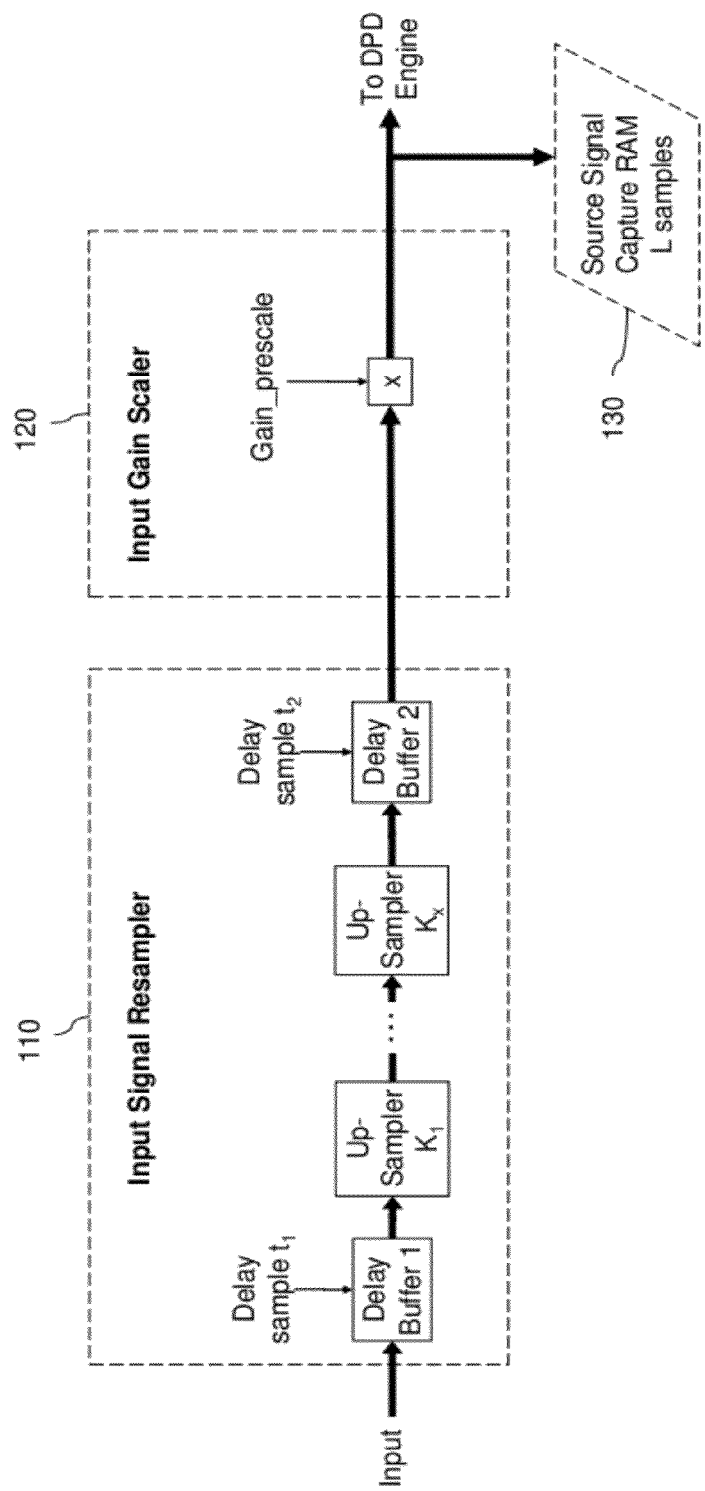
FIG. 7 illustrates a block diagram of an exemplary Pre-DDPD Signal Conditioner according to embodiments of the invention.

FIG. 7 illustrates a block diagram of an exemplary Pre-DDPD Signal Conditioner 100 according to embodiments of the invention. This block has three sub-blocks: Input Signal Resampler 110, Input Gain Scaler 120, and Source Signal Capture RAM 130.

The main objective of the Pre-DDPD Signal Conditioner is to upsample and scale the signal for use by the DDPD Engine. Upsampling takes a data stream, which may have been sampled at 30 Msamples/sec, for example, and fills in the gaps between samples. FIG. 7 shows multiple stages of upsampling, although it should be understood that any number of stages may be used, including one or none. For example, to upsample by eight, three stages of upsampling by two may be used. Also, in this block, data may be captured for automatic gain control (AGC) and weight verification purposes (optional). The input to this block has a CPL at least 5 dB better than what is desired at the PA output. It is best if the CPL of the input is at least 10 dB better than desired.

Input Signal Resampler. With regard to the Input Signal Resampler block 110, the input, $x_{in}[n]$, to the DDPD is typically the source signal that is processed with a crest factor processor. Generally, the sampling rate of the input signal is slightly higher than the signal bandwidth $B_{in}$. Since the DDPD Engine creates a predistorted signal of $x_{in}[n]$ to correct the PA non-linearity and memory effect, the signal $x_{in}[n]$ must be interpolated to produce a signal, $x[n]$, that has a bandwidth larger than the bandwidth extent of predistorted signal. The bandwidth extent of the predistorted signal is a function of the inter-modulation order that is required for correction. Let $N_{imd}$ be the maximum order of inter-modulation that is desired in the solution. We need to interpolate $x_{in}[n]$ to a sample rate larger than $f_F N_{imd} B_{in}$, where $f_F$ is about 1.25 to 1.3 for filter transition. $B_{in}$ is determined assuming $x_{in}[n]$ is centered at zero frequency. A similar analysis can be done if this is not the case. Thus the interpolation factor is determined as:

$$K = \left\lceil f_F \frac{N_{imd} B_{in}}{R_{in}} \right\rceil \quad (1.1)$$

where $B_{in}$ is the input signal bandwidth, $R_{in}$ is the input sampling rate, $N_{imd}$ is the maximum order of inter-modulation that is correctable by the DDPD, $f_F$ is the over-sampling factor to allow practical filtering, and $\lceil x \rceil$ denotes the closest integer value to x that is larger than x. If K is a non-prime integer, K can be decomposed to multiple integers: $K = K_1 K_2 K_3 \ldots$, and the interpolation process is a cascading of multiple simple upsampling interpolators of order $K_1$, $K_2$, $K_3$, ....

In between the upsampling interpolators, tap delay line buffers $D_1$, $D_2$, ... can be used to provide a variable delay of the transmit signal for beamforming or other purposes. For example, a 4 carrier UMTS signal would occupy 20 MHz, and it is desirable to select a input signal sample rate of about $R_{in} = 8 \times 3.84 = 30.72$ Ms/s. If the DDPD is to correct up to $7^{th}$ order inter-modulation, then the resulting principle sample rate would be $1.3 \times 20 \times 7 = 182$ Ms/s. Because the input signal, $x_{in}[n]$, has a sample rate of 30.72, the interpolation factor is conveniently selected as $6 \times 30.72 = 184.32$ Ms/s. Because the interpolation factor of 6 can be decomposed as $6 = 2 \times 3$, the interpolation of 6 can be obtained by cascading two interpolation filters of order 2 and 3.

Input Gain Scaler. With regard to the Input Gain Scaler block 120, the DDPD processor has finite dynamic range that is determined by the bit width. If the signal level is too high, the signal is likely to be saturated. If the signal level is too low, the signal will lose its precision. In both cases, the performance would be degraded. This scaler should be set so that the largest expected peak signal into the DDPD Engine is just below saturation. During operation, this scalar should not be changed, or if necessary, changed very slowly so as not to degrade performance. Alternatively, this scalar can go before the Input Signal Resampler.

Source Signal Capture RAM. With regard to the Source Signal Capture RAM 130, $N_{agc}$ samples of the input to the DDPD engine are captured to be used in the AGC processor or performance analysis. This capture RAM is optional; AGC may be performed using a real-time level estimator instead, and this RAM is optional for performance analysis.

DDPD Engine

Figure 8A:
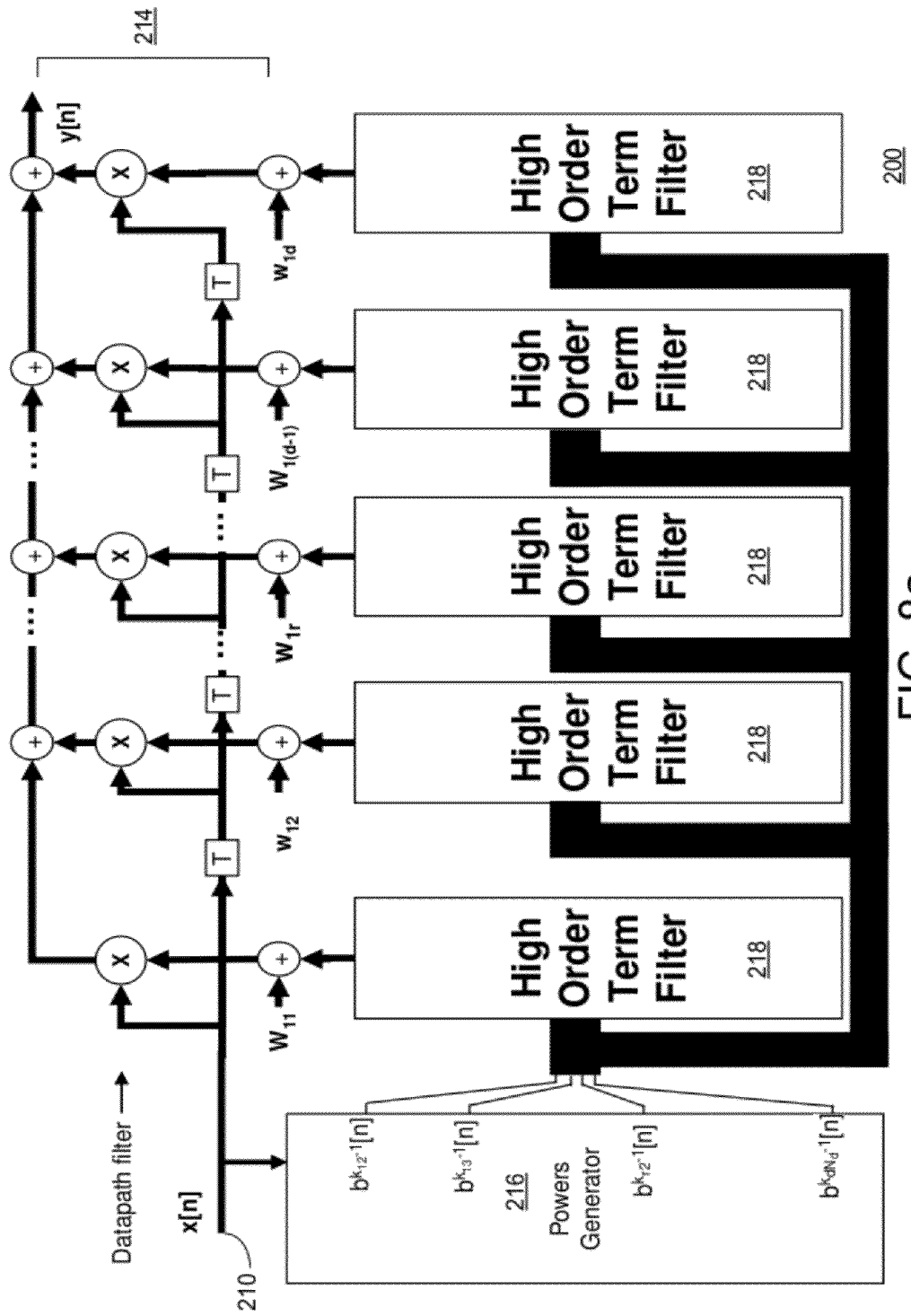
FIG. 8a illustrates an exemplary DDPD Engine according to embodiments of the invention.
Figure 8B:
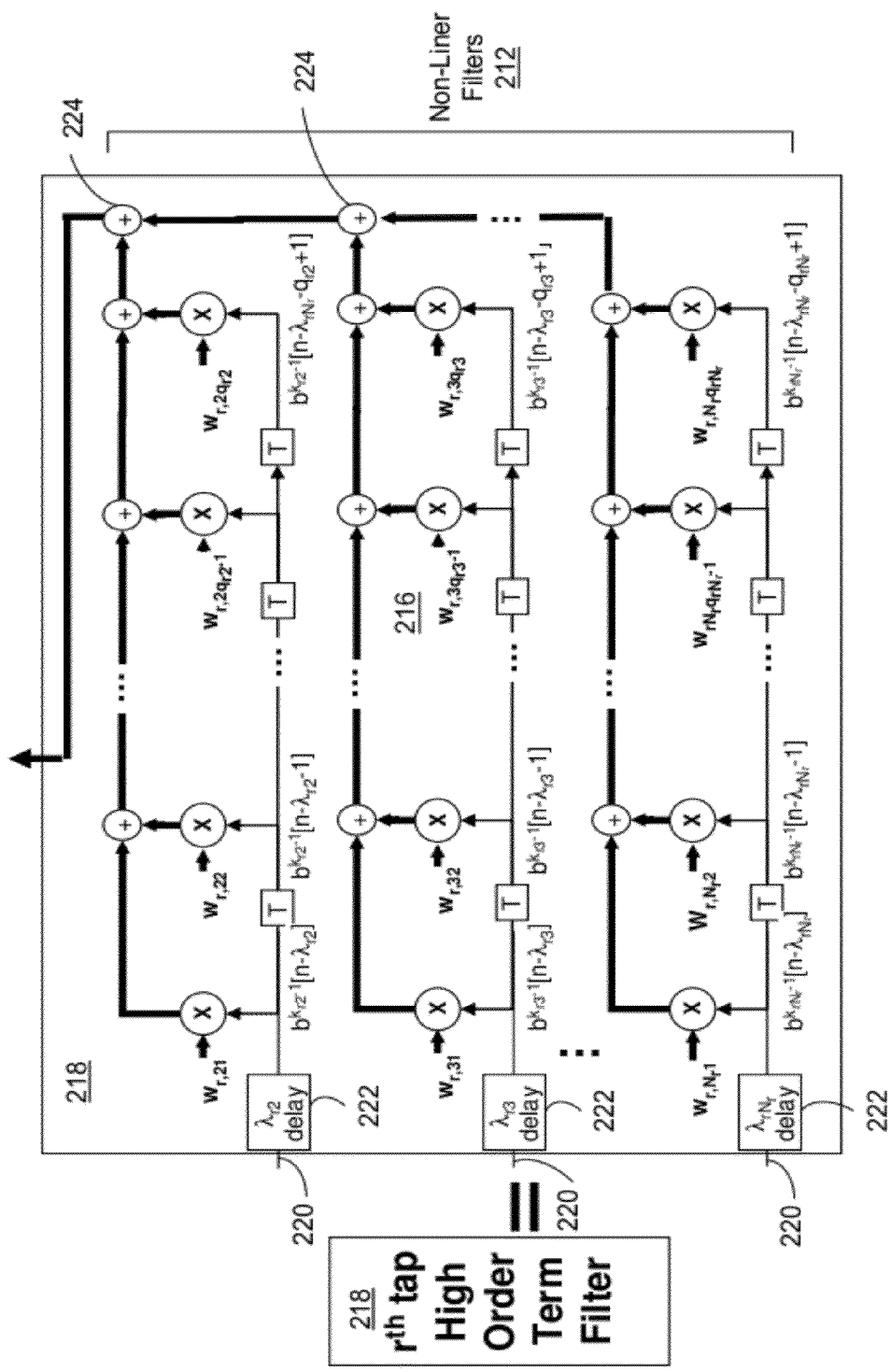
FIG. 8b illustrates an exemplary high order term filter that may be used in the exemplary DDPD Engine of FIG. 8a according to embodiments of the invention.

FIGS. 8a and 8b illustrate an exemplary DDPD Engine 200 according to embodiments of the invention. The purpose of this block is to predistort the input signal in order to cancel the PA nonlinearities as the signal is transmitted through the PA. In effect, the DDPD engine produces the inverse of the PA characteristics. The DDPD engine applies the DDPD coefficients to the transmitted signal to predistort the signal and cancel the PA distortion. The effect is that the baseband equivalent of the output of the PA is very close to being the same as the input signal.

The DDPD has two effects on the PA output. First, since the DDPD predistorts the signal to cancel the distortion of the PA, the out-of-band intermodulation distortion observed at the PA output is reduced. Because the input signal x[n] has very low out-of-band CPL, the output of the PA would also have very low out-of-band CPL. Second, the distortion corrected by the DDPD includes the in-band intermodulation distortion of the PA. This improves the error vector magnitude (EVM) between the PA output and the source signal.

Linear Digital Filter. The input signal 210 passes through a linear digital filter 214. The linear digital filter 214 has one or more linear digital filter taps, each tap other than the first tap being successively delayed by one delay unit. It should be understood that although FIG. 8a shows a general case of multiple high order term filter blocks 218 adding into multiple taps of the linear digital filter 214, in actual implementations only a subset of the high order term filter blocks 218 may actually be employed. A powers generator circuit 216 generates one or more powers (b values) of the transmit signal 210, where the b values represent powers of x[n]. Each high order term filter block 218 may receive a different set of one or more powers of the transmit signal 210 from the powers generator block 216.

High Order Term Filters. One high order term filter block 218 is shown in FIG. 8b. The high order term filter block 218 includes one or more linear digital filters 212, each linear digital filter 212 having one or more taps, each tap other than the first tap being successively delayed by one delay unit. Each linear digital filter 212 may receive as an input 220 any one or more of the powers of the transmit signal from the powers generator block shown in FIG. 8a, delayed by a different amount as represented by delay blocks 222. The bold lines in FIG. 8b represent complex numbers, while the non-bold lines represent real numbers. The output of the linear digital filters 212 in each high order term filter block 218 are all added together at 224 and added to the tap in the corresponding linear digital filter.

Each linear digital filter in FIGS. 8a and 8b has programmable complex coefficients or weights w which are provided by the DDPD Coefficient Estimator, to be discussed in detail hereinafter. The weights w represent a pre-distortion value computed based on a comparison of the pre-distorted transmit signal y[n] and a feedback signal z[n] derived from the output of the distorting element.

Denoting y[n] as the DDPD engine output, this implementation can be mathematically expressed as $$y[n] = DPD(x[n]) \quad (2.1)$$

$$y[n] = w_{11}x[n] + w_{12}x[n-1] + \ldots + w_{1,d}x[n-d+1] + \quad (2.2)$$

$$x[n] \begin{Bmatrix} w_{1,21}b^{k_{12}-1}[n-\lambda_{12}] + w_{1,22}b^{k_{12}-1}[n-\lambda_{12}-1] + \ldots + \\ w_{1,2q_{12}}b^{k_{12}-1}[n-\lambda_{12}-q_{12}+1] + \\ w_{1,31}b^{k_{13}-1}[n-\lambda_{13}] + w_{1,32}b^{k_{13}-1}[n-\lambda_{13}-1] + \ldots + \\ w_{1,3q_{13}}b^{k_{13}-1}[n-\lambda_{13}-q_{13}+1] + \\ \vdots \\ w_{1,N_11}b^{k_{1N_1}-1}[n-\lambda_{1N_1}] + w_{1,N_12}b^{k_{1N_1}-1}[n-\lambda_{1N_1}-1] + \\ \ldots + w_{1,N_1q_{1N_1}}b^{k_{1N_1}-1}[n-\lambda_{1N_1}-q_{1N_1}+1] \end{Bmatrix} +$$

-continued $$\ldots x[n-r] \begin{Bmatrix} w_{r,21}b^{k_{r2}-1}[n-\lambda_{r2}] + w_{r,22}b^{k_{r2}-1}[n-\lambda_{r2}-1] + \ldots + \\ w_{r,2q_{r2}}b^{k_{r2}-1}[n-\lambda_{r2}-q_{r2}+1] + \\ w_{r,31}b^{k_{r3}-1}[n-\lambda_{r3}] + w_{r,32}b^{k_{r3}-1}[n-\lambda_{r3}-1] + \ldots + \\ w_{r,3q_{r3}}b^{k_{r3}-1}[n-\lambda_{r3}-q_{r3}+1] + \\ \vdots \\ w_{r,N_r1}b^{k_{rN_r}-1}[n-\lambda_{rN_r}] + w_{r,N_r2}b^{k_{rN_r}-1}[n-\lambda_{rN_r}-1] + \\ \ldots + w_{r,N_rq_{rN_r}}b^{k_{rN_r}-1}[n-\lambda_{rN_r}-q_{rN_r}+1] \end{Bmatrix} +$$

$$\ldots x[n-d] \begin{Bmatrix} w_{d,21}b^{k_{d2}-1}[n-\lambda_{d2}] + w_{d,22}b^{k_{d2}-1}[n-\lambda_{d2}-1] + \ldots + \\ w_{d,2q_{d2}}b^{k_{d2}-1}[n-\lambda_{d2}-q_{d2}+1] + \\ w_{d,31}b^{k_{d3}-1}[n-\lambda_{d3}] + w_{d,32}b^{k_{d3}-1}[n-\lambda_{d3}-1] + \ldots + \\ w_{d,3q_{d3}}b^{k_{d3}-1}[n-\lambda_{d3}-q_{d3}+1] + \\ \vdots \\ w_{d,N_d1}b^{k_{dN_d}-1}[n-\lambda_{dN_d}] + w_{d,N_d2}b^{k_{dN_d}-1}[n-\lambda_{dN_d}-1] + \\ \ldots + w_{d,N_dq_{dN_d}}b^{k_{dN_d}-1}[n-\lambda_{dN_d}-q_{dN_d}+1] \end{Bmatrix}$$

Written compactly, $$\underline{y}[n] = \left\{ \sum_{p=1}^{d} \sum_{r=2}^{N_p} \sum_{s=1}^{q_{pr}} \underline{w}_{p,rs} \left| x[n-\lambda_{pr}-s+1] \right|^{k_{pr}-1} x[n-p+1] \right\} + \quad (2.3)$$

$$\sum_{p=1}^{d} \underline{w}_{1p} x[n-p+1]$$

where x[n] is the DDPD input signal, b[n] is the amplitude of the input (i.e., b[n]=|x[n]|), y[n] is the DDPD Engine output, $k_{ri}$ and $q_{ri}$ are the power and the length of filter of the $i^{th}$ high order term filter of the $r^{th}$ higher order term block (e.g., $k_{32}$ and $q_{32}$ are the polynomial power and the length of second filter of the third higher order term block, respectively). The terms $k_{ri}$ represent real numbers, d is the number of taps of the baseband filter, $\lambda_{ri}$ is the number of delays of the $i^{th}$ high order term filter of the $r^{th}$ higher order term block, $w_{1j}$ is the coefficient for the $j^h$ tap for the baseband filter, and $w_{r,ij}$ is the coefficient for the $j^h$ tap for the $i^{th}$ high order term filter of the $r^{th}$ higher order term block.

The top line of equation 2.2 represents the linear digital filter 214 in FIG. 8a. A digital filter is usually implemented with tapped delays of the original input signal x, and each delay is weighted with a different weight w, which is received from the DDPD Coefficient Estimator, to be discussed in greater detail hereinafter. The first term is the weighted original undelayed input signal x[n]. The other terms, which represent the original input signal delayed by various amounts, are needed because the DDPD engine needs to model the memory effects in the PA as described above, and generate a DDPD engine output that accounts for these memory effects by inverting the PA's characteristics.

Because the PA has high order nonlinearities, as discussed above, those high order nonlinearities need to be reproduced by having powers of the input signal x[n] in the filter solution of equation 2.2 (where the b values generated from the Powers Generator block 216 represent powers of x[n]). High order term filters capable of representing these high order nonlinearities are represented in the bottom terms of equation 2.2, which add to the baseband taps, $x[n-J-1]$, $0<J<d-1$ in the linear digital filter 214. In the bottom terms of equation 2.2, within the large parentheses, each line is a nonlinear digital filter representing different orders of $x[n]$ (e.g. $x[n]^\wedge$, $x[n]^\wedge\infty$, etc.) with various delayed taps. These are the linear digital filters 212 shown in FIG. 8b. The output of the filters are nonlinear because they receive as input a power of $x[n]$ (the input signal) rather than $x[n]$ itself. Otherwise, structurally the filters are similar. Each term in each line is essentially a different filter itself.

In the exemplary DDPD Engine shown in FIGS. 8a and 8b, the "T" boxes mean a one clock delay. In FIG. 8a, the "Powers Generator" box computes $b[n]=|x[n]|$ and raises this real value to different powers, $$\{b^{k_{r2}-1}[n], b^{k_{r3}-1}[n], b^{k_{rN}-1}[n]\}. \tag{2.5}$$

Note that the computation can be done using any method as long as the terms are mathematically equal to these b's. The $b^{k_{ri}-1}[n]$ terms are fed through $q_{ri}$ tap filters having the coefficients $[w_{r,i_1}, w_{r,i_2}, \ldots, w_{r,i_{q_{ri}}}]$. The output of these filters are summed with the coefficient $w_{1r}$. The coefficients of datapath filter are then applied as the filter coefficients to the signal $x[n]$ to produce the DDPD signal $y[n]$.

By adding more structure onto each baseband tap coefficient, this more generic structure extends the structure in "A Robust Digital Baseband Predistorter Constructed Using Memory Polynomials," by Lei Ding, G. Tong Zhou, Zhengriang Ma, Dennis R. Morgan, J. Stevenson Kenney, Jaehyeong Kim, and Charles R. Giardina (manuscript submitted to IEEE Trans. On Communication, Mar. 16, 2002), the contents of which are incorporated herein by reference.

Post-DDPD Signal Conditioner

Figure 9:
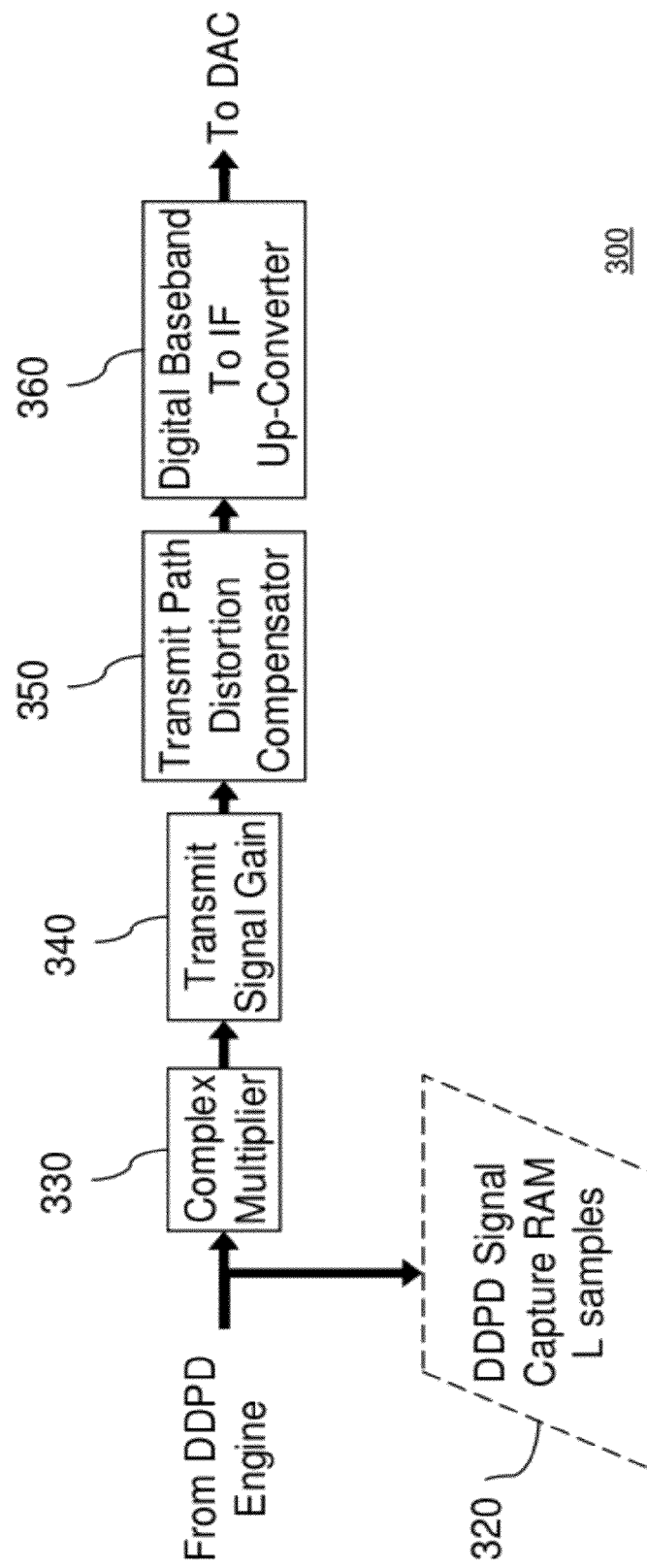
FIG. 9 illustrates an exemplary Post-DDPD Signal Conditioner according to embodiments of the invention.

FIG. 9 illustrates an exemplary Post-DDPD Signal Conditioner 300 according to embodiments of the invention. The objective of the Post-DDPD Signal Conditioner 300 is to condition the signal to the form that can be easily RF upconverted and amplified.

For multiple antenna transmission, it is often required that the signal amplitude and phase be adjusted to implement beam-steering. This function is provided by the use of the programmable Complex Multiplier 330. The Transmit Signal Gain 340 (which effectively can be part of the Complex Multiplier) can be controlled by the AGC circuitry (or any processor) to place the signal into the DAC at the correct level. A programmable complex FIR filter called the Transmit Path Distortion Compensator 350 is implemented so that after calibration, this filter will correct the linear distortion due to DAC and Transmit Upconverter. Next is the Digital Baseband To IF Upconverter 360 which performs filtering, upsampling, fine time delay, and fs/4 frequency translation to place the DDPD signal at the correct IF frequency for transmission.

The five sub-blocks of the Post-DDPD Signal Conditioner, represented by the DDPD Signal Capture RAM, Complex Multiplier, Transmit Signal Gain, Transmit Path Distortion Compensator, and Digital Baseband To IF Upconverter blocks will now be examined in detail.

DDPD Signal Capture RAMs. The output of the Transmit Limiter is the baseband version of the PA input signal. This signal is tapped off and sent to the DDPD Signal Capture RAMs 320, one for the correlation and one for coefficient estimation although one RAM could be shared. The coefficient RAM can also be used for AGC processing, but alternatively a real-time level estimator can be used. The signal to the correlation RAM is captured as is. The signal to the coefficient estimation RAM is delayed by $N_{tx\_delay}$ samples, and L samples of this complex signal $y[n]=(I_{DPD}[n]+jQ_{DPD}[n])$ are captured. If the A and B matrix computation (discussed later) takes place at the data rate speed, no data capture is required. The data goes straight into the weight computation engine.

Complex Multiplier. It is desirable to be able to vary the amplitude and phase of the post DDPD Engine signal. To support this function, a complex multiplier 330 is used to provide this gain adjustment.

$$I_{out}[n] = CM_i * I_{in}[n] - CM_q * Q_{in}[n] \tag{3.4}$$

$$Q_{out}[n] = CM_q * I_{in}[n] + CM_i * Q_{in}[n] \tag{3.5}$$

where $I_{in}[n]$, $Q_{in}[n]$ and $I_{out}[n]$, $Q_{out}[n]$ are the input and output of the Complex Multiplier, respectively, and $CM_i$ and $CM_q$ are the real and complex components of the multiplier. If we write $(CM_i + j CM_q) = Ae^{j\theta}$, then it is apparent that $CM_i$ and $CM_q$ implement an amplitude and phase change.

Transmit Signal Gain. During the operation, the TX/FB AGC may adjust the gain of the signal that is sent to the DAC in concert with adjusting an analog gain, $g_2$, discussed later, in the Transmit Signal Gain block 340.

$$I_{out}[n] = g_1 I_{in}[n] \tag{3.6}$$

$$Q_{out}[n] = g_1 Q_{in}[n] \tag{3.7}$$

Where $I_{in}[n]$, $Q_{in}[n]$ and $I_{out}[n]$, $Q_{out}[n]$ are the input and output of the Transmit Signal Gain, respectively, and $g_1$ is the gain value that is provided from the AGC or other processor. This gain may be incorporated into the complex multiplier.

Transmit Path Distortion Compensator (Equalizer). The DAC and the Transmit RF Upconverter have amplitude and/or phase distortion that may need to be corrected using the Transmit Path Distortion Compensator (Equalizer) 350 to optimize the linearization performance. Referenced to the baseband domain, the transfer function $H_{DAC}(f)$ of the DAC generally has a sin(x)/x filter shape:

$$H_{DAC}(f) = \frac{\sin(\pi(f - f_{IF})T_s)}{\pi(f - f_{IF})T_s}; -\frac{B_{imd}}{2} < f < \frac{B_{imd}}{2}, \tag{3.8}$$

where $f_{IF}$ is the IF center frequency of the input to the DAC input signal, $1/T_s$ is the DAC conversion rate, and $B_{imd}$ is the bandwidth of the transmit signal including the highest intermodulation distortions that are required to be corrected.

The baseband version of the transfer function $H_{UC}(f)$ of the Transmit RF Upconverter can be measured. Thus the transfer function for the required correction filter is expressed as:

$$H_{TXC}(f) = \frac{\pi(f - f_{IF})T_s}{\sin(\pi(f - f_{IF})T_s)} \frac{1}{H_{UC}(f)}; -\frac{B_{imd}}{2} < f < \frac{B_{imd}}{2} \tag{3.9}$$

This filter is then implemented as a complex digital FIR filter or IIR filter with complex coefficients using techniques known to the knowledgeable practitioner in the art. It is preferred that a FIR filter be used in order to maintain the signal stability and retain linear phase.

Digital Baseband to IF Upconverter. The baseband transmit signal, $y[n]$, has a sampling rate $R_s$, and occupies a bandwidth of less than $R_s$. This signal needs to be converted to an analog signal and up-converted to the desired RF frequency in the Digital Baseband to IF Upconverter 360 before sending to the power amplifier. There are two approaches for Baseband to RF modulation.

In Analog Direct conversion, the baseband I and Q signals are separately converted to baseband analog signals. The signals are then filtered with low-pass filters and the in-phase and quadrature components are quadrature modulated to the desired RF frequency. Major limitations of this technique are amplitude imbalance and phase offset between the two DACs and their following baseband filters, and errors in the phase of local oscillators (LO's) utilized in the quadrature modulator. The amplitude and phase mismatch between the analog inphase and quadrature signals prevents the quadrature modulator from completely suppressing the signal images. In order to suppress the signal images to the desired level, the in-phase and quadrature DAC's and the associated low-pass filters must be fine-tuned, which can be impractical for wideband transmission. An alternative is to use a compensation filter in the digital domain, but this requires calibration and additional hardware complexity.

A more effective method for signal conversion is to perform IF up-conversion in the digital domain (IF sampling). This method alleviates the amplitude and phase mismatch and allows for much easier suppression of the signal images. In general, upsampling and mixing is required in this block. Upsampling can be done with a number of known methods found in textbooks. Typically an upsampling by a factor of four results in a desirable sampling rate and bandwidth into a DAC. It may be necessary to do some of the upsampling using parallel datapaths in order to keep the data rate within practical limits based on the ASIC technology used to implement the circuit. Before mixing, the data can be delayed at the higher sample rate in order to provide more delay resolution.

Figure 10:
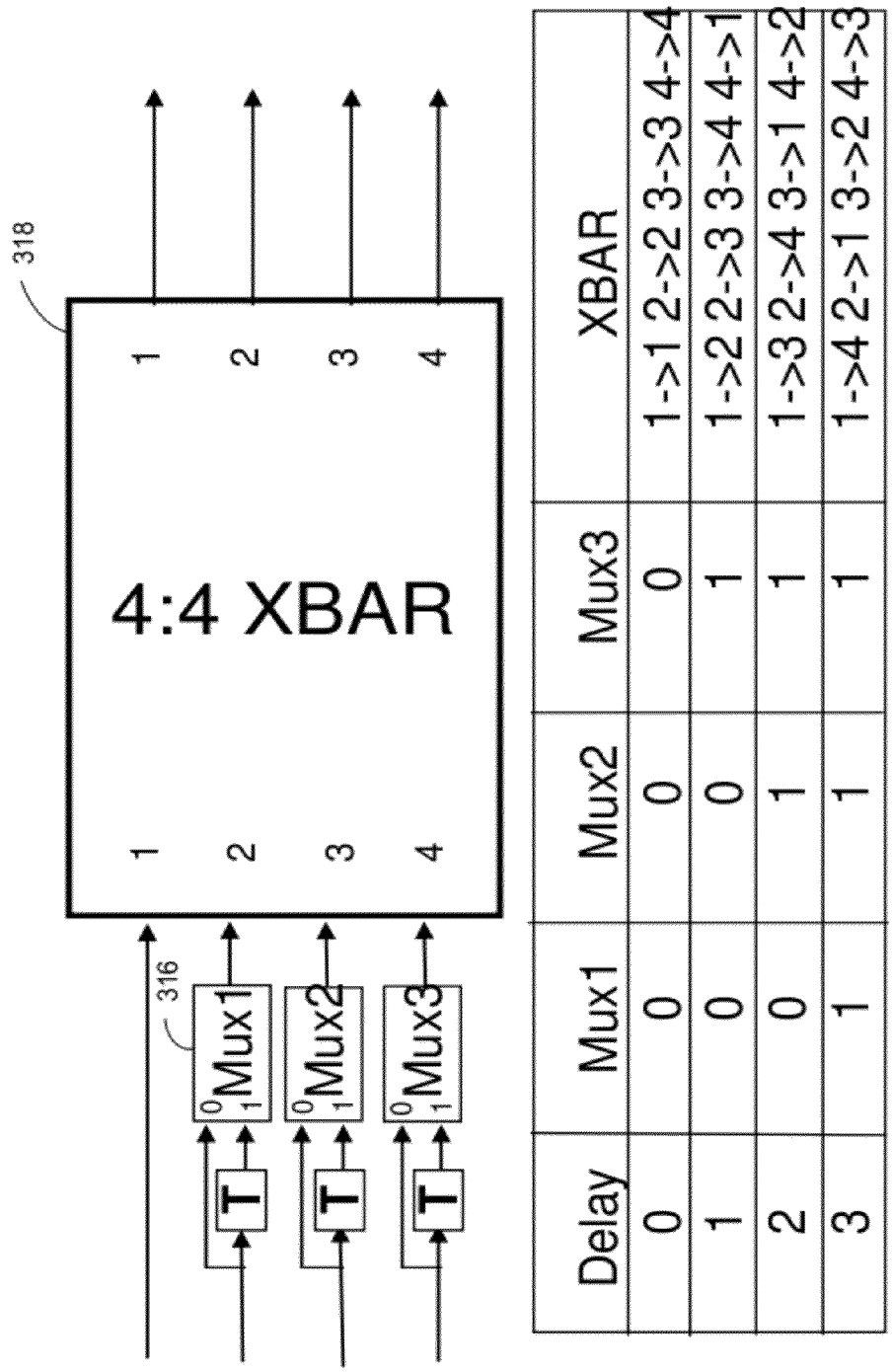
FIG. 10 illustrates an exemplary implementation of the Fine Delay block which can apply a one clock shift (at the actual data rate) to four parallel data paths according to embodiments of the invention.

FIG. 10 illustrates an implementation of an exemplary Fine Delay structure which can apply a one clock shift (at the actual data rate) to four parallel data paths according to embodiments of the invention. The fine delay structure is part of the Digital Baseband to IF Up-Converter 360. The fine delay structure enables the aligning of the timing of two devices such as two transmitters to a fine resolution of one clock period of a data path having a particular data rate. For transmit signals with high data rates, it will probably be necessary to use parallel paths after the digital baseband to IF converter block. For example, given a data rate of 720 Megasamples per second (MSPS), the data can be split into four paths, each now at 180 MSPS. To apply a delay equal to one 720 MSPS clock on the data path, a structure such as that shown in FIG. 10 will have to be implemented. By combining the programmable one slow clock delay with the crossbar switch, the delays at the faster clock rate can be implemented. The T's represent one clock delay at the 180 MSPS clock rate. The table under the block diagram shows how to program the muxes in order to apply a delay of 0-3 fast clocks.

To explain the operation of the exemplary fine delay structure shown in FIG. 10, suppose that a data path receives data samples X(6), X(5), X(4), X(3), X(2), X(1), X(0), with X(0) being the first sample received and X(6) being the last sample received. In this example, the data stream is 720 MSPS, and the chip cannot sustain this data rate, so a commutator is used to split it into four separate parallel data paths as shown in FIG. 10. The samples are essentially time division multiplexed so that successive data samples are routed to the parallel data paths in a round-robin fashion. For example, X(0) goes to path 1, X(1) goes to path 2, X(2) goes to path 3, X(3) goes to path 4, X(4) goes back to path 1, and so forth. Three of the paths can be delayed by one-fourth of the data rate of 720 MSPS (see delay T in FIG. 10), or not delayed at all, by selection of a multiplexer (MUX) 316 in each path. The crossbar 318 can further be programmed as shown in the table of FIG. 10 to route the four data paths to the four output paths. The four parallel outputs can then be re-combined and serialized back into a single line at a rate of 720 MSPS using a commutator. By appropriate configuration of the multiplexers 316 and crossbar 318, an effective delay of either 0, 1, 2 or 3 times the data rate of 720 MSPS is created.

RF Transmit Up Converter

Figure 11:
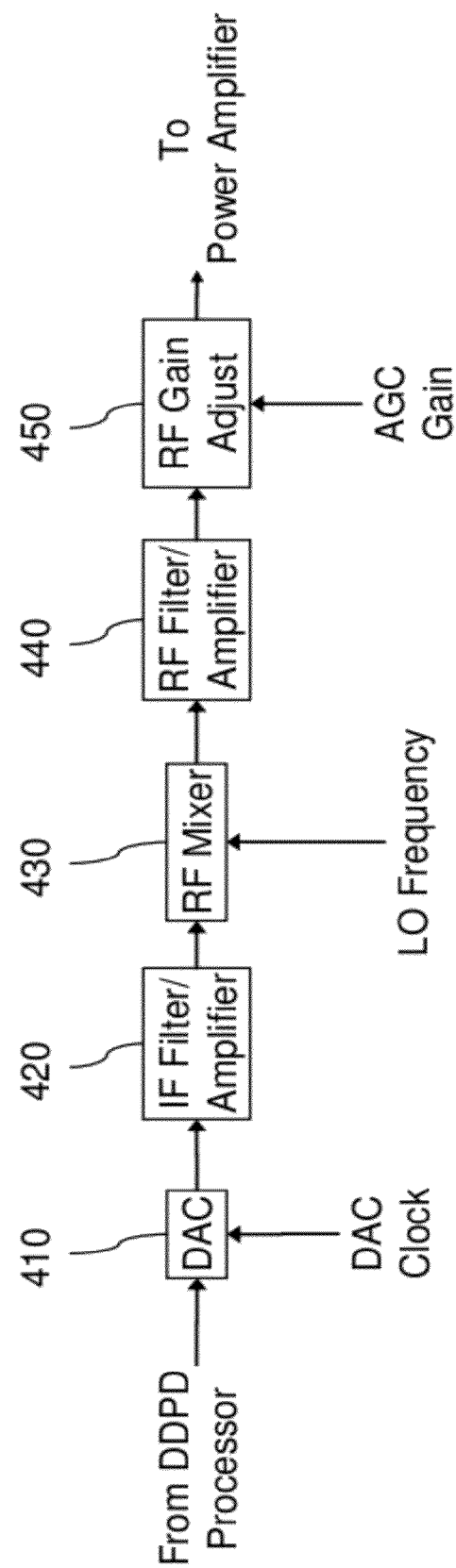
FIG. 11 illustrates exemplary components of the RF Transmit Up Converter block according to embodiments of the invention.

FIG. 11 illustrates exemplary components of the RF Transmit Up Converter block 400 according to embodiments of the invention. The purpose of this block is to convert the digital IF samples (assuming analog direct conversion is not done) of the upsampled and mixed DDPD Engine output into an RF signal at the desired power level for input into the PA. The IF digital samples are converted to an analog IF signal via a high speed DAC, and are then RF upconverted to produce the desired RF signal. This output signal is then amplified using a power amplifier as described in the PA block. DAC. The output of the DDPD is a predistorted digital signal which may have been digitally upsampled and upconverted before being sent to the DAC 410. This signal is converted to an analog IF signal using a high speed and high dynamic range DAC. To assure no saturation in data transmitted to the DAC, the Pre and Post DDPD scalers must be set such that the DAC RMS level is below full scale minus the maximum peak to average ratio of the input to the DAC (which includes the additional peaking created due to the DDPD Engine). There should be some margin in this setting to allow for unexpected peaks.

The DAC is operated at the input sample rate and must have an output noise floor lower than the required spectral mask emission specification. The required DAC noise density can be expressed as follows:

$$SNR_{DAC,dBFS/Bs} > MPAR_{TX,dB} + 10*\log 10(N_c) + CPL_{dB/Bs} + Margins_{SEM,dB} \quad (4.1)$$

where $SNR_{DA, dBFS/Bs}$ is the signal to noise ratio of the DAC (in dB/Bs), Bs is the carrier bandwidth, $MPAR_{TX,dB}$ is the projected maximum peak to average ratio of the transmit signal when transmitting at full peak power, $N_c$ is the number of carriers, $CPL_{dB/Bs}$ is the carrier power leakage ratio (in dB with respect to one carrier) and $Margins_{EM,dB}$ is the margin (dB) to assure that the DAC noise is low enough so that when added to all the other system noise, the combined noise meets the required SEM level.

IF Filter/Amplifier. The Transmit Upconverter 400 performs IF filtering in the IF Filter/Amplifier block 420 to remove the DAC clock noise and IF image. This filter must have low amplitude and phase distortion. The signal is the amplified to the desired level and then sent to the RF mixing block.

RF Mixer. Following the IF filter, the Transmit Upconverter 400 performs RF mixing of the IF signal to the desired frequency in the RF Mixing block 430. This RF mixing process must have low distortion (high IIP3) and low phase noise to minimize its effects on linearization and spectral emissions.

RF Filtering and Amplification. The RF filtering and Amplification block 440 performs RF filtering to reject the IF image. This filter must have low amplitude and phase distortion.

RF Gain Adjust. During operation, the TX/FB AGC may adjust the gain $g_2$ of the signal that is sent to the Power Amplifier in the Gain Adjustment block 450. The RF signal can be increased or decreased in concert with the Transmit Signal Gain, $g_1$, to maintain constant gain for the AGC loop. The output of the Gain Adjustment block goes to the Power Amplifier.

Power Amplifier System

Figure 12:
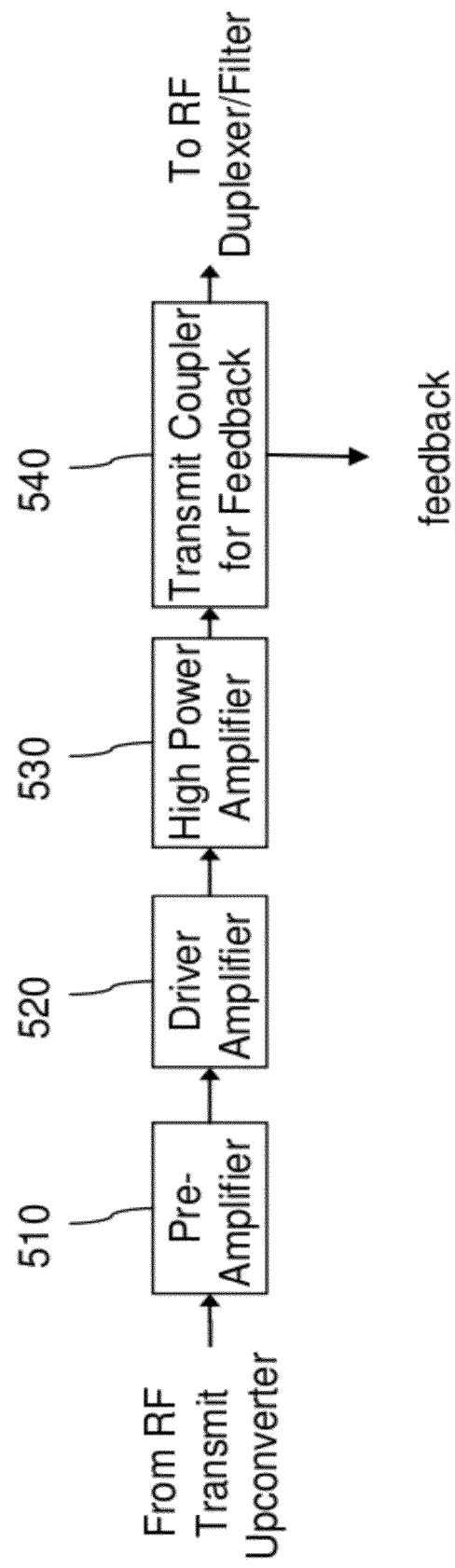
FIG. 12 illustrates an exemplary Power Amplifier system according to embodiments of the invention.

FIG. 12 illustrates an exemplary Power Amplifier system 500 according to embodiments of the invention. The signal at the output of the Transmit Upconverter is typically low power, and requires a very large gain, $G_{PA}$, to bring the signal to the desired transmit level. It is typical to divide the Power Amplifier into three or more amplifier stages to produce a large gain (although fewer stages are also possible):

$$G_{PA,dB} = G_{PA1,dB} + G_{PA2,dB} + G_{PA3,dB} \quad (5.1)$$

where $G_{PA1,dB}$, $G_{PA2,dB}$ and $G_{PA3,dB}$ are the gains of the Pre Amplifier, Drive Amplifier and High Power Amplifier, respectively.

Pre-Amplifier. Pre-Amplifier block 510 is a very linear PA with gain $G_{PA1,dB}$. It takes an ultra low input power signal and produces a low power level signal.

Driver Amplifier. Driver Amplifier block 520 is also a linear PA but with gain $G_{PA2,dB}$. It takes a low signal power level and produces an intermediate power level signal.

High Power Amplifier. To maximize the PA efficiency, this PA 530 can be a non-linear PA which can be Class AB or any configuration such that the conduction angle is set by the quiescent point. Alternatively a composite structure such as a Doherty PA can be used. A Doherty PA is composed of combination of a minimum of two active amplifying devices where the conduction angles of each are controlled separately. In common structures the main amplifier is set at class AB and the peaking (auxiliary) amplifier is set at class C. Other variations of Doherty configurations are also possible and applicable where the gates and drain voltages are controlled to enhance the efficiency and the linearity of the amplifier circuit. The efficiency improvement in a Doherty amplifier stems from operating the main amplifier in saturation in the PA back off region. The class C amplifier section will turn on at a higher level and hence the amplifier will remain in saturation region for a larger part of the signal dynamics. Amplifiers operated in saturation mode are highly efficient but the efficiency and linearity are mutually exclusive. Therefore, the Doherty amplifier and indeed any other high efficiency technique will lead to highly nonlinear behavior. Another approach to achieve high efficiency in the PA chain is a technique known as envelope tracking. Yet another technique is switching amplifiers that offer the highest efficiencies. These are class D, E, F, and hybrid combinations with the Doherty pair. The nature of non-linearity in an amplifier is threefold: Static nonlinearity, linear and non-linear dynamics otherwise known as memory effects. Since linear amplification is a system requirement, the main DDPD objective is to pre-distort the signal to cancel the distortion in order to produce a signal that has low distortion, high fidelity, and low CPL.

Transmit Coupler for Feedback. A signal splitting mechanism such as a directional coupler 540 is placed at the PA output which is used to tap off the PA output signal back to the feedback path for DDPD coefficient estimation and AGC control. The main path of the coupler goes to the Duplexer (if one is used).

RF Duplexer/Filter

The signal after the Transmit Coupler is sent to the RF Duplexer 600 in systems where both receive and transmit use the same antenna. The duplexer allows transmit and receive paths, which are in different frequency bands, to use the same antenna. It is a 3-port device with one bi-directional port, an input port and an output port. The input and output ports operate on different frequencies. The Duplexer includes filters to separate these frequencies, preventing crosstalk. Thus the Duplexer both acts as an RF filter which removes the out of band inter-modulation distortion so that this signal will not cause interference to spectrum, and also minimizes the noise to the Uplink Receiver that may be co-located with the Transmitter. In systems with separate antennas for transmit and receive, or TDD systems, no duplexer is required. Instead, a filter is used to increase out-of-band emissions.

RF Feedback

Figure 13:
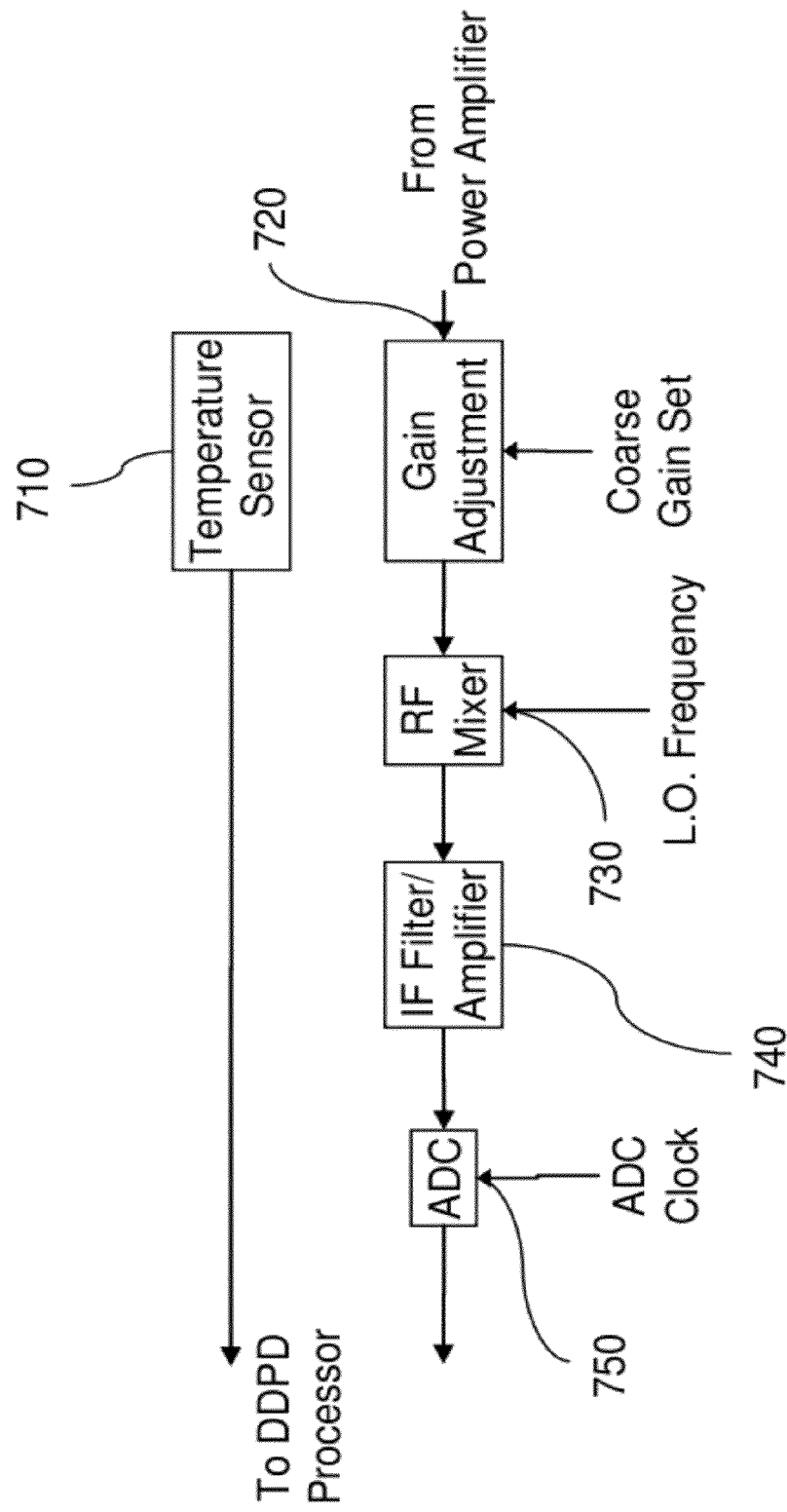
FIG. 13 illustrates an exemplary RF Feedback block according to embodiments of the invention.

FIG. 13 illustrates an exemplary RF Feedback block 700 according to embodiments of the invention. The purpose of this block is to downconvert and digitize the PA feedback signal. The TXPA output is first downconverted into an IF signal, and then converted into digital samples using an ADC.

RF Temperature Sensor. A temperature sensor 710 is placed at the vicinity of the PA and the RF Feedback Downconverter so that the PA characteristics can be monitored and maintained. The gain error of the Feedback Downconverter versus temperature should be characterized so that it can be corrected by the TX/FB AGC Processor. The temperature provides a digital signal that is sent to the TX/FB AGC Processor.

DC Gain Adjustment. The DC Gain Adjustment block $g_3$ 720 is used to ensure that the downconverted signal has sufficient dynamic range into the ADC. This gain can be controlled independently of the AGC loop which controls the output power.

RF Mixing. Following the Gain Adjustment, $g_3$, the Feedback Downconverter performs RF mixing 730 of the IF signal to the desired IF frequency. The IF frequency is preferably at $3R_{ADC}/4$ or $R_{ADC}/4$, where $R_{ADC}$ is the ADC sampling rate, so that the ADC can capture the signal digitally with maximum bandwidth. The L.O. reference for the feedback mixer is the same as the TX upconverter mixer so that the feedback signal is coherent with the transmit signal. Alternatively, quadrature downconversion can be employed. This RF mixing process must have low distortion (high IIP3) and low phase noise to minimize its effect on linearization.

IF Filtering and Amplification. The Amplification and IF filtering block 740 performs signal amplification and IF anti-aliasing filtering. This filter removes the out of band signal so that the output signal can be effectively captured with the ADC.

Feedback ADC. The output of the IF filter is an analog IF signal centered preferably at $3/4 R_{ADC}$. This signal is converted to a digital IF signal using a high speed and high dynamic range ADC 750. To assure no saturation on the ADC, the Gain Adjustment, $g_3$ is set such that the largest rms signal level into the ADC is at the desired level. This level is:

$$RMS_{ADC,dB} = ADC_{full\_scale} - MPAR_{SIG,dB} - Margin_{ADC,dB} \quad (7.1)$$

where $MPAR_{SIG,dB}$ is the maximum peak to average ratio of the signal into the ADC and $Margin_{ADC,dB}$ is the extra margin to account for unexpected signal increases or temperature effects. The ADC must have a noise floor so that the digitized signal has sufficient resolution accuracy for the later Coefficient Estimation computation.

Digital Feedback Processor

Figure 14:
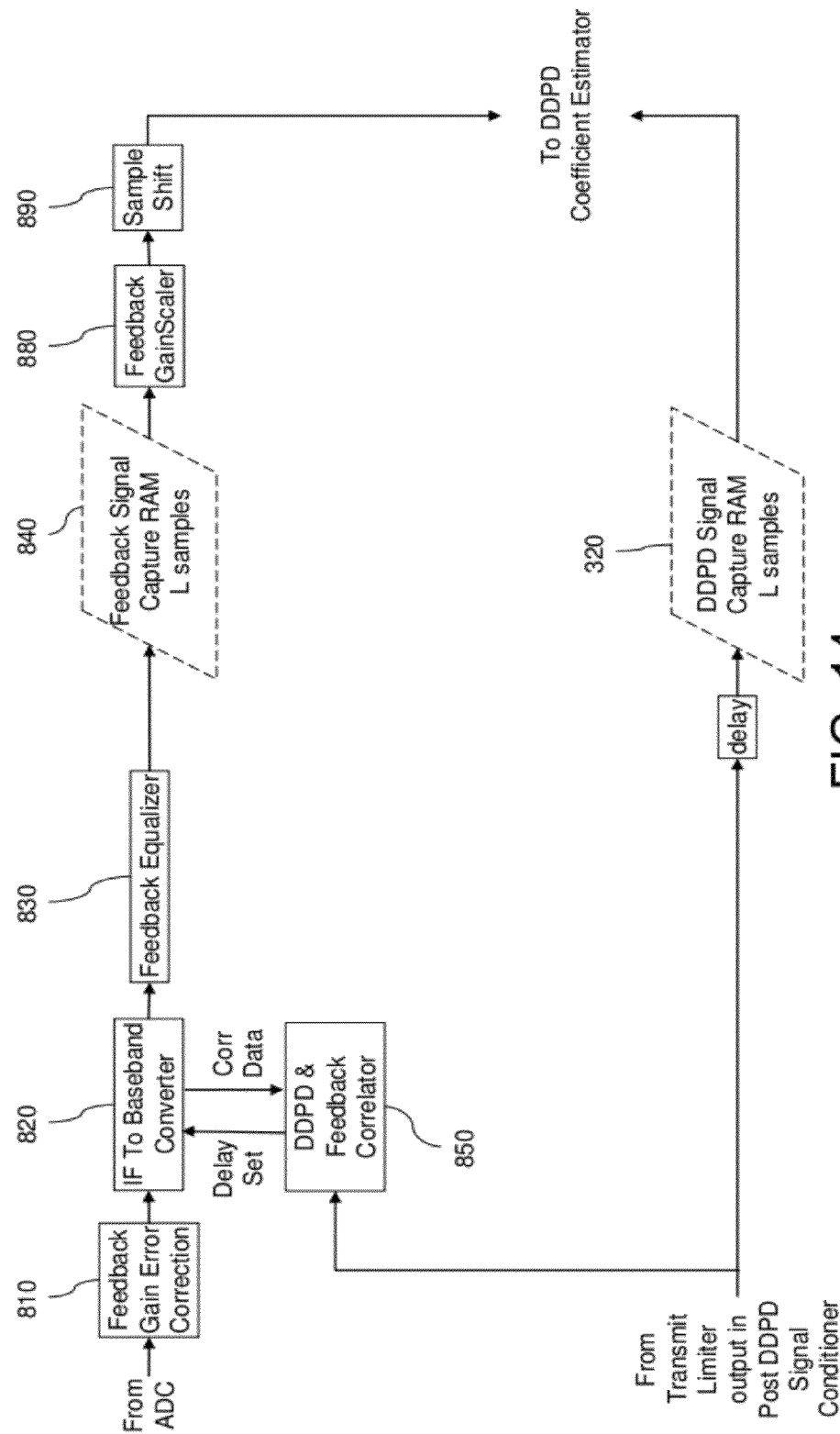
FIG. 14 illustrates an exemplary digital feedback processor according to embodiments of the invention.

FIG. 14 illustrates an exemplary digital feedback processor 800 according to embodiments of the invention. The purpose of this block is to compute the coefficients of the inverse filter of the Transmit & PA block so that the difference between the digitized baseband version of the PA output, $z[n]$, and the input to the DDPD Engine, $x[n]$, is minimized. The input to FIG. 14 is from the ADC in the RF feedback block 700. As shown in FIG. 14, this block first implements an optional Feedback Gain Error Corrector 810 to correct for the downconverter gain error (can be done in AGC algorithm instead).

Next, the signal passes through the IF To Baseband (IF-TBB) Converter 820 which converts the digital IF signal to a baseband IQ signal. This signal is passed through a Feedback compensation filter to equalize the RF downconverter filtering imperfections. The signal is then upsampled to a rate suitable for correlation. The DDPD/FB Correlator 850 captures both transmit data and the upsampled feedback data and performs signal correlation to align the baseband feedback with the baseband DDPD Engine output signal. This upsampled feedback signal is then downsampled with the phase selected by the correlation processor.

The signals captured in the capture RAMs 840 and 320 are used for DDPD Coefficient computation and can be used for AGC (or can use real-time level estimators). Note that instead of using the capture RAMs 840 and 320, real-time level estimators that estimate the level of the signals may be used for AGC.

It is desirable to maintain the gain through the DDPD engine constant and preferably at unity. The Feedback Gain Scaler 880 is used to adjust the signal level of the feedback to the same, or some other fixed level relative to the transmit signal. The adjustment comes from the AGC Processor which uses power estimates (or similar estimates) of the signal to determine the scale factor. Finally, to optimize the DDPD coefficient solution, the feedback samples are delayed in Sample Shift block 890 to place the DDPD filter coefficients to the optimum position.

Feedback Gain Error Corrector. The gain of the RF Feedback downconverter may change over temperature. This change needs to be corrected to assure proper AGC computation. The Feedback Gain Error Corrector 810 performs the gain error correction, $g_4$, that is provided by the TX/FB AGC Processor.

Figure 15:
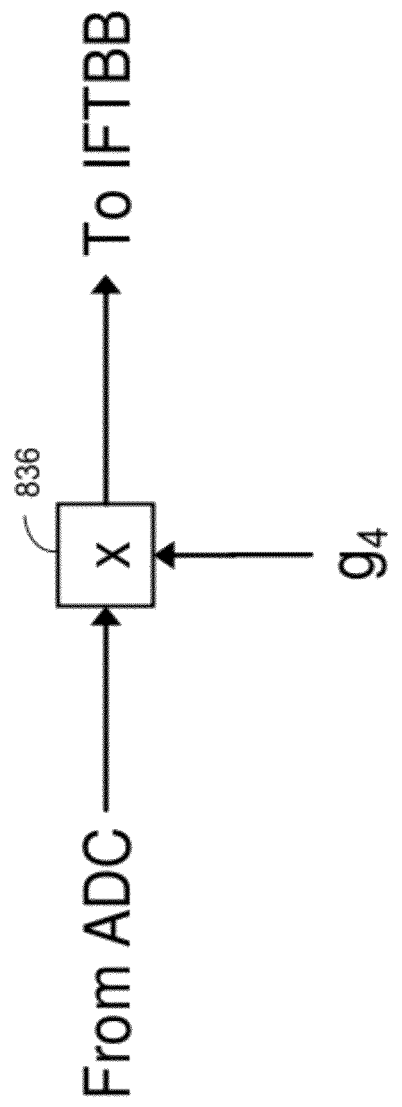
FIG. 15 illustrates that g4 is applied to maintain constant Feedback Gain according to embodiments of the invention.

FIG. 15 illustrates that $g_4$ is applied at multiplier 836 to maintain constant Feedback Gain according to embodiments of the invention. It is noted that the feedback gain error corrector 810 is optional, and can be applied at any later stage of processing or even in software as long as the feedback gain error is accounted for in AGC computations.

IF To Baseband Converter. The objective of the IF To Baseband Converter (IFTBB) 820 is to convert the ADC signal into a resampled baseband signal that is aligned with the transmit signal. In particular, block 820 performs mixing to baseband, filtering, re-sampling, and introduces delay so that the feedback signal closely matches the timing of the transmit signal.

Figure 16:
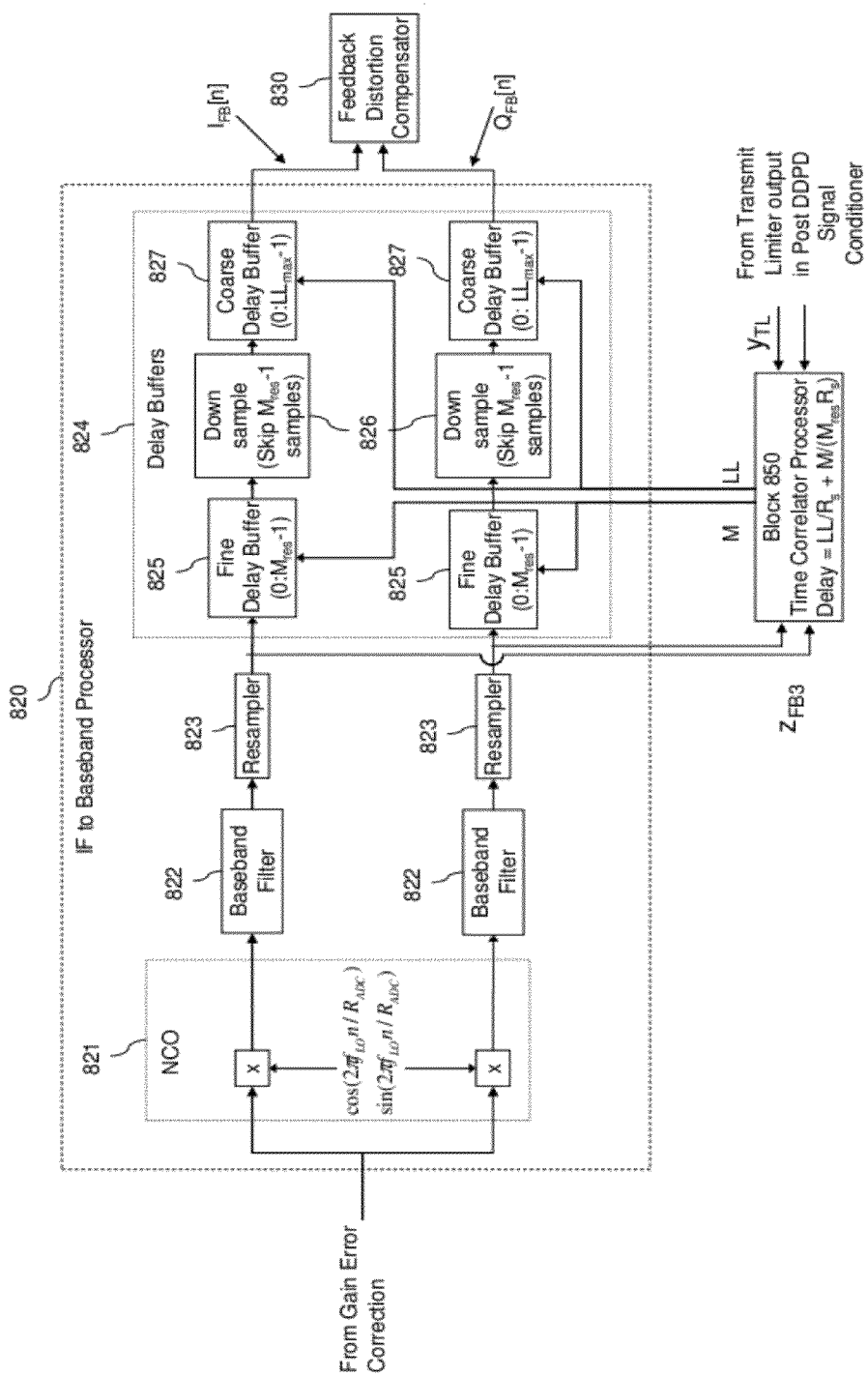
FIG. 16 illustrates an exemplary IFTBB processor that converts the IF signal to a resampled baseband signal according to embodiments of the invention.

FIG. 16 illustrates an exemplary IFTBB processor 820 that converts the IF signal to a resampled baseband signal according to embodiments of the invention. As shown inside the dotted line of FIG. 16, this processor may be implemented in hardware that has four main blocks: the NCO (numerically controlled oscillator) 821, baseband filter 822, resampler 823, and signal delay 824. The design also includes the Delay Buffers that are used to align the baseband feedback signal with the transmit signal.

NCO. The NCO 821 mixes the ADC signal $y_{ADC}[n]$ with digital LO signal $e^{j2\pi f_{LO}n/R_{ADC}} = \cos(2\pi f_{LO}n/R_{ADC}) + j\sin(2\pi f_{LO}n/R_{ADC})$ to produce the in-phase component $I_{FB1}[n]$ and quadrature component $Q_{FB1}[n]$. Thus, $$I_{FB1}[n] = y_{ADC}[n]\cos(2\pi f_{LO}n/R_{ADC}) \quad (8.1)$$

$$Q_{FB1}[n] = y_{ADC}[n]\sin(2\pi f_{LO}n/R_{ADC}) \quad (8.2)$$

If the NCO frequency $f_{LO}/R_{ADC}$ is $-R_{ADC}/4$, then $\cos(2\pi f_{LO}n/R_{ADC})$ and $\sin(2\pi f_{LO}n/R_{ADC})$ have the values of $-1\ 0\ 1\ 0\ -1$, and the multipliers in equations (8.1) and (8.2) are simplified.

Baseband Filters. The signals, $I_{FB1}[n]$ and $Q_{FB1}[n]$, are then low pass filtered in baseband filters 822 to reject the signal image:

$$I_{FB2}[n] = LPF(I_{FB1}[n]) \quad (8.3)$$

$$Q_{FB2}[n] = LPF(Q_{FB1}[n]) \quad (8.4)$$

This filter should be designed to reject the image down to below the ADC noise floor.

Resampler.

The signals, $I_{FB2}[n]$ and $Q_{FB2}[n]$, have a sampling rate of $R_{ADC}$. In order to do the weight computation, the feedback data sample rate must be the same as the transmit data sample rate, $R_s$. Let $M_{res}/N_{res}$ be the ratio of $R_{ADC}/R_s$ where $M_{res}$ and $N_{res}$ are integers. $I_{FB2}[n]$ and $Q_{FB2}[n]$ can be upsampled by a factor of $N_{res}$ and later downsampled by a factor of $M_{res}$. The upsampling in sampler 823 can be done by any method known to a skilled practitioner in the art. The upsampled signals are $I_{FB3}[n]$ and $Q_{FB3}[n]$. Finally, downsampling is straightforward (take one of every $M_{res}$ samples) resulting in the signals $I_{FB4}[n]$ and $Q_{FB4}[n]$ having the sampling rate of $R_s$.

Delay Buffers. Two Delay Buffers 824 are used to facilitate signal alignment between the IFTBB signal, $z_{FB3}[n] = I_{FB3}[n] + j Q_{FB3}[n]$, and the Transmit Limiter output, $y_{TL}[n] = I_{TL}[n] + j Q_{TL}[n]$. As shown in FIG. 16, Delay Buffer #1 is a fine delay with $M_{res}$ tap delay register located before the down sampling. This delay buffer facilitates fine time shifting by choosing the phase of the downsampler. It has resolution $1/M_{res}R_s$. Delay Buffer #2 is a coarse delay with $LL_{max}$ tap delay line that facilitates coarse time sample shifting with resolution $1/R_s$.

Note that the ADC data is delayed with respect to the DDPD data since it must be transmitted and then fed back. In order to simplify the explanation of the invention, a fixed delay which is larger than necessary is applied to the DDPD data. This is why a delay of the ADC data is required. In practice, the $1/R_s$ variable delay can be applied only to the DDPD data.

Feedback Distortion Compensator (Equalizer). The Feedback Equalizer 830 is used to compensate amplitude and other distortion of the analog feedback components. This section covers both the filter used and a process of determining the filter. Block 830 is similar to the equalizer on the transmit side to compensate for known tilts, phase changes, and the like.

Feedback Signal Capture RAM. The output of the IFTBB block is a baseband version of the PA signal. The signal is delayed by $N_{FBdelay}$ samples, and L samples of this complex signal are captured in the Feedback Signal Capture RAM 840 to be used in the TX/FB AGC Processor and DDPD Coefficient Estimator. The AGC processor can use a real-time level estimator instead of the data capture. If the later discussed A and B matrix computation takes place at the data rate speed, no data capture is required. The data goes straight into the weight computation engine.

DDPD/FB Correlator. In the DDPD system, the transmitted data and the feedback data are supposed to look the same.

However, in reality the feedback data experiences time delay as it passes through a digital filter, the PA, and back into a capture RAM. Because of this delay, the transmit and feedback data must be time-aligned (correlated).

To time-align the transmit and feedback data, a process referred to as correlation is performed in which particular delays are applied to the I and Q samples of the transmit and feedback paths, and an evaluation is performed to determine which delays cause the signals to line up. To determine if the signals line up for a given delay, a complex multiplication of the conjugate of the transmit signal samples X(n)* with the feedback signal samples Y(n) is performed, and the results are summed up. The correlation will be greatest at the delay that produces the largest result. To identify this delay, the transmit or feedback signal can be delayed by various amounts or swept over the full range of possible delays, and the delay at which the maximum correlation was found can be identified. This process is typically done only once at startup, although in other embodiments it could be done more than once, during operation.

Figure 17:
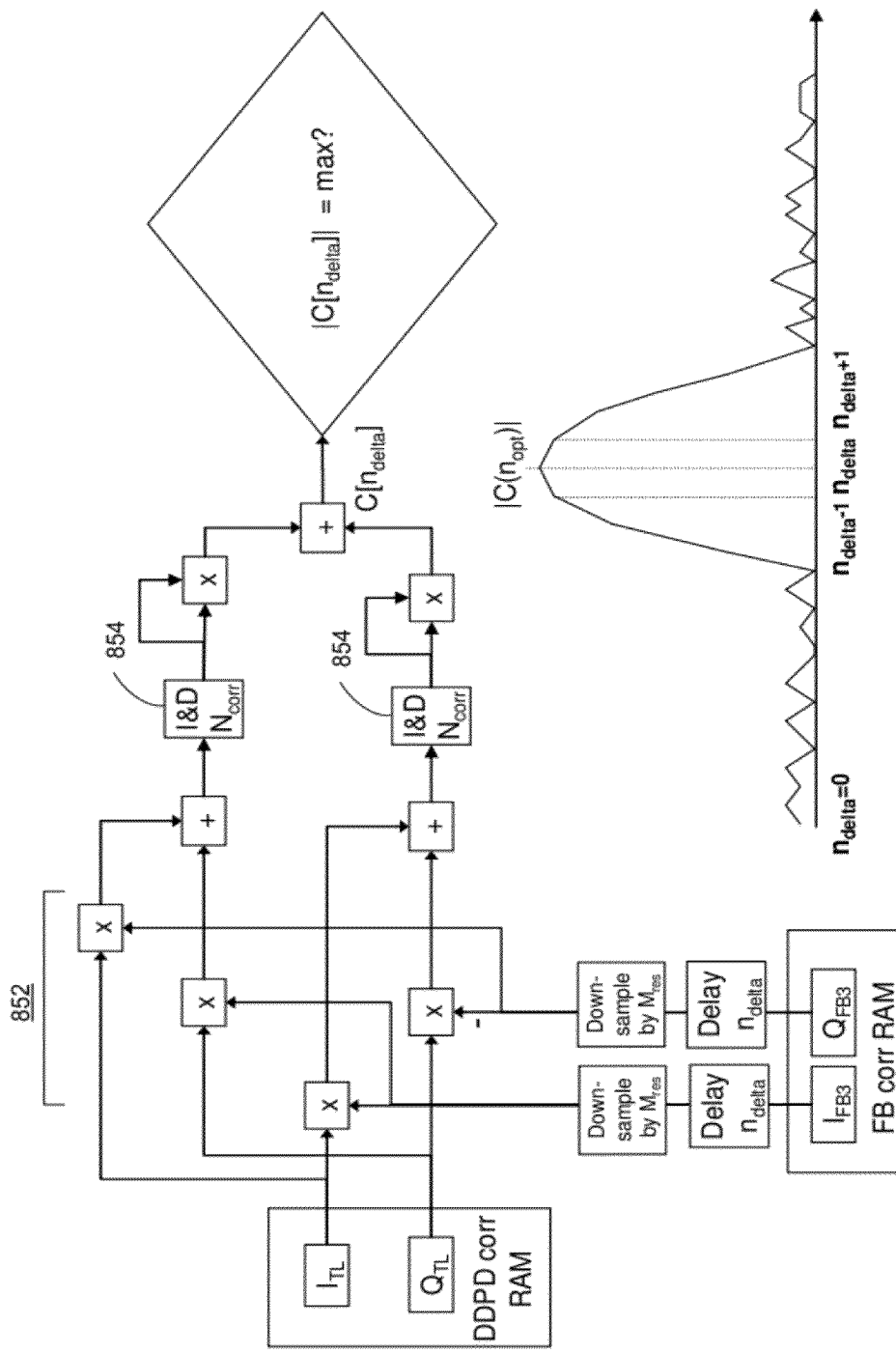
FIG. 17 illustrates an exemplary DDPD/FB Correlator according to embodiments of the invention.

FIG. 17 illustrates an exemplary DDPD/FB Correlator 850 according to embodiments of the invention. The objective of the DDPD/FB Correlator 850 is to align the captured transmit signal and the captured IFTBB signal to less than $0.5/M_{res}R_s$. The captures that are aligned are the coefficient estimator RAMs, not the correlation RAMs. The correlation RAMs are used to find the necessary time alignment settings. FIG. 17 shows a possible implementation of this correlator representing a portion of a correlation processor. The delay time steps over a range $\tau=0, 1, 2, 3, 4, \ldots, N_{max}$ where $[0 \ldots N_{max}/(M_{res}R_s)]$ is the maximum range of expected time difference. The processor decomposes the optimum delay, $n_{opt}$, as:

$$M = \text{modulo}(n_{opt}, M_{res}) \quad (8.10)$$

$$LL = \text{floor}((n_{opt}/M_{res}) \quad (8.11)$$

where floor(x) rounds the elements of x to the nearest integers towards minus infinity. For example if $M_{res}=4$, $n_{opt}=18$, we would have M=2, and LL=4. The actual delay in time would be $18/(4R_s)$. The shifts LL and M are then applied at the Feedback Fine and Coarse Delay Buffers, respectively.

At any delay, $n_{delta}$, the correlation value is computed by performing the complex multiplication of the ddpd and adc inputs to the correlator, $y_{TL}[n]$ and $z_{FB3}[n]$ respectively:

$$C[n_{delta}] = \sum_{n=0}^{N_{corr}-1} y_{TL}[n] \cdot z'_{FB3}(M_{res} * (n + n_{delta})) \quad (8.12)$$

$$= \sum_{n=0}^{N_{corr}-1} [I_{TL}[n] + jQ_{TL}[n]] \cdot$$

$$[I_{FB3}(M_{res} * (n + n_{delta})) - jQ_{FB3}(M_{res} * (n + n_{delta}))]$$

$$= \sum_{n=0}^{N_{corr}-1} I_{TL}[n]I_{FB3n}(M_{res} * (n + n_{delta})) +$$

$$Q_{TL}[n]Q_{FB3}(M_{res} * (n + n_{delta})) +$$

$$j\{I_{FB3}(M_{res} * (n + n_{delta}))Q_{TL}[n] -$$

$$Q_{FB3}(M_{res} * (n + n_{delta}))I_{TL}[n]\}$$

The $n_{delta}$ which maximizes $|C[n_{delta}]|$ is the optimum delay, $n_{opt}$. This process aligns the samples $z[n]=I_{FB3}[n]+j Q_{FB3}[n]$ with DDPD signal $y[n]=I_{TL}[n]+j Q_{TL}[n]$ to within 0.5/$(M_{res}R_s)$. The actual delays used in an implementation may vary from these to account for latencies in the design.

Note that the complex multiplications are shown at 852, and the summations are shown as I&D $N_{corr}$ blocks 854. Because this process may only need to be performed once, the multipliers in FIG. 17 may be time-shared and reused for other functions in a quasi-hardware implementation. Note that correlation of the transmit and feedback data is also described in U.S. patent application Ser. No. 11/150,445 entitled "Digital Pre-Distortion Technique Using Nonlinear Filters."

TX/FB AGC Processor. In order for the DDPD system to work effectively, the gain of the system from digital input to TX output must be monitored and adjusted to keep the gain constant. This can be done in many ways but for the best mode, the gain adjustments should come after the DDPD engine and must be small changes (usually less than 0.05 dB steps) that occur periodically. In one embodiment, a TX/FB AGC Processor 860 monitors the gain and keeps it constant. Optimally at least ten DDPD Coefficient updates have occurred between changes in order to keep a good linearization solution as the gain is changed.

The objective of the TX/FB AGC Processor 860 is to maintain the output of the PA at the correct level. In practice, the gain of the transmit RF upconverter, downconverter, and the PA will be changing over temperature. When this occurs, the power level at the output of the PA may no longer be accurate to within an acceptable level. Thus, AGC is required to maintain to the correct PA output level.

Feedback Gain Scaler. The purpose for the feedback gain scaler block 880 is to adjust the signal amplitude at the Feedback path to be the same (or a known ratio) as the transmit path so that the DDPD coefficients will produce a known gain. This scaler will be updated based on the average power levels of the captured data. This scaling can also be done at the end of the computation and applied to the weights. Scaling the weights requires more complexity however. This scalar can also be implemented before the data capture.

Sample Shift. Shifting the time aligned ADC data with respect to the DDPD data in Sample Shift block 890 has the effect of shifting the location of the dominant weight. The distribution of the coefficient set W impacts the accuracy of the DDPD engine. In order to optimize the predistortion solution, it is necessary to place the coefficient distribution most optimally by experimentally changing the delay, d, from 0 to $q_1-1$, where $q_1$ is the length of fundamental filter. By checking the performance of the system for each delay, the optimal setting is obtained. For ease of notation, the output of the Sample Shift is still expressed as $z[n]=\text{delay}\{z[n]\}$. This Sample Shift can also be implemented before the data capture.

DDPD Coefficient Estimator

Figure 18:
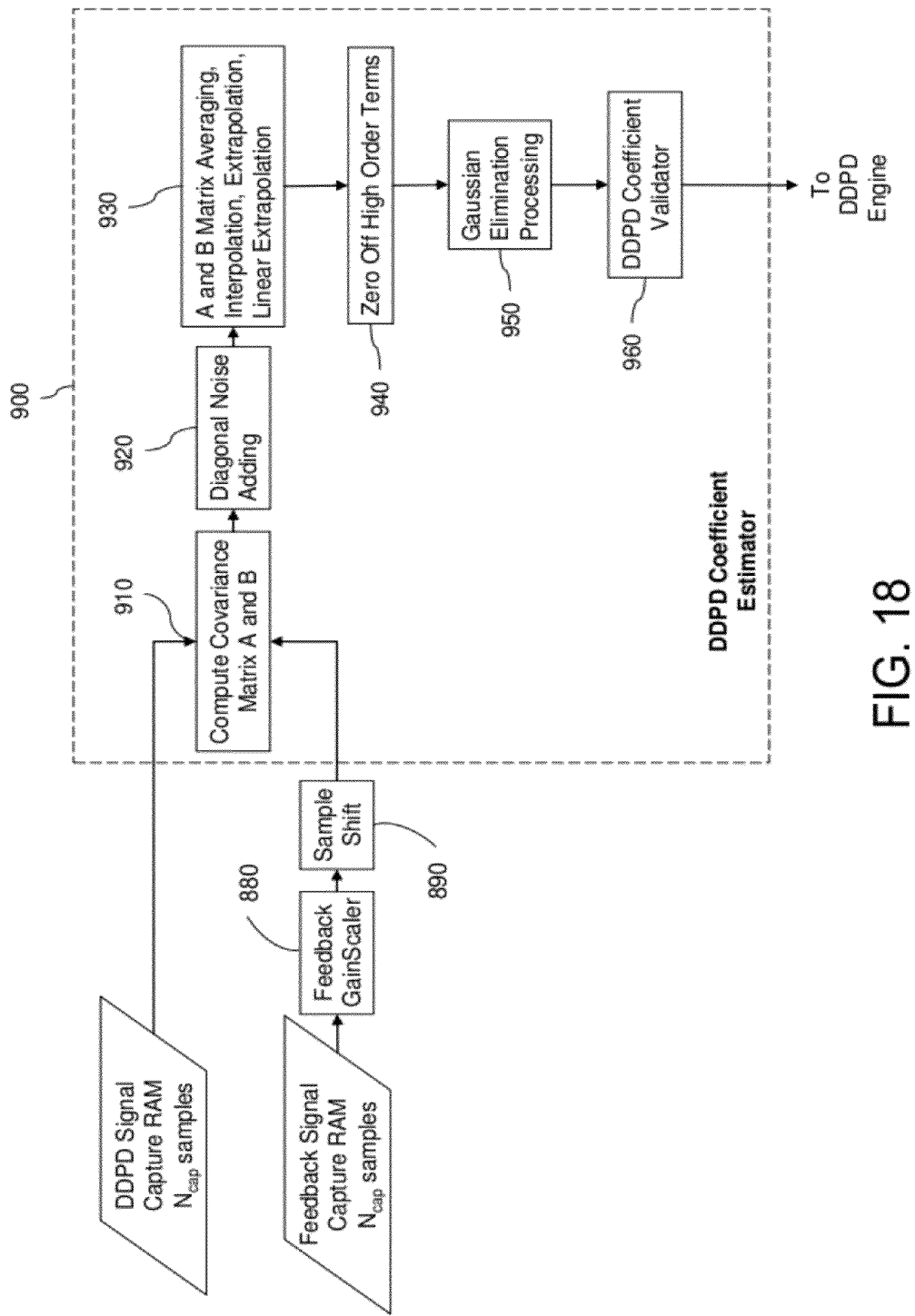
FIG. 18 illustrates an exemplary DDPD Coefficient Estimator according to embodiments of the invention.

FIG. 18 illustrates an exemplary DDPD Coefficient Estimator 900 according to embodiments of the invention. The objective of the DDPD Coefficient Estimator block 900 is to compute a set of DDPD Engine coefficients, W, used to predistort the transmit signal.

$$W = [w_{11}, w_{12}, \ldots, W_{1,q1}, w_{21}, w_{22}, \ldots, W_{2,q2}, w_{N,1}, w_{N,2}, \ldots, W_{N,qN}]. \quad (9.1)$$

The baseband version, z[n], of the output of the power amplifier (PA) can be expressed as:

$$z[n] = \text{PA}(y[n]) = \text{PA}(\text{DDPD}(x[n])) \quad (9.2)$$

where y[n] and z[n] are the baseband version of the input and the output of the power amplifier, respectively, x[n] is the input to the DDPD Engine, and PA( ) is the unity gain baseband equivalent of the PA. If the DDPD acts like the inverse of PA, we expect to have z[n]~x[n]. Thus from Equation (9.2), we have $$PA(y[n])=PA(DDPD(z[n])) \tag{9.3}$$

$$y[n]=DDPD(z[n]) \tag{9.4}$$

We have y[n] and z[n] in the data capture RAMs minus their post processing so writing this equation $$y[n] = w_{11}z[n] + w_{12}z[n-1] + \ldots + w_{1,d}z[n-d+1] + \text{out}, \tag{9.5}$$

$$z[n] \begin{pmatrix} w_{1,21}b^{k_{12}-1}[n-\lambda_{12}] + w_{1,22}b^{k_{12}-1}[n-\lambda_{12}-1] + \ldots + \\ w_{1,2q_{12}}b^{k_{12}-1}[n-\lambda_{12}-q_{12}+1] + \\ w_{1,31}b^{k_{13}-1}[n-\lambda_{13}] + w_{1,32}b^{k_{13}-1}[n-\lambda_{13}-1] + \ldots + \\ w_{1,3q_{13}}b^{k_{13}-1}[n-\lambda_{13}-q_{13}+1] + \\ \ldots \\ w_{1,N_1 1}b^{k_{1N_1}-1}[n-\lambda_{1N_1}] + w_{1,N_1 2}b^{k_{1N_1}-1}[n-\lambda_{1N_1}-1] + \\ \ldots + w_{1,N_1 q_{1N_1}}b^{k_{1N_1}-1}[n-\lambda_{1N_1}-q_{1N_1}+1] \end{pmatrix} +$$

$$\ldots z[n-r] \begin{pmatrix} w_{r,21}b^{k_{r2}-1}[n-\lambda_{r2}] + w_{r,22}b^{k_{r2}-1}[n-\lambda_{r2}-1] + \ldots + \\ w_{r,2q_{r2}}b^{k_{r2}-1}[n-\lambda_{r2}-q_{r2}+1] + \\ w_{r,31}b^{k_{r3}-1}[n-\lambda_{r3}] + w_{r,32}b^{k_{r3}-1}[n-\lambda_{r3}-1] + \ldots + \\ w_{r,3q_{r3}}b^{k_{r3}-1}[n-\lambda_{r3}-q_{r3}+1] + \\ \ldots \\ w_{r,N_r 1}b^{k_{rN_r}-1}[n-\lambda_{rN_r}] + w_{r,N_r 2}b^{k_{rN_r}-1}[n-\lambda_{rN_r}-1] + \\ \ldots + w_{r,N_r q_{rN_r}}b^{k_{rN_r}-1}[n-\lambda_{rN_r}-q_{rN_r}+1] \end{pmatrix} +$$

$$\ldots z[n-d] \begin{pmatrix} w_{d,21}b^{k_{d2}-1}[n-\lambda_{d2}] + w_{d,22}b^{k_{d2}-1}[n-\lambda_{d2}-1] + \ldots + \\ w_{d,2q_{d2}}b^{k_{d2}-1}[n-\lambda_{d2}-q_{d2}+1] + \\ w_{d,31}b^{k_{d3}-1}[n-\lambda_{d3}] + w_{d,32}b^{k_{d3}-1}[n-\lambda_{d3}-1] + \ldots + \\ w_{d,3q_{d3}}b^{k_{d3}-1}[n-\lambda_{d3}-q_{d3}+1] + \\ \ldots \\ w_{d,N_d 1}b^{k_{dN_d}-1}[n-\lambda_{dN_d}] + w_{d,N_d 2}b^{k_{dN_d}-1}[n-\lambda_{dN_d}-1] + \\ \ldots + w_{d,N_d q_{dN_d}}b^{k_{dN_d}-1}[n-\lambda_{dN_d}-q_{dN_d}+1] \end{pmatrix}$$

where $b[n]=|z[n]|$ and the operator, $|x|$ means $\sqrt{(\text{real}(x))^2+(\text{imag}(x))^2}$. In order to solve equation (9.5) to produce the DDPD coefficient set, W, the DDPD Coefficient Estimator processor uses the steps shown inside the dotted box in FIG. 18.

Note that in FIG. 18, the DDPD Signal Capture RAM samples and the Feedback Signal Capture RAM samples are after they have been time-aligned as described above. The Feedback Gain Scaler 880 and Sample Shift 890 are described above.

Compute Covariance Matrix A and B. The purpose of the Compute Covariance Matrix block 910 is to compute covariance matrices A and B, which are needed to compute the weights W needed by the DDPD engine in its computation of a predistorted transmit signal.

From Equation (9.5), we have:

$$\begin{bmatrix} v_1 \\ v_2 \\ \ldots \\ v_d \\ v_{d+1} \\ v_{d+2} \\ \ldots \\ v_{d+q_{12}} \\ \ldots \\ v_{d+q_{12}+q_{13}+\ldots+q_{1N_1}} \\ \ldots \\ v_{d+q_{12}+q_{13}+\ldots+q_{1N_1}+\ldots+q_{rN_r}} \\ \ldots \\ v_{d+q_{12}+q_{13}+\ldots+q_{1N_1}+q_{22}+\ldots+q_{rN_r}+q_{(r+1)2}+\ldots+q_{dN_d}} \end{bmatrix} = \begin{bmatrix} w_{11} \\ w_{12} \\ \ldots \\ w_{1d} \\ w_{1,21} \\ w_{1,22} \\ \ldots \\ w_{1,2q_{12}} \\ \ldots \\ w_{1,N_{q_{1N_1}}} \\ \ldots \\ w_{r,N_{q_{rN_r}}} \\ \ldots \\ w_{d,N_{q_{dN_d}}} \end{bmatrix}^T .$$

There are M elements in this vector, $M=q_1+q_{1N}+q_{2N}\ldots+q_{dN}$.

$$K_{L \times M} = \begin{bmatrix} c_1[n] \\ c_2[n] \\ \ldots \\ c_d[n] \\ c_{d+1}[n] \\ c_{d+2}[n] \\ \ldots \\ c_{d+q_{12}}[n] \\ \ldots \\ c_{d+q_{12}+q_{13}+\ldots+q_{1N_1}}[n] \\ \ldots \\ c_{d+q_{12}+q_{13}+\ldots+q_{1N_1}+\ldots+q_{rN_r}}[n] \\ \ldots \\ c_{d+q_{12}+q_{13}+\ldots+q_{1N_1}+q_{22}+\ldots+q_{rN_r}+q_{(r+1)2}+\ldots+q_{dN_d}}[n] \end{bmatrix} =$$

$$\begin{bmatrix} z[n] \\ z[n-1] \\ \ldots \\ z[n-d+1] \\ z[n]b^{k_{12}-1}[n-\lambda_1] \\ z[n]b^{k_{12}-1}[n-\lambda_1-1] \\ \ldots \\ z[n]b^{k_{12}-1}[n-\lambda_1-q_{12}+1] \\ \ldots \\ z[n]b^{k_{1N_1}-1}[n-\lambda_1-q_{1N_1}+1] \\ \ldots \\ z[n]b^{k_{rN_r}-1}[n-\lambda_r-q_{rN_r}+1] \\ \ldots \\ z[n]b^{k_{dN_d}-1}[n-\lambda_d-q_{dN_d}+1] \end{bmatrix}^T$$

More general is:

$$K_{L\times M} = \begin{bmatrix} c_1[n] \\ c_2[n] \\ \vdots \\ c_d[n] \\ c_{d+1}[n] \\ c_{d+2}[n] \\ \vdots \\ c_{d+q_{12}}[n] \\ \vdots \\ c_{d+q_{12}+q_{13}+\ldots+q_{1N_1}}[n] \\ \vdots \\ c_{d+q_{12}+q_{13}+\ldots+q_{1N_1}+\ldots+q_{rN_r}}[n] \\ \vdots \\ c_{d+q_{12}+q_{13}+\ldots+q_{1N_1}+q_{22}+\ldots+q_{rN_r}+q_{(r+1)2}+\ldots+q_{dN_d}}[n] \end{bmatrix} = \quad (9.8)$$

$$\begin{bmatrix} z[n] \\ z[n-1] \\ \vdots \\ z[n-d+1] \\ z[n]b^{k_{12}-1}[n-\lambda_{12}] \\ z[n]b^{k_{12}-1}[n-\lambda_{12}-1] \\ \vdots \\ z[n]b^{k_{12}-1}[n-\lambda_{12}-q_{12}+1] \\ \vdots \\ z[n]b^{k_{1N_1}-1}[n-\lambda_{1N_1}-q_{1N_1}+1] \\ \vdots \\ z[n]b^{k_{rN_r}-1}[n-\lambda_{rN_r}-q_{rN_r}+1] \\ \vdots \\ z[n]b^{k_{dN_d}-1}[n-\lambda_{dN_d}-q_{dN_d}+1] \end{bmatrix}^T$$

where $n = [1\ 2\ \ldots\ L]^T$, and L is the number of samples that is used to compute the DDPD linearization coefficients.

The DDPD Engine weight solution is based on the equation KW=Y, where K is a function of the input (the FB capture), Y is the output (the transmit capture), and W are the weights needed to modify K so that it equals Y. Because K and Y are captured and known, the weights W should be capable of being determined. Therefore, in matrix form, $$K_{L\times M} W_{M\times 1} = Y_{L\times 1} \qquad (9.12)$$

where $Y_{L\times 1} = y[n]$, and $K_{L\times M}$ is defined as:

$$K_{L\times M} = \begin{bmatrix} k_1[n] \\ k_2[n] \\ \vdots \\ k_{q_2}[n] \\ k_{q_2+1}[n] \\ k_{q_2+2}[n] \\ \vdots \\ k_{q_2+q_3}[n] \\ \vdots \\ k_{q_2+q_3+\ldots+q_{N-1}+1}[n] \\ k_{q_2+q_3+\ldots+q_{N-1}+2}[n] \\ \vdots \\ k_{q_2+q_3+\ldots+q_{N-1}+q_N}[n] \\ k_{q_2+q_3+\ldots+q_{N-1}+q_N+1}[n] \\ k_{q_2+q_3+\ldots+q_{N-1}+q_N+2}[n] \\ k_{q_2+q_3+\ldots+q_{N-1}+q_N+3}[n] \\ k_{q_2+q_3+\ldots+q_{N-1}+q_N+4}[n] \\ \vdots \\ k_{q_2+q_3+\ldots+q_{N-1}+q_N+q_1}[n] \end{bmatrix} = \quad (9.13)$$

$$\begin{bmatrix} \lambda[n]c_1[n] \\ \lambda[n]c_2[n] \\ \vdots \\ \lambda[n]c_{q_2}[n] \\ \lambda[n]c_{q_2+1}[n] \\ \lambda[n]c_{q_2+2}[n] \\ \vdots \\ \lambda[n]c_{q_2+q_3}[n] \\ \vdots \\ \lambda[n]c_{q_2+q_3+\ldots+q_{N-1}+1}[n] \\ \lambda[n]c_{q_2+q_3+\ldots+q_{N-1}+2}[n] \\ \vdots \\ \lambda[n]c_{q_2+q_3+\ldots+q_{N-1}+q_N}[n] \\ \lambda[n] \\ d_1[n] \\ d_2[n] \\ d_3[n] \\ \vdots \\ d_{q_1-1}[n] \end{bmatrix} ; n = [1\ 2\ \ldots\ L]^T$$

However, the equation KW=Y actually represents an overdetermined system of equations, where there are more equations than unknowns, so there are many solutions to the equations. For example, if K is a 8000×15 matrix, Y is a 8000×1 matrix, and W is a 15×1 matrix, there are 8000 equations but only 15 unknowns. There is actually no solution that solves all equations exactly, the best that can be hoped for is a solution that comes closest to solving all of the equations with the least error.

One well-known technique to dealing with an overdetermined system of equations of the general form AW=B is to find the A and B which reduces the mean squared error. In other words, find A and B so that when the difference between the left side squared (A^2) minus the right side squared (B^2) is computed for each equation and summed for all equations, the smallest possible number is obtained.

In the present application, KW=Y can be transformed into the form AW=B by setting A=(K*)$^T$K (A equals K conjugated and transposed times K) and B=(K*)$^T$Y, where A and B are covariance matrices. Continuing the example above, after this transformation A is now a 15×15 matrix, and B is now a 15×1 matrix, so now we have 15 equations and 15 unknowns, and AW=B can be solved.

Thus, after multiplying both sides of equation (9.12) by $K_{L \times M}^{H}$, equation (9.12) can be expressed in terms of the "normal" equation, $$A_{M \times M} W_{M \times 1} = B_{M \times 1} \quad (9.14)$$

where $$A_{M \times M} = K_{L \times M}^{H} K_{L \times M} \quad (9.15)$$

$$B_{M \times 1} = K_{L \times M}^{H} Y_{L \times 1} \quad (9.16)$$

and ( )$^H$ is the hermitian operator.

Diagonal Noise Adding. Upon completion of the Compute Covariance Matrix A and B block 910, the A and B matrices have been computed. For example, A may be a 15×15 matrix. However, in some instances, every equation in the system of equations represented by A may be almost the same as every other equation. The more alike the equations are, the more "singular" the matrix. It is preferred that matrix A not be too singular; otherwise, when attempting to solve the system of equations, no good solution may be computed.

To stabilize the process of Gaussian elimination to solve these equations, embodiments of the invention may add a real or complex offset to each of the diagonal elements of the A matrix. This is referred to as diagonal noise adding. By adding noise to the system, there is less chance that the matrix will be singular.

To add stability to the system, a constant value can be added to all of the diagonal elements of the A matrix. This helps to prevent singularities during Gaussian Elimination. Mathematically, $$A_{M \times M} = A_{M \times M} + K_{diag\_noise} \quad (9.49)$$

where $$K_{diag\_noise} = \begin{bmatrix} \alpha_1 & 0 & 0 & \ldots & 0 \\ 0 & \alpha_2 & 0 & \ldots & 0 \\ 0 & 0 & \alpha_3 & \ldots & 0 \\ \ldots & \ldots & \ldots & \ldots & \ldots \\ 0 & 0 & 0 & \ldots & \alpha_M \end{bmatrix} \quad (9.50)$$

Typically $\alpha_i$ is in the range of $1e^{-5} * \Sigma |z|^2$ to $1e^{-8} * \Sigma |z|^2$ for a full scale input. The $\alpha_i$'s can be changed as the signal level changes. Each $\alpha$ corresponds to a delay and certain order term in the A matrix and can be optimized accordingly via experimentation.

Equation 9.50 shows the most general implementation where each element is different, but in other embodiments, the noise can be the same. The proper noise levels can be determined empirically. These noise elements can be changed as signal levels and characteristics change.

Weight Conditioner: Averaging, Interpolation and Extrapolation. A major challenge for DDPD linearization performance is in the cases where either the input signal transitions from low power to high power, or the input signal suddenly increases its peak amplitude. The problem is when the signal goes from low to high, or the peak amplitude increases suddenly, the coefficient for low power (or lower amplitude) is not usable for high power (or higher amplitude). We have to wait for the next update (high power or higher amplitude) to have good CPL, and until the next coefficient is applied, the spectral emission mask may be violated. The A and B Matrix Averaging, Interpolation, Extrapolation, and Linear Extrapolation block 930 provides processing to remedy this problem. The processing done in this weight conditioner block is designed to ensure that a more stabilized solution and weights are generated.

Averaging and Interpolation Processing. In the DDPD system according to embodiments of the invention, data captures of the transmit and feedback paths are periodically obtained, and covariance matrices A and B and pre-distortion weights W are re-computed for each data capture. This re-computation of the covariance matrices and weights is necessary because the transmit signal power levels change over time, and previous matrices and weights will not necessarily be valid at the next data capture. In other words, over time, a series of re-computed A and B matrices can be represented as follows:

$$\begin{matrix} A6 & A5 & A4 & A3 & A2 & A1 \\ B6 & B5 & B4 & B3 & B2 & B1 \end{matrix}$$

Without the process of averaging, as will be described in further detail below, any previously computed A and B matrices are not considered in computing present A and B matrices and weights.

To explain the concepts of averaging and interpolation, it should first be understood that a power amplifier is usually operated in the linear region of the A-A curve, where the input signal level is low and little pre-distortion is necessary. Accordingly, suppose that input data has only been received in the linear region, so that the computed A and B matrices and pre-distortion weights only represent lower power levels. Now suppose that the situation described above occurs, and the signal level suddenly increases to levels at which pre-distortion becomes more necessary. Without any previous input data at these higher signal levels, the newly computed solution for A and B and the corresponding weights, calculated without the benefit of any previous data at high power levels, may produce a solution that does not predistort effectively and/or results in a very large input to the DAC and causes saturation of the PA. (However, the converse is not generally true—if weights for a high signal level are being used and the signal suddenly decreases, the weights in use will still tend to provide adequate compensation.)

To stabilize the weights, each newly computed set of A and B matrices may utilize previously computed A and B matrices so that if a signal level should rapidly increase, the newly computed A and B matrices will at least be influenced to some extent by previous A and B matrices computed at previous signal levels. If the previous signal levels include some covariance matrices A and B computed based on higher transmit power levels, the newly computed A and B matrices may generate a set of more stable and acceptable, though suboptimal, pre-distortion weights.

In an exemplary IIR filter embodiment, one or more previously computed A and B matrices and the A and B matrices computed solely on the basis of current signal levels can both be weighted in some predetermined manner and added together. For example, the covariance matrix $A_n$ for a current data capture "n" may be set to equal a weighted average $0.1A_{curr(n)}+0.9A_{n-1}$, where $A_{curr(n)}$ is an A matrix computed solely on the basis of the current signal level and $A_{n-1}$ is the previously computed covariance matrix A for the previous data capture "n−1." A similar computation may also be performed for covariance matrix $B_n$. It should be understood that the weights 0.1 and 0.9 are only exemplary, and that other weights could be used. Note also that because each successive set of covariance matrices $A_n$ and $B_n$ utilizes the previously computed set of covariance matrices $A_{n-1}$ and $B_{n-1}$, the newly computed covariance matrices effectively average infinitely into the past. Accordingly, this averaging can be implemented in an IIR filter as well as in a processor.

In another exemplary IIR embodiment, other previously computed sets of covariance matrices (e.g. $A_{n-2}$ and $B_{n-2}$, $A_{n-3}$ and $B_{n-3}$, etc.) as well as other delayed A and B matrices (e.g. $A_{curr(n-2)}$ and $B_{curr(n-2)}$, $A_{curr(n-3)}$ and $B_{curr(n-3)}$, etc.) may be utilized in the computation of the covariance matrices $A_n$ and $B_n$ for a current data capture "n". For example, $A_n$ may be set to equal a weighted average $0.1A_{curr(n)}+0.05A_{curr(n-1)}+0.15A_{n-1}+0.3A_{n-2}+0.4A_{n-3}$. It should be understood that the weights 0.1, 0.05, 0.15, 0.3 and 0.4 are only exemplary, and that other weights could be used. Other variations of the IIR filter implementations described above may also be utilized according to embodiments of the invention.

In an exemplary FIR filter embodiment, one or more delayed A and B matrices and the current A and B matrices can both be weighted in some predetermined manner and added together. For example, the covariance matrix $A_n$ for a current data capture "n" may be set to equal a weighted average $0.1A_{curr(n)}+0.25A_{curr(n-1)}+0.25A_{curr(n-2)}+0.25A_{curr(n-3)}+0.25A_{curr(n-4)}$, where $A_{curr(n)}$ is an A matrix computed solely on the basis of the current signal level, and $A_{curr(n-t)}$ are A matrices computed solely on the basis of signal levels present at times "n−t", where t=1 to 4. A similar computation may also be performed for covariance matrix $B_n$. It should be understood that the weights 0.1 and 0.25 are only exemplary, and that other weights could be used. Note also that because each successive set of covariance matrices $A_n$ and $B_n$ utilizes only a fixed number of covariance matrices $A_{curr(n-t)}$ computed solely on the basis of signal levels present at times "n−t", the newly computed covariance matrices effectively average only finitely into the past. Accordingly, this averaging can be implemented in a FIR filter as well as in a processor. Other variations of the FIR filter implementation described above may also be utilized according to embodiments of the invention.

Also, to effectively handle the signal transition from low power to high power, and for signals that occasionally increase in peak amplitude, signal combining is done between data from previous high inputs and current low inputs in a process referred to as interpolation. In other words, interpolation, as defined herein, is the process of using previous data captured at a different signal level in order to produce a better solution (e.g. using previous data captured at higher signal levels to compute A and B matrices for low signal levels, or vice versa).

Extrapolation Processing. In normal operation, the DDPD signal and the feedback signals are captured and the weights, W, are derived based on these data captures. Let $A_H$ be the maximum amplitude of a particular Feedback data capture. The polynomial coefficient set derived from this capture can effectively cancel the PA non-linearity and distortion for signals that have amplitudes equal to or lower than $A_H$. However, the polynomial coefficients are not well defined for signal amplitudes that exceed $A_H$. In practice, signal amplitude peaks may occasionally exceed $A_H$ and the DDPD coefficients may not correct as well for these high peak samples. This can result in very poor CPL for short durations.

Extrapolation is another methodology for improving the generation of pre-distortion weights when the signal level suddenly goes large with no previous track record of covariance matrices A and B computed at high power levels and therefore no previous pre-distortion at those levels. Without any previous history, the solution can be poor and possibly create larger outputs causing saturation of the PA and glitches on the output, which can create spurs and noise that exceeds specified levels.

The extrapolation process can effectively correct for this problem by producing a "pseudo" set of data having the highest expected signal amplitude. Essentially, unlike averaging or interpolation, extrapolation creates fictitious data points at high power levels to help in generating a more stable solution. This would force the DDPD solution to behave well for signals with large peaks.

In the situation where extrapolation is applicable, covariance matrices A and B have been computed only up to a certain power level. Power level ranges or "bins" near these power levels can be established, and after a certain number of data captures have occurred in the highest bin, the previously computed A and B matrices within that bin can be averaged to obtain $A_{ave}$ and $B_{ave}$. Extrapolated A and B matrices, $A_{extrap}$ and $B_{extrap}$, can then be computed by multiplying $A_{ave}$ and $B_{ave}$ by particular scaling factors, which may be the same or different. $A_{extrap}$ and $B_{extrap}$ provide a fictitious data point at a high power level for use in computing covariance matrices A and B at lower power levels, which may optionally utilize the averaging and weighting methodologies discussed above. For example, perhaps $(0.001)A_{extrap}$ and $(0.001)B_{extrap}$ may be added into the averaged and/or interpolated A and B matrices as described above. Optionally, because factoring in an extrapolated high power data point will make lower power solutions less accurate, if no high power levels have been received for some predetermined period of time, $A_{extrap}$ and $B_{extrap}$ can be scaled back even further (by reducing the scaling factors) so that extrapolation will have less of a negative effect at lower power levels.

In addition to computing $A_{extrap}$ and $B_{extrap}$, the phase can be rotated, which can help approximate a more accurate solution, because the PA itself performs some amount of phase rotation at high power levels.

An alternative extrapolation methodology from the one described above extrapolates the captured transmit and feedback signals before computing the corresponding A and B matrices. In this process, let $y_H[n]$ and $z_H[n]$ be the captured DDPD signal and feedback signal when the signal is high, respectively. The extrapolation process then amplifies $y_H[n]$ by a factor of $g_1$, and amplifies and rotates the $z_H[n]$ by a factor of $g_2 e^{-j\theta}$.

Figure 19A:
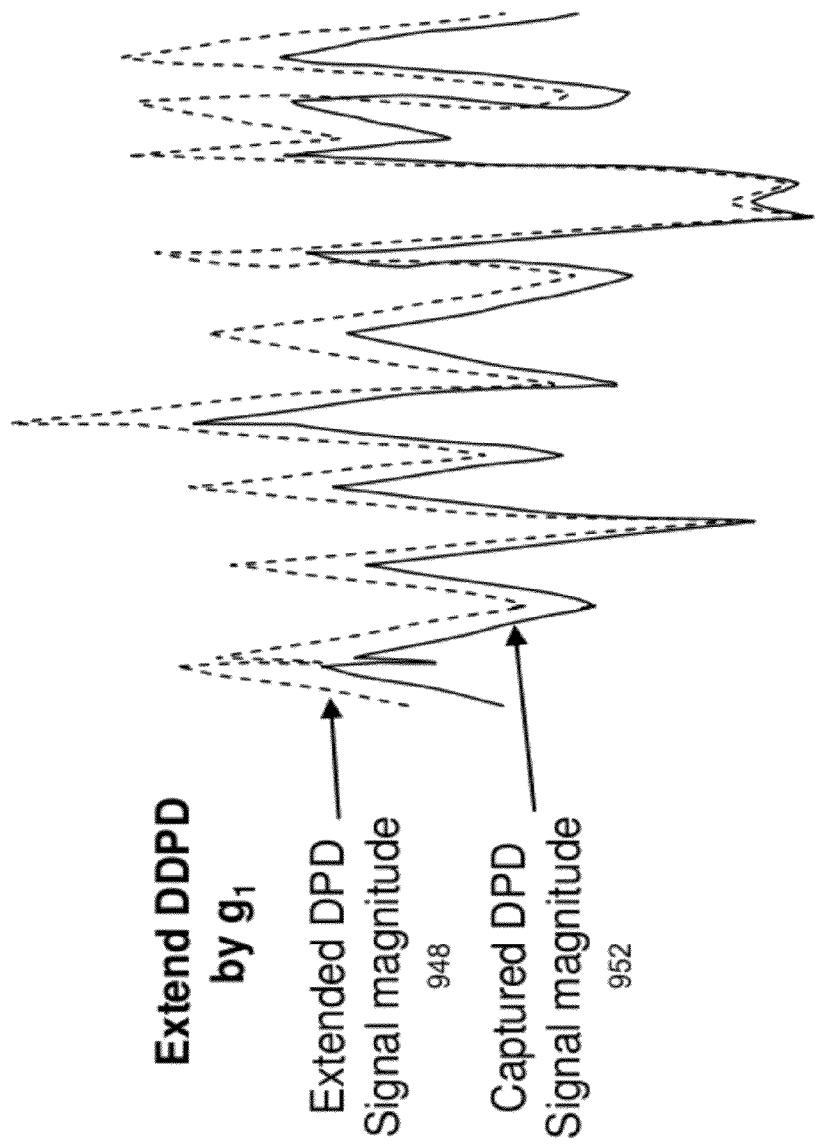
FIGS. 19a and 19b show exemplary transmit and feedback signal amplitudes of the data before and after applying extrapolation scaling according to embodiments of the invention.
Figure 19B:
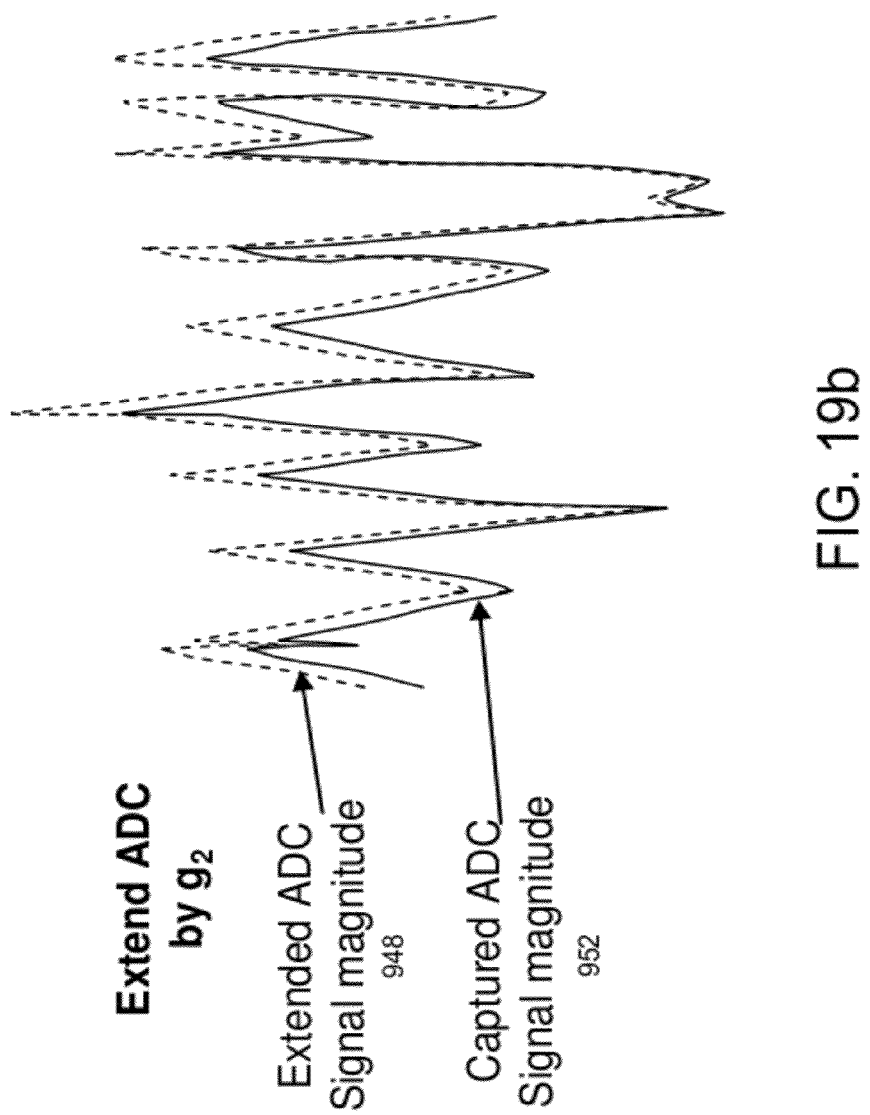

FIGS. 19a and 19b show the transmit and feedback signal amplitudes of the data before (see reference character 948) and after applying the scaling (see reference character 952). This essentially extends the AA (amplitude to amplitude) curve for larger inputs and even possibly into the saturation zone. The AA curve is normalized to unity gain.

Figure 20A:
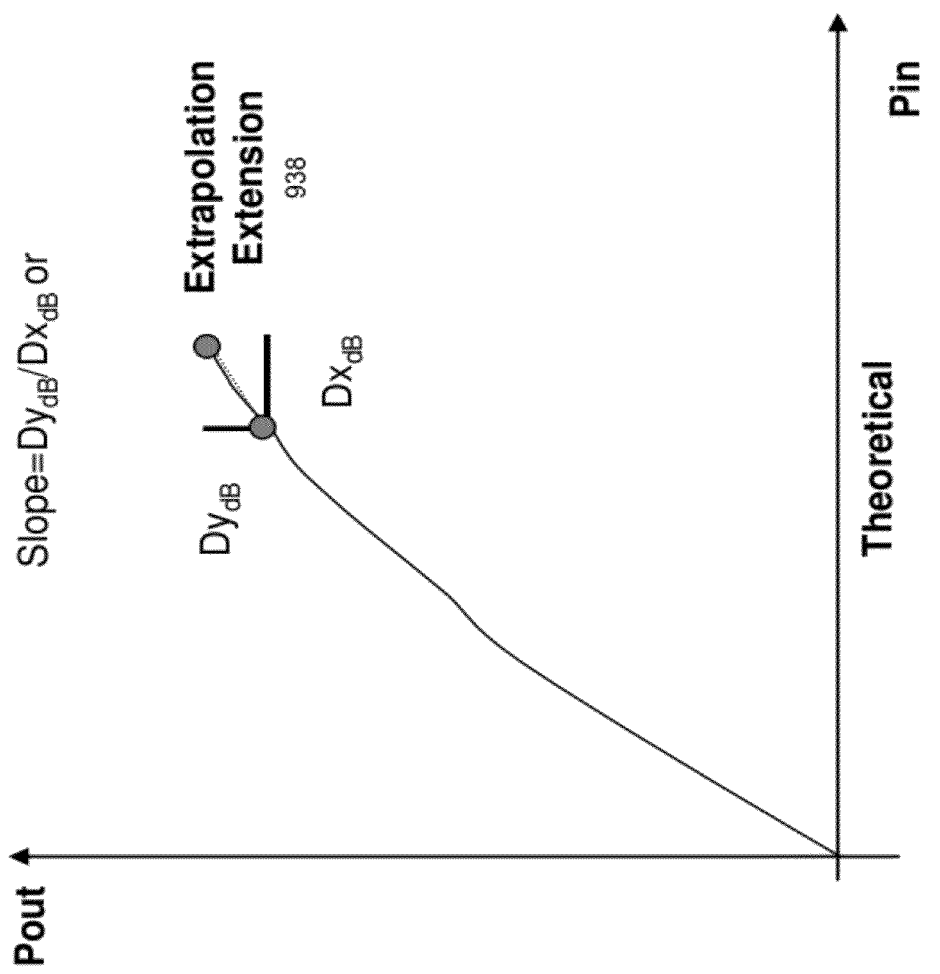
FIGS. 20a and 20b show an exemplary theoretical and practical extrapolation extension of an amplitude-amplitude curve according to embodiments of the invention.

FIG. 20a shows the theoretical extension of the AA curve. The extension (see reference character 938) is created simply by extending a line to the end of the curve that has the same slope at the maximum power as the data. However, for an easy practical implementation it is far easier to apply a gain to both data sets related to their slope at the peak of the data capture.

Figure 20B:
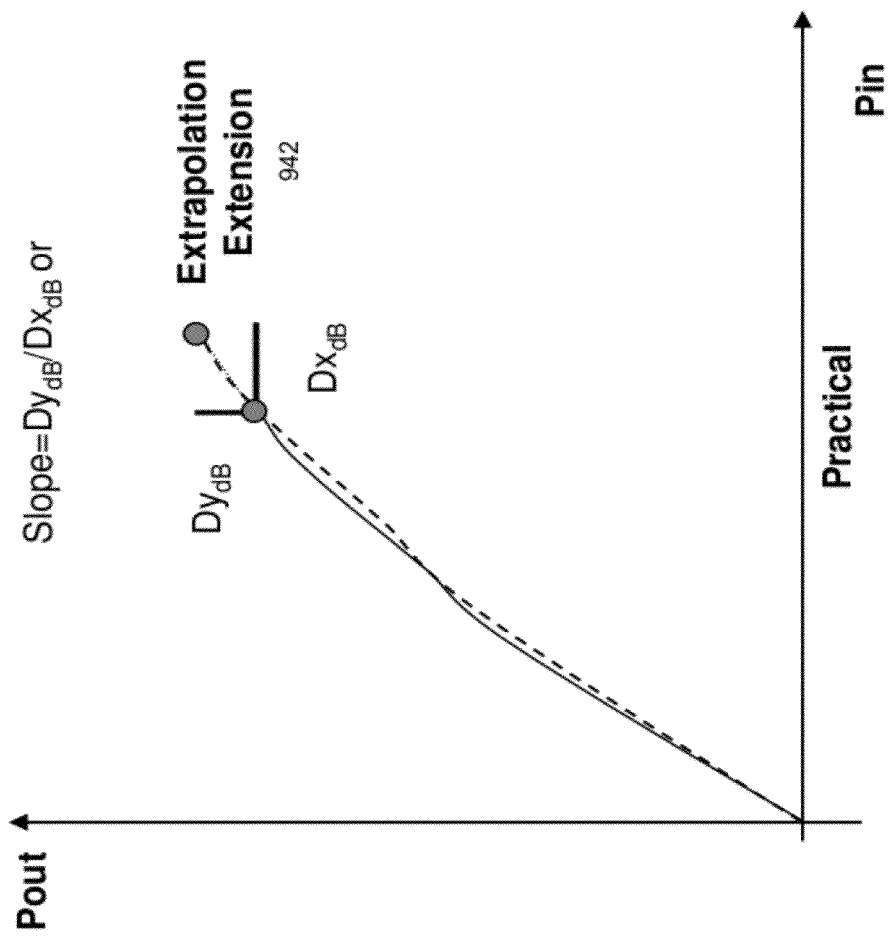

FIG. 20b shows this approach. The extrapolated AA curve using this method (see reference character 942) now is less accurate for small data sets. The AP curve plots the input amplitude versus output phase minus input phase.

Figure 21A:
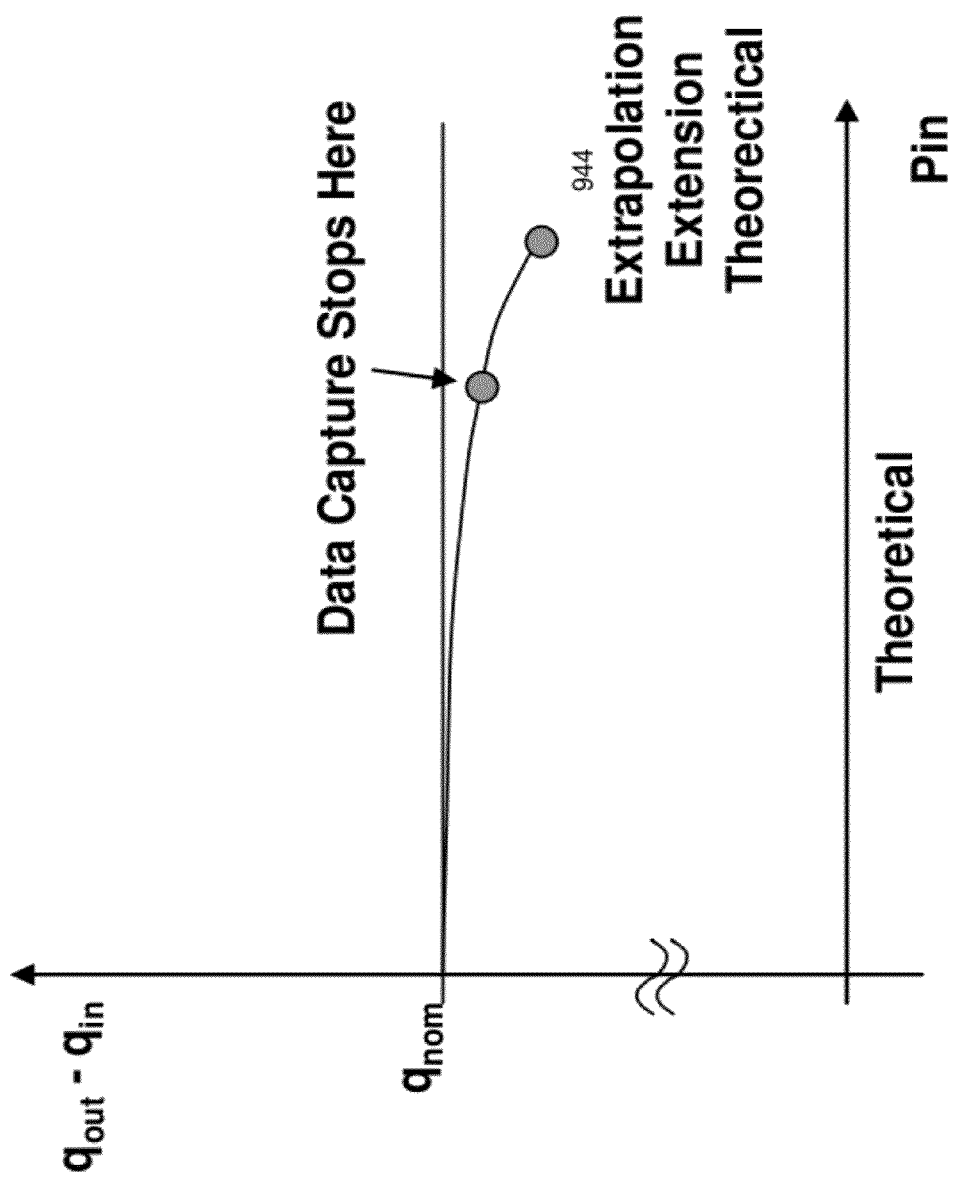
FIGS. 21a and 21b show an exemplary theoretical and practical extrapolation extension of an amplitude-phase curve according to embodiments of the invention.
Figure 21B:
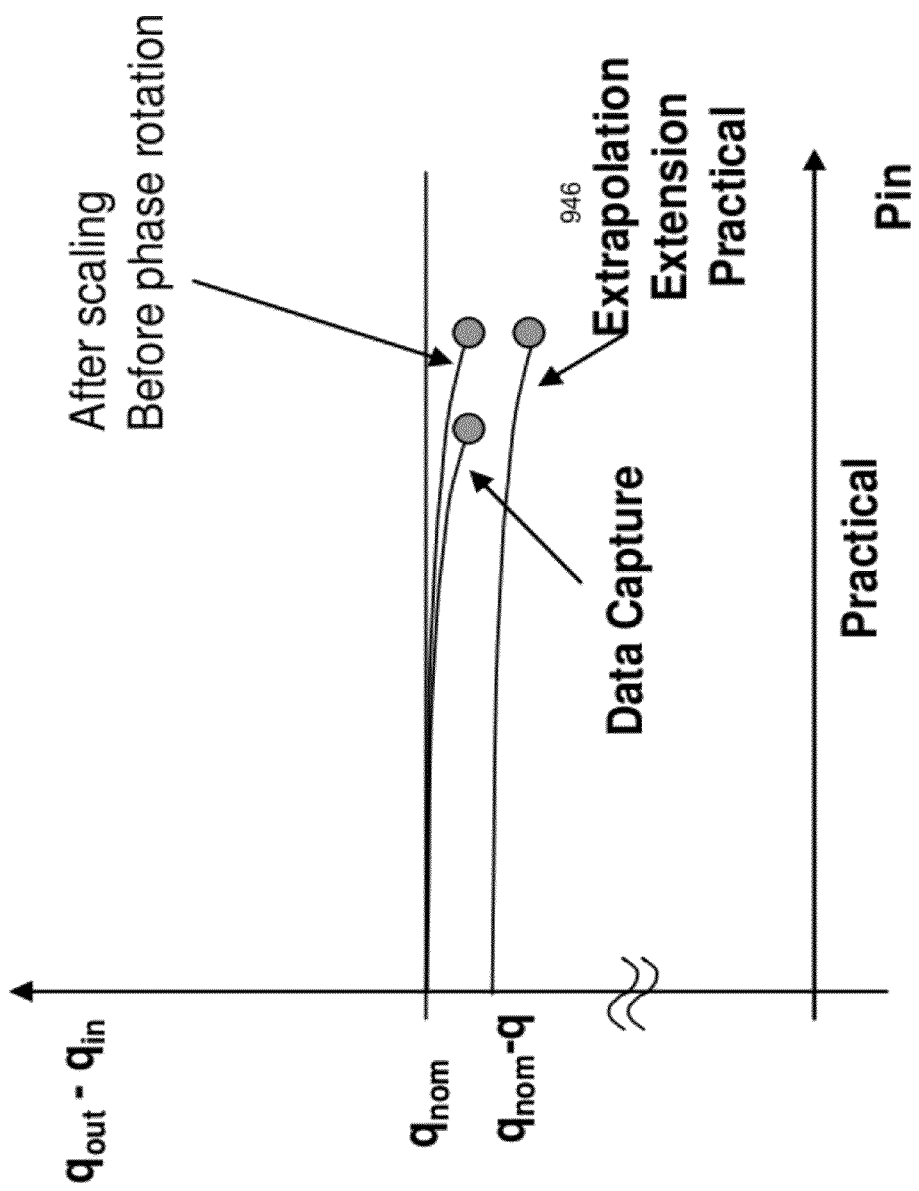

FIGS. 21a and 21b show example AP curves. Note that the angle decreases as the input amplitude increases. For the best extrapolation, this curve would be extended as shown in FIG. 21a (see reference character 944). However, for an easy practical implementation, a constant phase rotation of −θ is performed on the data. FIG. 21b shows the resulting curve that ends at the desired location (see reference character 946), but for smaller input powers does not track the optimum extrapolation AP curve very well.

The amplified and rotated signals are written as, $$y_E[n]=g_1 y_H[n] \quad (9.58)$$

$$z_E[n]=g_2 e^{-j\theta} z_H[n] \quad (9.59)$$

Based on the amplified signals, $y_E[n]$ and $z_E[n]$, the corresponding covariance matrices can be obtained, $A_E$ and $B_E$.

Figure 22:
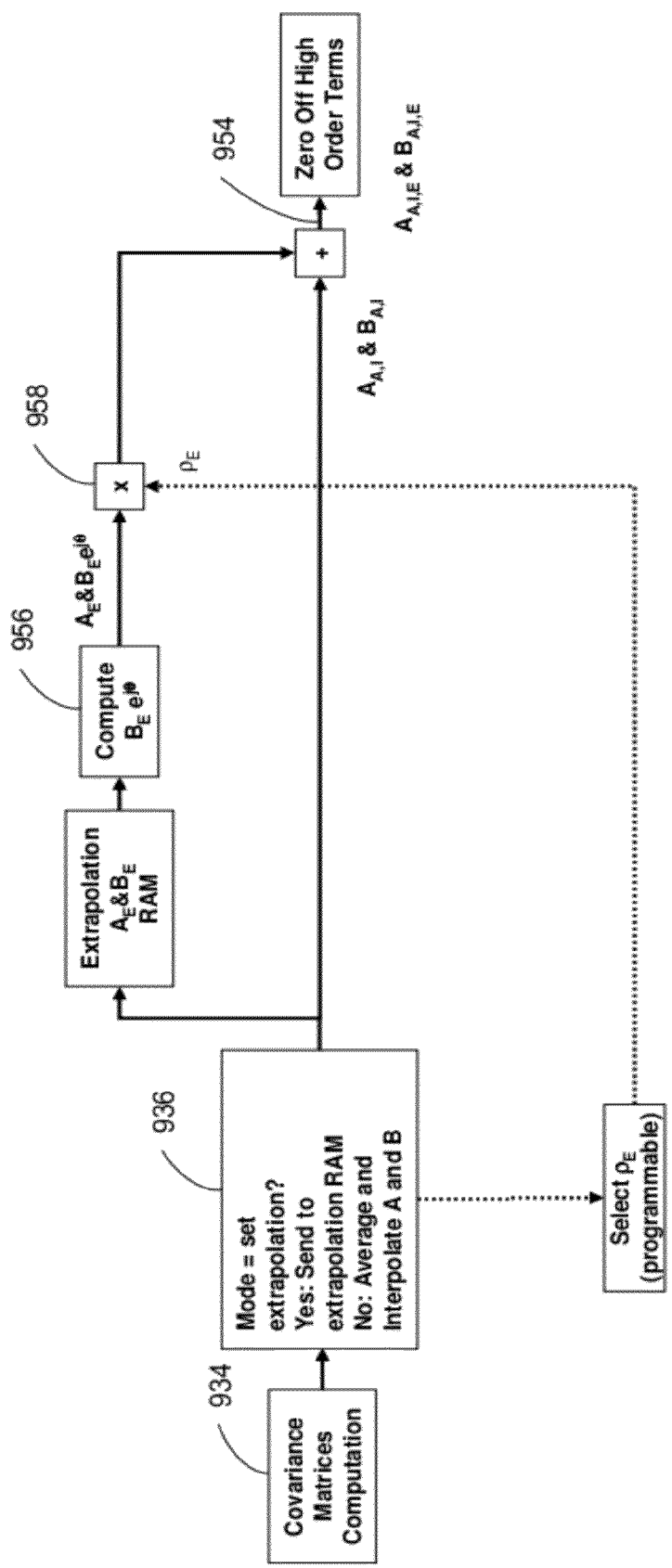
FIG. 22 illustrates an exemplary block diagram of the averaging, interpolation and extrapolation that is used to stabilize the DDDP coefficient solution according to embodiments of the invention.

FIG. 22 illustrates a block diagram of the averaging, interpolation and extrapolation that is used to stabilize the DDDP coefficient solution. First, in block 936 it must be determined whether a processor or other configuration logic has set up an extrapolation mode. If so, the extrapolated matrices $A_E$ and $B_E$ are updated instead. The compute block 956 performs the phase rotation of B only, while the multiplier blocks 958 apply a programmable scaling factor. If no extrapolation mode has been set up, averaging and interpolation may be performed in block 936 to generate averaged and interpolated $A_I$ and $B_I$ values. From FIG. 22, we see $A_E$ and $B_E$ add to the averaged and interpolated $A_I$ and $B_I$ (see reference character 954).

We can now write the new "normal" equation using the extrapolation matrices as:

$$[A_{A,I}+\rho_E A_E]W_{A,I,E}=[B_{A,I}+\rho_E B_E] \quad (9.60)$$

where $\rho_E$ is some programmable parameter, $A_{A,I}$ and $B_{A,I}$ are the averaged, interpolated A and B matrices, and $W_{A,I,E}$ are the resulting weights. Since neither the practical AA nor AP curves track the theoretical very well at lower power levels, we add these new $A_E$ and $B_E$ matrices at a lower level than the original ones. Thus $\rho_E$ is usually much smaller than $\rho_L$ or $\rho_H$. The new DDPD solution is expressed as:

$$A_{A,I,E}W_{A,I,E}=B_{A,I,E} \quad (9.61)$$

And the new combined interpolation/extrapolation of A and B now becomes $$A_{A,I,E}=A_{A,I}+\rho_E A_E \quad (9.62)$$

$$B_{A,I,E}=B_{A,I}+\rho_E B_E \quad (9.63)$$

From Equations (9.15) and (9.16), to get the $A_E$ and $B_E$ matrices, $$A_E=K_E^H K_E \quad (9.64)$$

$$B_E=K_E^H Y_E \quad (9.65)$$

When z is rotated by an angle, $z_E[n]=g_2 e^{-j\theta} z_H[n]$, there is no change to $A_E$ from this angle change. This can be seem by looking at Equation (9.13). Each element of $K_E$ will have an $e^{-j\theta}$ term factor. Each element of $K_E^H$ will have an $e^{j\theta}$ factor. The rotations cancel. In a similar manner, since each element if $K_e^H$ has a factor of $e^{j\theta}$, it can be factored out of the $B_E$ computation and applied after the multiplication saving a lot of multiplies. If for $z_E[n]=g_2 z_H[n]$ (no phase rotation), $B_{E,no\ rotate}=K_{E,no\ rotate}^H Y_E$, then, $$B_E=K_E^H Y_E=e^{j\theta}K_{E,no\ rotate}^H Y_E=e^{j\theta}B_{E,no\ rotate}^H \quad (9.66)$$

The Block diagram of the combined interpolated/extrapolation of A&B is shown in FIG. 22. This shows just one possible implementation.

In order to find the slope to apply to the input data, the following procedure is followed. First, read 1000 (or some number) of samples from the time-aligned data (remove and data shift), $Z_H$ and $Y_H$. If $\sqrt{y_H^*[i]y_h[i]}>T2$, then:

ddpd_sum_$T2$=ddpd_sum_$T2$+$\sqrt{y_H^*[i]y_h[i]}$, adc_sum_$T2$=adc_sum_$T2$+$\sqrt{z_H^*[i]z_h[i]}$, and $T2$count=$T2$count+1.

Else if $\sqrt{y_H^*[i]y_H[i]}>T1$, then:

ddpd_sum_$T1$=ddpd_sum_$T1$+$\sqrt{y_H^*[i]y_h[i]}$, adc_sum_$T1$=adc_sum_$T1$+$\sqrt{z_H^*[i]z_h[i]}$, and $T1$count=$T1$count+1.

Next, get the average coordinate in each section:

adc_ave_$T2$=adc_sum_$T2$/$T2$count, ddpd_ave_$T2$=ddpd_sum_$T2$/$T2$count, adc_ave_$T1$=adc_sum_$T1$/$T1$count, and ddpd_ave_$T1$=ddpd_sum_$T1$/$T1$count.

Finally, find the slope:

Slope=(adc_ave_$T2$−adc_ave_$T1$)/(ddpd_ave_$T2$−ddpd_ave_$T1$)

Typically g1 is fixed to approximately a 0.5 to 2.5 dB increase, depending on how much more peaking than the captured data is expected, and g2=g1*Slope.

In order to find the θ to apply to the $B_E$ matrix, it is easiest to simply apply different θ's and based on performance, choose the one which yields the best performance. A range of 0-10 degrees should be tested with five degrees the expected value.

When doing a data capture for producing the extrapolation matrices, $A_E$ and $B_E$, the data capture should contain a sufficient number of points but can be a smaller portion of the total capture length. A length of 1000 samples at 184.32 MHz is a typical length. By using fewer samples, the solution will work harder to fit the peak since its contribution to the error will be a larger percentage of the error.

Finally, setting the $\rho_E$ parameter can be done by testing the level which works best. The range of $\rho_E$ is $2^{-5}$ to $2^{-16}$ depending on the signal strength and the number of samples processed to obtain the extrapolation matrix. A smaller data capture will require a larger $\rho_E$. A typical $\rho_E$ for a data capture length of 1000 is 1/128. As the signal level changes, it may be optimum to vary $\rho_E$ so that the extrapolation matrix does not dominate the solution. Generally, $\rho_E$ should vary one-for-one with the input signal power.

Linear Extrapolation Processing. The solution of the normal equation provides good DDPD linearization for input signal levels that have the same or less signal power than that used in the coefficient computation. For the purposes of this discussion, let's assume that there is no interpolation or extrapolation being done. If the input signal amplitude exceeds the maximum amplitude of the samples that were captured for the current DDPD coefficients, this coefficient solution can be ill-defined. The higher order coefficients of the lower power solution (5th or 7th or higher) will typically have a larger magnitude than if a larger input was used in the solution. These higher order coefficients can corrupt the linearization of signal samples corresponding to a higher power input.

Figure 23:
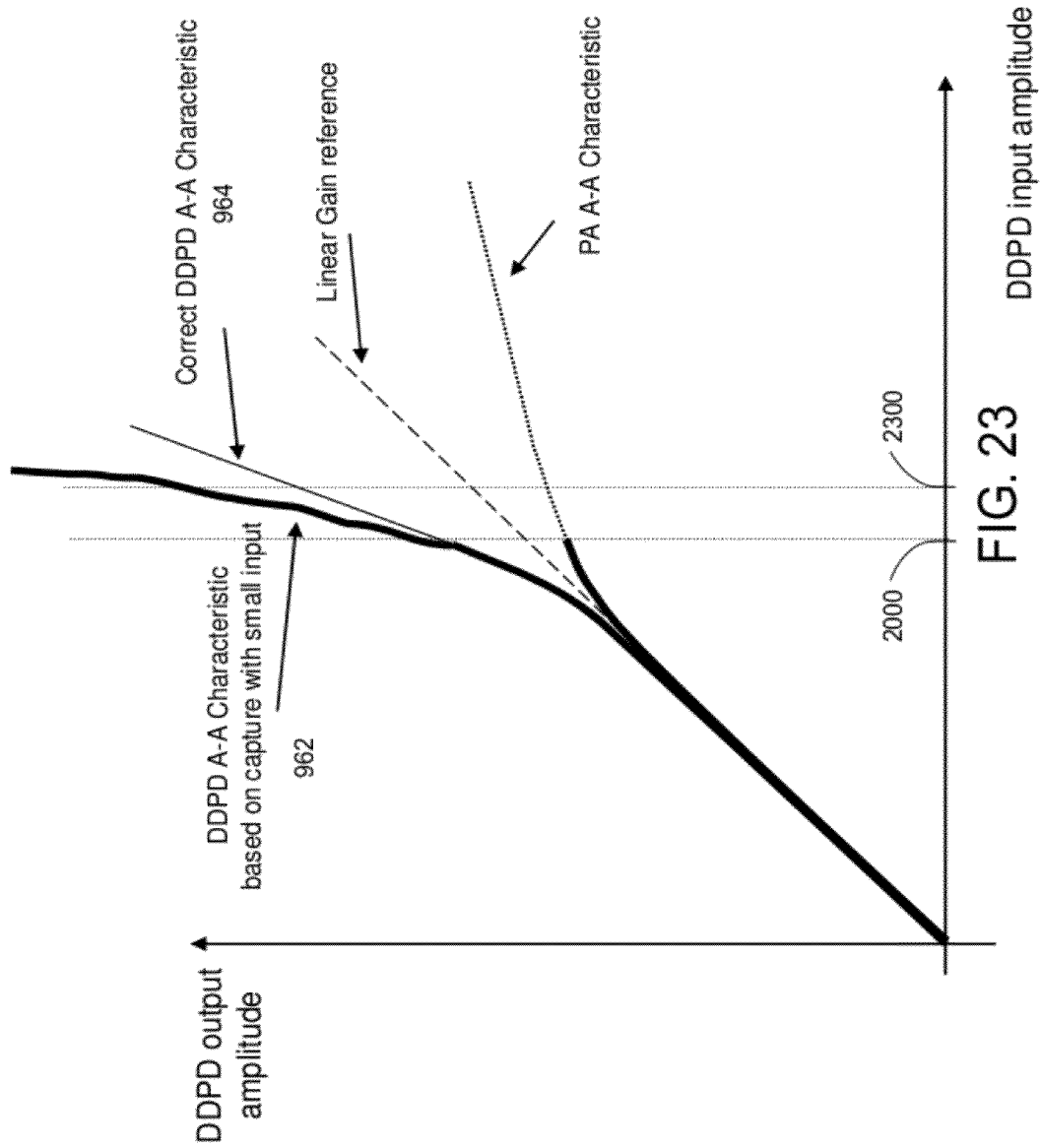
FIG. 23 shows an exemplary performance degradation if current solution is based on data with peaks limited to 2000 in amplitude.

FIG. 23 shows possible performance degradation if current solution is based on data with peaks limited to 2000 in amplitude. With an input of amplitude 2300, the output can become unstable and performance would degrade. For example, suppose the current DDPD coefficients are obtained based on a weak transmitted signal having digital peak amplitude less than or equal to 2000 as shown in FIG. 23. In this case, the polynomial solution W should linearize correctly for the signals with maximum amplitudes of 2000 or less. But if the input signal has a peak amplitude to 2300, then the DDPD coefficients may produce a spurious DDPD engine output for this higher peak. Looking at FIG. 23, the solution 962 deviates greatly from the actual solution 964 for signals peaking about 2000. In this case, the output of the PA can have a very high spectral amplitude that violates the SEM requirements. The objective is to maintain the higher order coefficients (5th or 7th or higher) to avoid spurious outputs.

Figure 24:
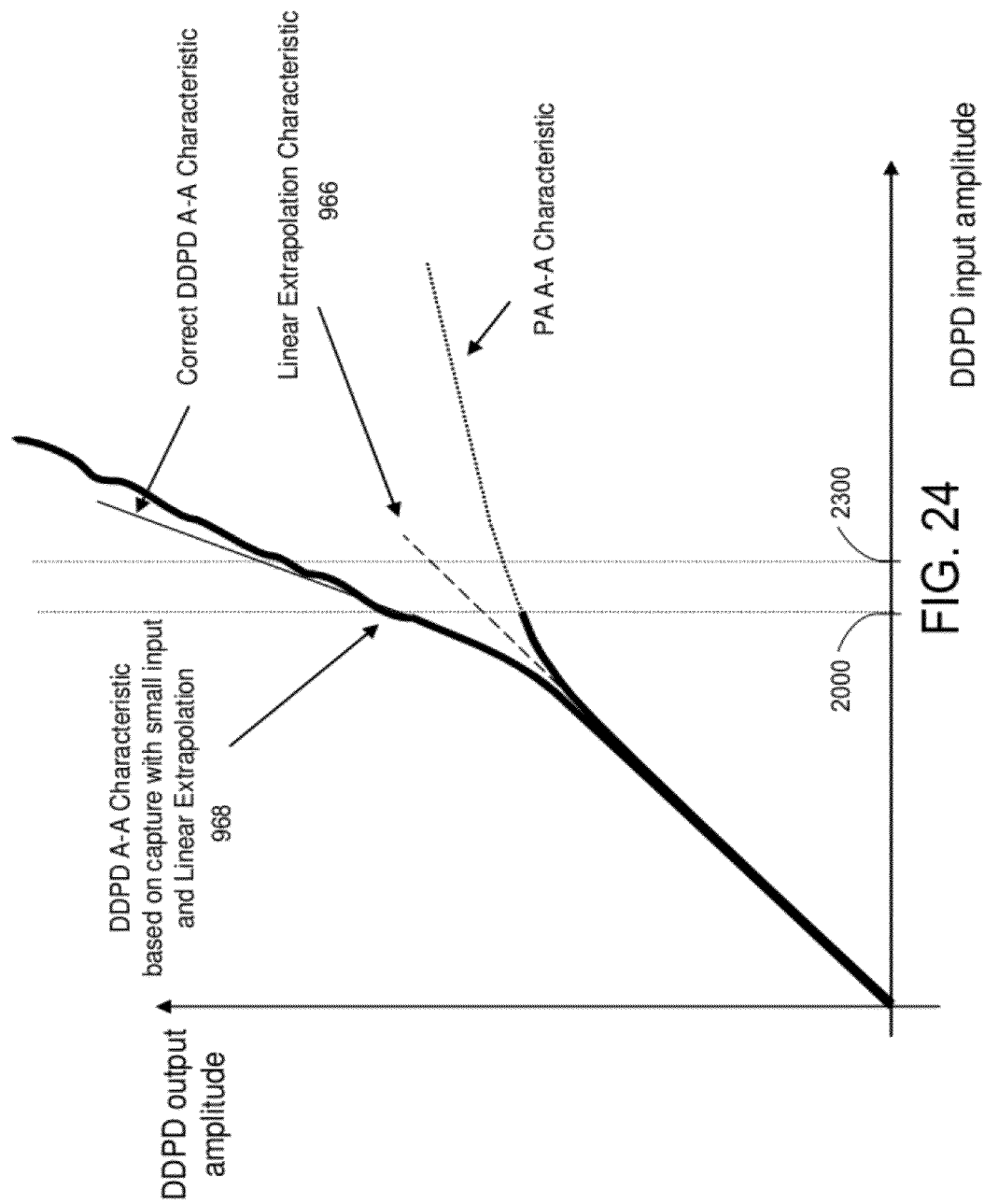
FIG. 24 illustrates the benefits of Linear extrapolation according to embodiments of the invention.

FIG. 24 illustrates the benefits of Linear extrapolation. This figure shows a Linear Extrapolation characteristic 966 as a straight line approximating a linear gain PA. By adding in this characteristic at a very low level to the actual data, the solution is prevented from producing large, incorrect outputs. The resultant DDPD solution when Linear Extrapolation is applied is shown at 968. There is still error from the actual solution, but we avoid very large outputs which can saturate or damage the PA. FIG. 24 shows how Linear Extrapolation can produce a more stable solution for points beyond the captured data.

Figure 25:
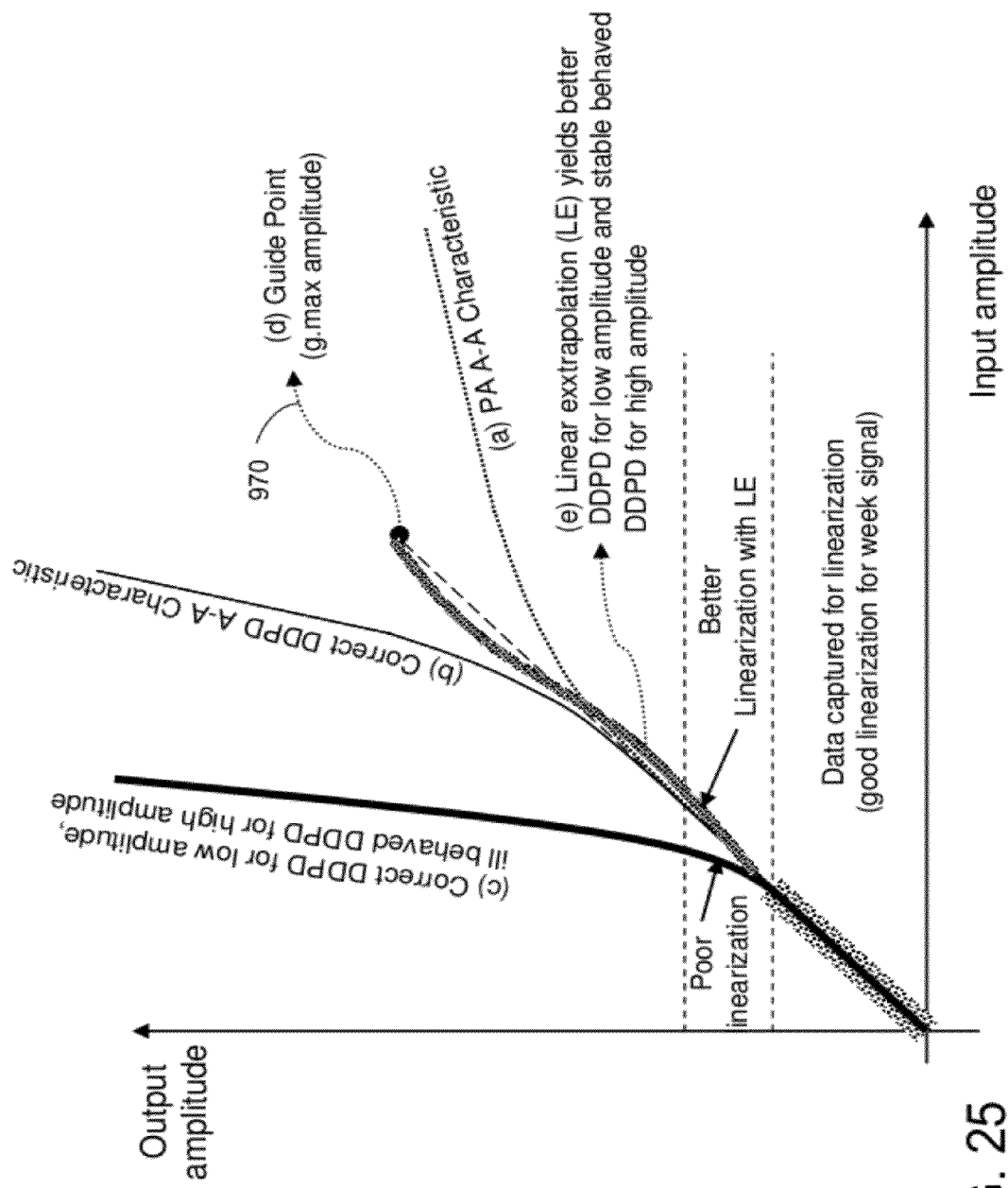
FIG. 25 illustrates another benefit of Linear Extrapolation for low power inputs according to embodiments of the invention.

FIG. 25 illustrates another benefit of Linear Extrapolation for low power inputs. Solving the normal equation in this case produces large, unstable high order term coefficients. For example, suppose the current DDPD coefficients are obtained based on a weak transmitted signal such as in FIG. 25 curve (c). In this case, the polynomial solution W should linearize correctly for signals with similarly low power level. But if the input signal suddenly increases, then the DDPD solution may produce an incorrect predistortion signal for this higher power case. Curve (c) in FIG. 25 deviates greatly from the actual solution for high power signals, curve (b). In this case of suddenly increased input power, the output of the PA can have a very high spectral amplitude that violates the SEM requirements. When linear extrapolation is done, the solution does not shoot up, but instead follows the thick gray trace labeled as (e) continuing to the dot which is typically set to the maximum input expected. For unexpected inputs larger than the input level of the dot, the output is still ill-defined. This is shown by the curvy line 970 past the dot up to the arrowhead at point (d).

A different method to keep the solution stable is to force the high-order terms to zero. This requires some logic and may have undesirable effects if the signal level changes rapidly back and forth and the order of the solution is also changing constantly. This also requires the detection of signal amplitude and threshold comparisons.

The desired approach for solving both the high input problem and the low input signal problem is the use of Linear Extrapolation (LE) that will maintain the polynomial's high order terms to be sufficiently accurate while not causing instability or degrading performance when the input signal is low. Using Linear Extrapolation can supplant zeroing off high order terms and improves the DDPD performance stability. This allows us to always solve for all order terms (i.e., don't have to have different polynomial orders for different signal levels). This linear extrapolation is essentially forcing a fixed slope of the A-A and zero slope of the AP curve preventing ill behavior of the polynomial solution when signals exceeds the captured level.

In Linear extrapolation, instead of scaling A and B by different amounts in an attempt to account for the nonlinear nature of the curve at high power levels, A and B are scaled so that the curve remains linear at high power levels. The processing steps of Linear Extrapolation are as follows. First, linearize the system. During a usual data capture, continue all the usual processing but increase y[n] by 0-3 dB and then set z[n]=y[n] (i.e. set the input equal to the output). Go through the Sample Shift and compute the Linear Extrapolation normal matrices (i.e., covariance matrices) $A_{LE}$ and $B_{LE}$. Second, multiply the matrix $B_{LE}$ by a exp(j$\theta$), where $\theta$ is the phase of $B_H(1)$, where $B_H$ is the high covariance matrix. This forces the Linear Extrapolation to be phase aligned to the input signal phase. An additional phase shift can be applied which could help performance. Third, scale $A_{LE}$ and $B_{LE}$ by the same amount, such as a factor of $\rho_{LE}$ which is very small, e.g., $\rho_{LE}=2^{-15}$ to $2^{-20}$. This factor can vary as signal power varies. This produces extrapolated A and B matrices at a high power level and a curve that follows a unity curve (is on a straight line). Such an A matrix has very small off-diagonal values and very large diagonal values. As the off-diagonal values reduce to zero, it becomes a diagonal noise matrix. These A and B matrices can then be phase-rotated. Finally, add the matrices $A_{LE}$ and $B_{LE}$ to the extrapolation matrices to obtain the final matrices, $A_F$ and $B_F$, that are ready for Gaussian Elimination Processing as detailed next.

Figure 26:
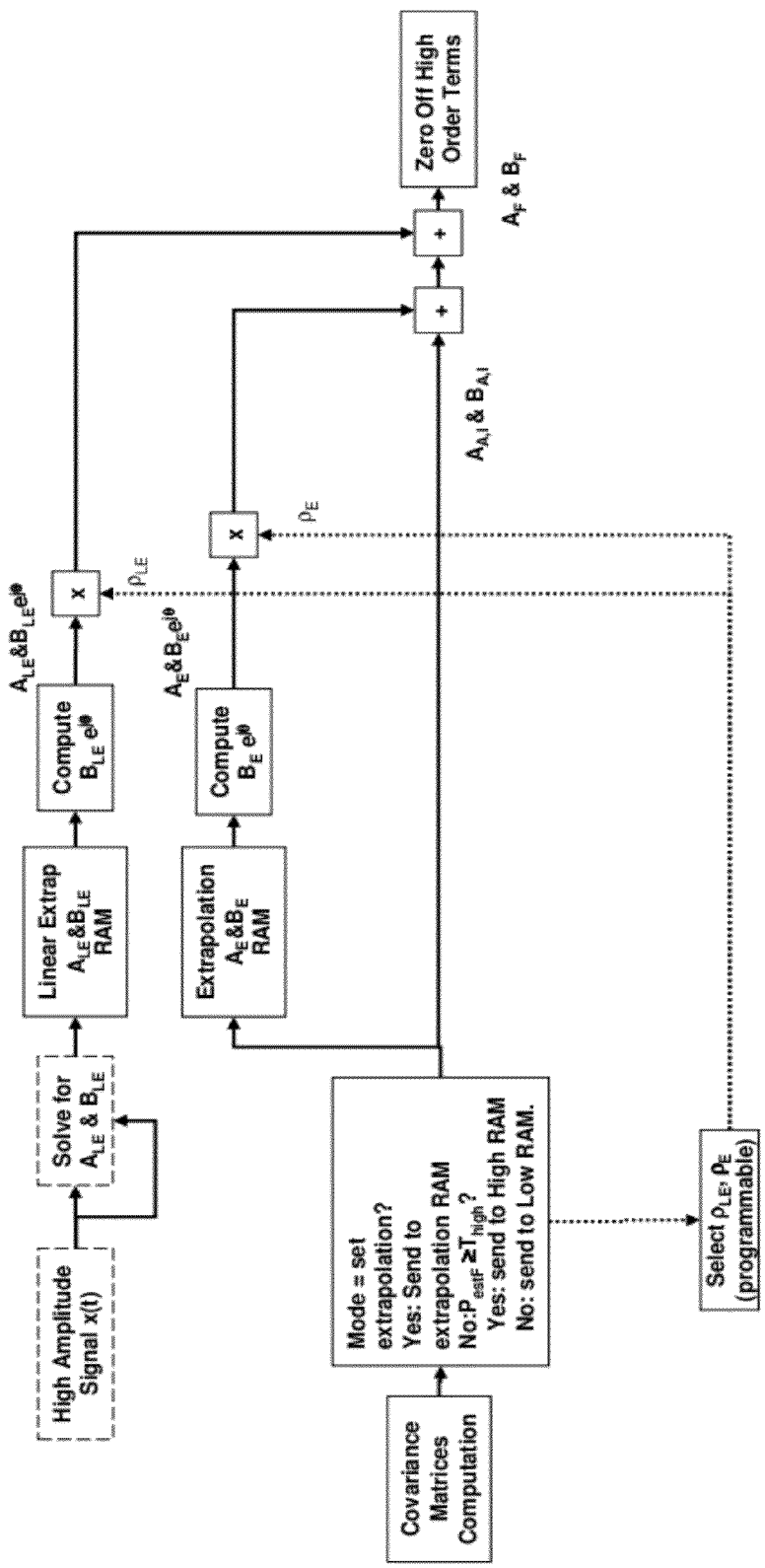
FIG. 26 illustrates an exemplary implementation block diagram of the normal matrices combining process according to embodiments of the invention.

FIG. 26 illustrates the implementation block diagram of the normal matrices combining. In Normal Matrices Combining, the normal matrices $A_F$ and $B_F$ are obtained by the weighted combination of the Linear Extrapolation, Extrapolation and Interpolation/Averaging. This combination is expressed as follows:

$$A_F = \rho_{LE} A_{LE} + \rho_E A_E + A_{AI} \quad (9.69)$$

$$B_F = \rho_{LE} B_{LE} + \rho_E B_E + B_{AI} \quad (9.70)$$

$$A_F W_F = B_F$$

where $A_F$ and $B_F$ are the normal matrices of all of the processing to this point, $A_{LE}$ and $B_{LE}$ are the normal matrices for linear extrapolation (these are pre-computed and fixed) (see reference character 972), $A_E$ and $B_E$ are the normal matrices for extrapolation of high amplitude data capture, $A_{AI}$ and $B_{AI}$ are the normal matrices for the averaged and interpolated data, $\rho_{LE}$ is the weight for $A_{LE}$ and $B_{LE}$, and $\rho_E$ is the weight for $A_E$ and $B_E$.

Zero Off High Order Terms. In the Zero Off High Order Terms block 940, when the signal level is low, there is no significant distortion energy in most of the spectrum. The high order weights tend to become unstable in this case. One method to correct this problem is to zero the high order polynomial terms as the signal drops. Predetermined signal level thresholds can be experimentally determined, and depending on the actual signal level, all or some of the high order terms can be set to zero, leaving only a linear solution or at least a solution with fewer non-linear terms.

Gaussian Elimination Processing. The DDPD normal equation is expressed as:

$$AW = B \quad (9.72)$$

where the A and B of this equation are $A_G$ and $B_G$. To simplify the notation we will use A and B instead. This equation is composed of M linear equations which need to be solved to obtain W. The most practical method for solving $\overline{W}$ is via complex Gaussian Elimination, which is a method for solving multiple equations (e.g. 15 equations) having multiple unknowns (e.g. 15 unknowns). In embodiments of the present invention, Gaussian Elimination is performed in the Gaussian Elimination Processing block 950.

Other Solution Techniques. Gaussian Elimination is shown as the method to derive the coefficients. Other methods including Gauss-Jordan elimination and the iterative Gauss-Seidel method may also be employed.

DDPD Coefficient Validator. The computed coefficients (weights) may not necessarily produce correct coefficients for the DDPD engine. This may be due to the fixed-bit arithmetic precision in the computation process or the data may be saturated or corrupted in some way. The objective of the DDPD Coefficient Validator block 960 is to check the coefficients before they are applied to the DDPD engine. This would prevent the possibility that the coefficients are inaccurate because of saturation or truncation effects during the computation process. To ensure the computed coefficient set, $\overline{W}$, is good, any coefficient verification or validation method known to those skilled in the art can be used.

Gaussian Elimination Validator. Alternatively, a method referred to herein as the Gaussian Elimination Validator may be utilized according to embodiments of the invention. The Gaussian Elimination Validator methodology checks the Gaussian Elimination process by substitution of $\overline{W}$. Since Gaussian Elimination solves the normal equation, $\overline{A}\overline{W}=\overline{B}$, then the result of $\overline{B}-\overline{A}\overline{W}$ should be small relative to the size of the elements of $\overline{B}$. The process to verify if Gaussian Elimination produced an accurate solution is as follows. First, compute $\Delta \overline{B}=\overline{B}-\overline{A}\overline{W}$, and compute the normalized error $$E = \frac{|\Delta B|}{|B|}.$$

Next, reject $\overline{W}$ if $E>\zeta$. If $\overline{W}$ is rejected, the current coefficient set will continue to be applied. If $\overline{W}$ passes the test, the new weights are loaded into the DDPD engine and the process repeats for the next coefficients.

Although embodiments of this invention have been fully described with reference to the accompanying drawings, it is to be noted that various changes and modifications will become apparent to those skilled in the art. Such changes and modifications are to be understood as being included within the scope of embodiments of this invention as defined by the appended claims.

What is claimed is:

1. A method for an apparatus for generating covariance matrices A and B for each data capture of a transmit signal, the covariance matrices A and B for use in computing weights W and producing a pre-distorted transmit signal to cancel nonlinearities created by a distorting element or distorting system when transmitting the transmit signal, the method comprising:
providing in the apparatus coefficient estimator circuitry configured for:
establishing power level ranges or bins for the transmit signal as received and at a highest power level for the received transmit signal;
when a predetermined number of data captures of the transmit signal are received that fall within the power level ranges or bins,
averaging covariance matrices A and B computed for the data captures within the power level ranges or bins to generate averaged high end covariance matrices A and B, and
scaling the averaged high end covariance matrix A by a first scaling factor and scaling the averaged high end covariance matrix B by a second scaling factor to compute extrapolated covariance matrices A and B; and
generating covariance matrices A and B for data captures of a transmit signal having a power level below a particular threshold utilizing the extrapolated covariance matrices A and B.

2. The method of claim 1, further comprising reducing the first and second scaling factors if no data captures of the transmit signal fall within the power level ranges or bins for a predetermined amount of time.

3. The method of claim 1, further comprising computing the weights W for each data capture of the transmit signal using the generated covariance matrices A and B.

4. The method of claim 3, further comprising verifying W after computing W.

5. The method of claim 3, further comprising validating W by:
computing $\Delta B=B-AW$;
computing the normalized error $$E = \frac{|\Delta B|}{|B|};$$

rejecting W and utilizing previous W values if E is larger than a predetermined threshold.

6. An apparatus for generating covariance matrices A and B for each data capture of a transmit signal, the covariance matrices A and B for use in computing weights W and producing a pre-distorted transmit signal to cancel nonlinearities created by a distorting element or distorting system when transmitting the transmit signal, the apparatus comprising coefficient estimator circuitry configured for:
establishing power level ranges or bins for the transmit signal as received and at a highest power level for the received transmit signal;
when a predetermined number of data captures of the transmit signal are received that fall within the power level ranges or bins,
averaging covariance matrices A and B computed for the data captures within the power level ranges or bins to generate averaged high end covariance matrices A and B, and
scaling the averaged high end covariance matrix A by a first scaling factor and scaling the averaged high end covariance matrix B by a second scaling factor to compute extrapolated covariance matrices A and B; and
generating covariance matrices A and B for data captures of a transmit signal having a power level below a particular threshold utilizing the extrapolated covariance matrices A and B.

7. The apparatus of claim 6, the coefficient estimator circuitry further configured for reducing the first and second scaling factors if no data captures of the transmit signal fall within the power level ranges or bins for a predetermined amount of time.

8. The apparatus of claim 6, the coefficient estimator circuitry further configured for computing the weights W for each data capture of the transmit signal using the generated covariance matrices A and B.

9. The apparatus of claim 8, the coefficient estimator circuitry further configured for verifying W after computing W.

10. The apparatus of claim 8, the coefficient estimator circuitry further configured for validating W by:
    computing $\Delta B = B - AW$;
    computing the normalized error $$E = \frac{|\Delta B|}{|B|};$$

rejecting W and utilizing previous W values if E is larger than a predetermined threshold.

11. A computer program product for generating covariance matrices A and B for each data capture of a transmit signal, the covariance matrices A and B for use in computing weights W and producing a pre-distorted transmit signal to cancel non-linearities created by a distorting element or distorting system when transmitting the transmit signal, and including one or more computer readable instructions embedded on a non-transitory computer readable storage medium and configured to cause one or more computer processors to perform the steps of:
    establishing power level ranges or bins for the transmit signal at about a highest power transmit signal received;
    when a predetermined number of data captures of the transmit signal are received that fall within the power level ranges or bins,
    averaging covariance matrices A and B computed for the data captures within the power level ranges or bins to generate averaged high end covariance matrices A and B, and
    scaling the averaged high end covariance matrix A by a first scaling factor and scaling the averaged high end covariance matrix B by a second scaling factor to compute extrapolated covariance matrices A and B; and
    generating covariance matrices A and B for data captures of a transmit signal having a power level below a particular threshold utilizing the extrapolated covariance matrices A and B.

12. The computer program product of claim 11, further comprising reducing the first and second scaling factors if no data captures of the transmit signal fall within the power level ranges or bins for a predetermined amount of time.

13. The computer program product of claim 11, further comprising computing the weights W for each data capture of the transmit signal using the generated covariance matrices A and B.

14. The computer program product of claim 13, further comprising verifying W after computing W.

15. The computer program product of claim 13, further comprising validating W by:
    computing $\Delta B = B - AW$;
    computing the normalized error $$E = \frac{|\Delta B|}{|B|};$$

rejecting W and utilizing previous W values if E is larger than a predetermined threshold.

* * * * *